United States Patent
Ko et al.

(10) Patent No.: US 11,984,241 B2
(45) Date of Patent: May 14, 2024

(54) FLEXIBLE CABLE, VIBRATION DEVICE INCLUDING THE SAME, AND DISPLAY APPARATUS INCLUDING THE VIBRATION DEVICE

(71) Applicant: LG Display Co., Ltd., Seoul (KR)

(72) Inventors: Sungwook Ko, Paju-si (KR); Chiwan Kim, Paju-si (KR); YongWoo Lee, Paju-si (KR); Uihyeon Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 558 days.

(21) Appl. No.: 17/217,440

(22) Filed: Mar. 30, 2021

(65) Prior Publication Data

US 2021/0304920 A1    Sep. 30, 2021

(30) Foreign Application Priority Data

Mar. 31, 2020    (KR) .......................... 10-2020-0039507

(51) Int. Cl.
*H01B 7/04* (2006.01)
*H10N 30/20* (2023.01)
(Continued)

(52) U.S. Cl.
CPC .............. *H01B 7/04* (2013.01); *H10N 30/20* (2023.02); *H10N 30/50* (2023.02); *H10N 30/871* (2023.02); *H04R 17/00* (2013.01)

(58) Field of Classification Search
None
See application file for complete search history.

(56) References Cited

U.S. PATENT DOCUMENTS

2002/0089793 A1    7/2002  Nakagawa et al.
2004/0046838 A1*   3/2004  Junhua ................. B41J 2/14233
                                                    347/68
(Continued)

FOREIGN PATENT DOCUMENTS

EP      2355545 A1      8/2011
JP      H05-011695 U    2/1993
(Continued)

OTHER PUBLICATIONS

Office Action issued by the Japanese Patent Office in corresponding JP Application No. 2021-061824, dated Mar. 11, 2022.
(Continued)

*Primary Examiner* — Krystal Robinson
(74) *Attorney, Agent, or Firm* — Morgan, Lewis & Bockius LLP

(57) ABSTRACT

A flexible cable may include a base member including a terminal portion, a conductor layer including a plurality of conductive lines disposed on the base member, and a protection layer disposed on the base member to cover at least prat of the conductor layer and to expose a portion of each of the plurality of conductive lines at the terminal portion. A length of each of the plurality of conductive lines may be longer than a length of the base member. A vibration device may include a vibration structure including a vibration layer, a first electrode layer disposed on a first surface of the vibration layer, and a second electrode layer disposed on a second surface of the vibration layer and a flexible cable electrically connected to the first electrode layer and to the second electrode layer of the vibration structure.

49 Claims, 20 Drawing Sheets

(51) Int. Cl.
*H10N 30/50* (2023.01)
*H10N 30/87* (2023.01)
*H04R 17/00* (2006.01)

(56) References Cited

U.S. PATENT DOCUMENTS

| | | | |
|---|---|---|---|
| 2007/0235207 A1* | 10/2007 | Tsuji | C22C 13/00 |
| | | | 174/68.1 |
| 2009/0159309 A1 | 6/2009 | Kanada et al. | |
| 2013/0162543 A1 | 6/2013 | Behles | |
| 2014/0332267 A1* | 11/2014 | Tanaka | H01B 13/01254 |
| | | | 72/370.26 |
| 2015/0311423 A1 | 10/2015 | Murakami | |
| 2015/0341714 A1 | 11/2015 | Ahn et al. | |
| 2016/0276759 A1 | 9/2016 | Tran et al. | |
| 2019/0155391 A1* | 5/2019 | Hashimoto | G06F 3/0412 |
| 2019/0182572 A1 | 6/2019 | Kim | |
| 2020/0059733 A1 | 2/2020 | Shin et al. | |
| 2020/0295676 A1 | 9/2020 | Ezawa et al. | |

FOREIGN PATENT DOCUMENTS

| | | |
|---|---|---|
| JP | H06-23118 Y2 | 6/1994 |
| JP | H09-307153 A | 11/1997 |
| JP | H11-74011 A | 3/1999 |
| JP | 3058502 U | 6/1999 |
| JP | 2004-139840 A | 5/2004 |
| JP | 2006-034031 A | 2/2006 |
| JP | 2008-186719 A | 8/2008 |
| JP | 2011-024357 A | 2/2011 |
| JP | 2014-220171 A | 11/2014 |
| JP | 2015-219528 A | 12/2015 |
| JP | 2016-529664 A | 9/2016 |
| JP | 2018-137239 A | 8/2018 |
| JP | 2019-062025 A | 4/2019 |
| KR | 10-1890761 B1 | 8/2018 |
| WO | 96/24943 A1 | 8/1996 |
| WO | 2007/023517 A1 | 3/2007 |

OTHER PUBLICATIONS

Extended European Search Report issued in corresponding European Patent Application No. 21166383.6, dated Aug. 31, 2021.
Japanese Office Action dated Nov. 18, 2021, issued in corresponding Japanese Patent Application No. 2021-061824.
Office Action dated Jan. 18, 2024 for Japanese Divisional Patent Application No. 2022-130591 (Note: JP 3058502 U, JP 2006-34031 A & JP 2011-024357 A were cited in prior IDS filings.).

* cited by examiner

FLEXIBLE CABLE, VIBRATION DEVICE INCLUDING THE SAME, AND DISPLAY APPARATUS INCLUDING THE VIBRATION DEVICE

CROSS-REFERENCE TO RELATED APPLICATIONS

This application claims the benefit of and priority to Korean Patent Application No. 10-2020-0039507 filed on Mar. 31, 2020, the entirety of each which is hereby incorporated by reference.

TECHNICAL FIELD

The present disclosure relates to a flexible cable, a vibration device including the same, and a display apparatus including the vibration device.

DISCUSSION OF THE RELATED ART

Recently, the need for slimming and thinning electronic devices is increasing. Also, as speakers applied to electronic devices and the like need to be slim and thin, instead of voice coils, piezoelectric elements capable of realizing a thin thickness are attracting much attention.

Speakers or vibration devices with a piezoelectric element applied thereto may be driven or vibrated by a driving power or a driving signal supplied through a signal cable.

General vibration devices (or film actuators) include a film which includes a pad electrode and a line for applying a driving power to a piezoelectric element. The general vibration devices need a process of patterning the line and the pad electrode on the film and a soldering process of electrically connecting the pad electrode to a signal cable.

SUMMARY

The inventors have performed various experiments for implementing a vibration device enabling the simplification of a structure of the vibration device and a process of manufacturing the vibration device. For example, the inventors have recognized that it is required to remove a film including a line and a pad electrode and to omit a soldering process, in order to simplify the structure of the vibration device and the process of manufacturing the vibration device. Therefore, the inventors have invented a flexible cable having a new structure, a vibration device including the same, and a display apparatus including the vibration device, which enable the simplification of the structure of the vibration device and the process of manufacturing the vibration device.

Accordingly, embodiments of the present disclosure are directed to a flexible cable, a vibration device including the same, and a display apparatus including the vibration device that substantially obviate one or more problems due to limitations and disadvantages of the related art.

An aspect of the present disclosure is to provide a flexible cable, a vibration device including the same, and a display apparatus including the vibration device, which enable the simplification of a structure of the vibration device and a process of manufacturing the vibration device.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other aspects of the inventive concepts, as embodied and broadly described, a flexible cable may comprise a base member including a terminal portion; a conductor layer including a plurality of conductive lines disposed on the base member; and a protection layer disposed on the base member to cover at least part of the conductor layer and configured to expose a portion of each of the plurality of conductive lines at the terminal portion, a length of each of the plurality of conductive lines may be longer than a length of the base member.

In another aspect, a vibration device may comprise a vibration structure including a vibration layer, a first electrode layer disposed on a first surface of the vibration layer, and a second electrode layer disposed on a second surface opposite to the first surface of the vibration layer; and a flexible cable electrically connected to the first electrode layer and to the second electrode layer of the vibration structure.

In another aspect, a vibration device may comprise a vibration structure including a vibration layer, a first electrode layer disposed on a first surface of the vibration layer, and a second electrode layer disposed on a second surface opposite to the first surface of the vibration layer; a first protection member on a first surface of the vibration structure; a second protection member on a second surface of the vibration structure; and a flexible cable including at least one first finger line disposed between the first electrode layer of the vibration structure and the first protection member, and at least one second finger line disposed between the second electrode layer of the vibration structure and the second protection member.

In another aspect, a display apparatus may comprise a display panel configured to display an image; and a vibration apparatus on a rear surface of the display panel to vibrate the display panel, the vibration apparatus may comprise a vibration structure including a vibration layer, a first electrode layer disposed on a first surface of the vibration layer, and a second electrode layer disposed on a second surface opposite to the first surface of the vibration layer; and a flexible cable electrically connected to the first electrode layer and to the second electrode layer of the vibration structure.

In another aspect, a display apparatus may comprise a display panel configured to display an image; and a vibration apparatus on a rear surface of the display panel to vibrate the display panel, the vibration apparatus may comprise a vibration structure including a vibration layer, a first electrode layer disposed on a first surface of the vibration layer, and a second electrode layer disposed on a second surface opposite to the first surface of the vibration layer; a first protection member on a first surface of the vibration structure; a second protection member on a second surface of the vibration structure; and a flexible cable including at least one first finger line disposed between the first electrode layer of the vibration structure and the first protection member, and at least one second finger line disposed between the second electrode layer of the vibration structure and the second protection member.

According to the present disclosure, a flexible cable, a vibration device including the same, and a display apparatus including the vibration device may be provided for increasing the degree of design freedom for a terminal position of a driver.

According to the present disclosure, a vibration device with a cable integrated thereinto and a display apparatus including the vibration device may be provided.

According to the present disclosure, a display apparatus which outputs a sound, generated based on a vibration of a display panel based on a vibration of a vibration device, in a forward direction of the display panel may be provided.

According to the present disclosure, a display apparatus which outputs a stereo sound in a forward direction of a display panel based on a region-based vibration of a display panel based on a vibration of each of a plurality of vibration devices may be provided.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory, and are intended to provide further explanation of the disclosures as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure.

Figure 1:
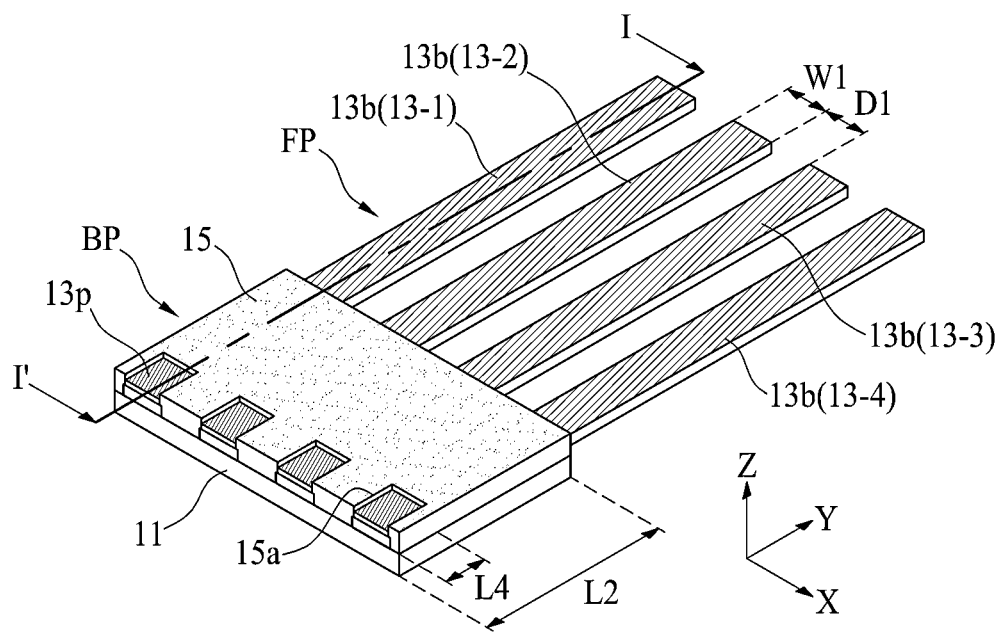
FIG. 1 illustrates a flexible cable according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," "A," "B," "(a)," "(b)," etc. may be used. These terms are intended to identify the corresponding elements from the other elements, and basis, order, or number of the corresponding elements should not be limited by these terms. The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a flexible cable, a vibration device including the same, and a display apparatus including the vibration device according to an embodiment of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
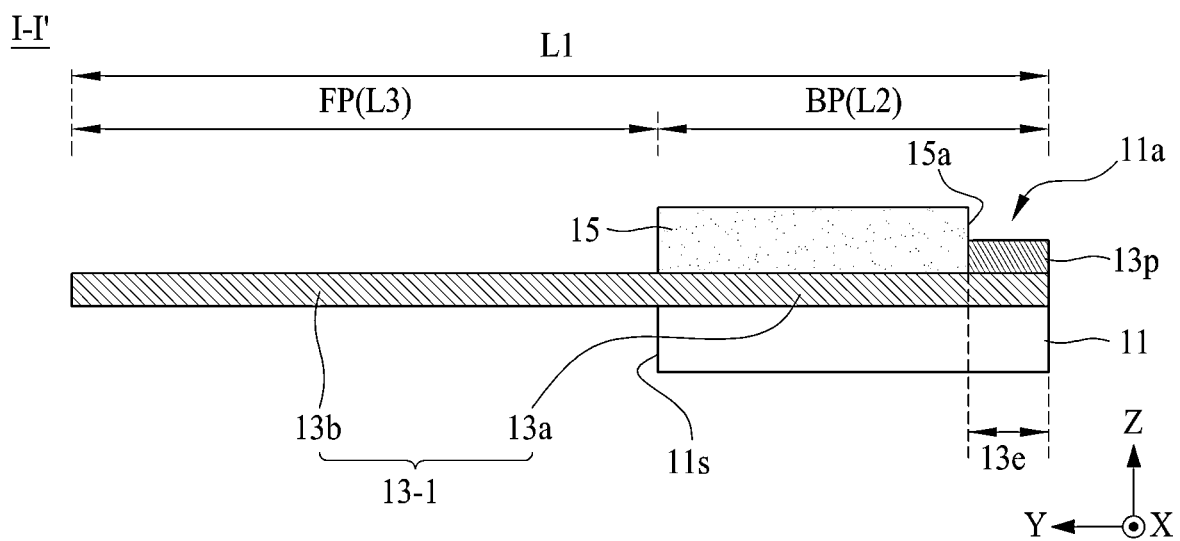
FIG. 2 is a cross-sectional view taken along line I-I' illustrated in FIG. 1.

FIG. 1 illustrates a flexible cable 10 according to an embodiment of the present disclosure, and FIG. 2 is a cross-sectional view taken along line I-I' illustrated in FIG. 1.

With reference to FIGS. 1 and 2, the flexible cable according to an embodiment of the present disclosure may be, for example, a flexible flat cable, but embodiments are not limited thereto.

The flexible cable according to an embodiment of the present disclosure may include a base member 11, a conductor layer 13, and a protection layer 15.

The base member 11 may include a transparent and/or opaque plastic material. For example, the base member 11 may be implemented with one or more of synthetic resins including at least one of a fluorine resin, a polyimide resin, a polyurethane resin, a polyester resin, a polyethylene resin, and a polypropylene resin, but embodiments are not limited thereto. The base member 11 may be a base film or a base insulation film.

The base member 11 according to an embodiment of the present disclosure may include a terminal portion 11a. The terminal portion 11a may include a plurality of terminals disposed at a periphery portion of one portion of the base member 11. The plurality of terminals may be arranged at a certain interval or distance. For example, the terminal portion 11a may be an input and/or output terminal portion.

The conductor layer 13 may be disposed on the base member 11. For example, the conductor layer 13 may include a conductive material including copper (Cu), aluminum (Al), silver (Ag), or alloy materials of Cu and Ag, but embodiments are not limited thereto. The conductor layer 13 may be directly disposed on the base member 11.

The conductor layer 13 according to an embodiment of the present disclosure may include a plurality of conductive lines 13-1 to 13-4. Each of the plurality of conductive lines 13-1 to 13-4 may be patterned from a conductive material layer disposed on the base member 11.

The plurality of conductive lines 13-1 to 13-4 according to an embodiment of the present disclosure may be disposed on one surface (or an upper surface) of the base member 11 so as to be spaced apart from one another in a first direction X and parallel to a second direction Y intersecting with the first direction X. Each of the plurality of conductive lines 13-1 to 13-4 may extend long in the second direction Y to have a first width W1 parallel to the first direction X and may be parallel to one another to have a first interval D1 in the first direction X. The first interval (or first distance) D1 may be adjusted within a minimum range for preventing electrical short circuit between the plurality of conductive lines 13-1 to 13-4. For example, the first interval D1 may be the same as or different from the first width W1. For example, the first interval D1 may be adjusted to 1 mm or more, but embodiments are not limited thereto. Thus, the plurality of conductor lines are electrically insulated from each other.

With respect to the second direction Y, a length L1 of each of the plurality of conductive lines 13-1 to 13-4 may be longer than a length L2 of the base member 11. For example, each of the plurality of conductive lines 13-1 to 13-4 may pass by a side surface 11s of the base member 11 and may protrude or extend to the outside, and thus, may have the length L1 which is longer than the length L2 of the base member 11. For example, a protrusion length (or an extension length) L3 of each of the plurality of conductive lines 13-1 to 13-4 may be twice or more a length L4 of the terminal portion 11a disposed in the base member 11, but embodiments are not limited thereto.

Each of the plurality of conductive lines 13-1 to 13-4 according to an embodiment of the present disclosure may include a first line 13a, which might also called first line portion 13a, disposed on the base member 11 and a second line 13b which might also called second line portion 13, which extends or protrudes from a side surface of the base member 11 to the outside.

The second line 13b of each of the plurality of conductive lines 13-1 to 13-4 may not be fixed (or supported) to the base member 11, and thus, may have flexibility which is higher than that of the first line 13a fixed to the base member 11. For example, the second line 13b of each of the plurality of conductive lines 13-1 to 13-4 may be supported by the base member 11 in a process of manufacturing the flexible cable. Also, as some portion of the base member 11 supporting the second line 13b of each of the plurality of conductive lines 13-1 to 13-4 is removed by a process of removing a film, the second line 13b may not be fixed to the base member 11 and may protrude or extend from the base member 11. Therefore, the second line 13b of each of the plurality of conductive lines 13-1 to 13-4 may have flexibility. The second line 13b of each of the plurality of conductive lines 13-1 to 13-4 may be an extension line, a protrusion line, or a finger line, but embodiments are not limited thereto. The first line 13a may be a fixed line, but embodiments are not limited thereto.

The second line 13b of each of the plurality of conductive lines 13-1 to 13-4 may be an output terminal portion. For example, the second line 13b of each of the plurality of conductive lines 13-1 to 13-4 may be electrically connected to an external driver (or a driving device) and may transfer a driving power (or a driving signal), supplied through the terminal portion 11a of the base member 11, to the driver. For example, the second line 13b of each of the plurality of conductive lines 13-1 to 13-4 may be electrically connected to a shape deformation member where a shape thereof is deformed based on the driving power.

The protection layer 15 may be disposed on the base member 11 and may cover the conductor layer 13. For example, the protection layer 15 may be directly disposed on the conductor layer 13 or plurality of conductive lines 13-1 to 13-4 disposed on the base member 11 and the protection layer 15 may be directly disposed on the base member 11 between the conductive lines 13-1 to 13-4 to thereby enclose the conductive lines 13-1 to 13-4. The protection layer 15 may expose one portion (or one side portion) of each of the plurality of conductive lines 13-1 to 13-4 at the terminal portion 11a. The protection layer 15 may be disposed at a portion of the base member 11 other than the terminal portion 11a, and thus, may surround a portion other than one portion 13e of each of the plurality of conductive lines 13-1 to 13-4 disposed on the base member 11. For example, the protection layer 15 may surround the first line 13a of each of the plurality of conductive lines 13-1 to 13-4 disposed on the base member 11.

The protection layer 15 according to an embodiment of the present disclosure may include a plurality of opening portions 15a respectively overlapping a plurality of terminals disposed in the terminal portion 11a of the base member 11. Therefore, the one portion 13e of each of the plurality of conductive lines 13-1 to 13-4 may be exposed at the outside through each of the plurality of opening portions 15a formed in the protection layer 15, and thus, may be implemented as a terminal of the flexible cable.

The protection layer 15 according to an embodiment of the present disclosure may include a transparent or opaque plastic material. For example, the protection layer 15 may be implemented with one or more materials among synthetic resins including a fluorine resin, a polyimide resin, a polyurethane resin, a polyester resin, a polyethylene resin, and a polypropylene resin, but embodiments are not limited thereto. The protection layer 11 may be a coverlay, a coverlay film, a cover film, or a cover insulation film, but the terms are not limited thereto.

For example, the protection layer 15 may be implemented on the base member 11 by any suitable process known in the art. As one example, the protection layer 15 according to an embodiment of the present disclosure may be implemented on the base member 11 by a coating process.

As another example, the protection layer 15 according to an embodiment of the present disclosure may be coupled or laminated to the base member 11 by a laminating process by an adhesive. Therefore, the first line 13a of each of the plurality of conductive lines 13-1 to 13-4 may be disposed between the protection layer 15 and the base member 11, and thus, may be surrounded or enclosed by the protection layer 15 and the base member 11. For example, the adhesive may include a polymer resin, but embodiments are not limited thereto.

The flexible cable according to an embodiment of the present disclosure may further include a pad part 13p disposed in the terminal portion 11a of the base member 11.

The pad part 13p may include a plurality of electrode pads respectively disposed at the plurality of terminals of the terminal portion 11a. Each of the plurality of electrode pads may include at least one of gold (Au) and silver (Ag). For example, each of the plurality of electrode pads may be a plating layer.

The flexible cable according to an embodiment of the present disclosure may be supplied with or receive a driving power through the terminal portion 11a corresponding to the one portion of the first line 13a of each of the plurality of conductive lines 13-1 to 13-4 and may output the driving power through the second line 13b of each of the plurality of conductive lines 13-1 to 13-4.

In the flexible cable according to an embodiment of the present disclosure, the plurality of conductive lines 13-1 to 13-4 may be grouped into a plurality of electrode groups.

According to an embodiment of the present disclosure, the plurality of conductive lines 13-1 to 13-4 may be grouped into a first electrode group and a second electrode group. For example, the first electrode group may include some among the plurality of conductive lines 13-1 to 13-4, and the second electrode group may include the other conductive lines except some conductive lines included in the first electrode group among the plurality of conductive lines 13-1 to 13-4. For example, when the flexible cable includes first to fourth conductive lines 13-1 to 13-4, the first electrode group may include the first and second conductive lines 13-1 and 13-2, and the second electrode group may include the third and fourth conductive lines 13-3 and 13-4.

The conductive lines included in the first electrode group among the plurality of conductive lines 13-1 to 13-4 may receive a first driving power through the one portion of the first line 13a and may output the first driving power through the second line 13b. The conductive lines included in the second electrode group among the plurality of conductive lines 13-1 to 13-4 may receive a second driving power (or a second driving signal), which differs from the first driving power, through the one portion of the first line 13a and may output the second driving power through the second line 13b. For example, the first driving power may be one of a positive (+) power and a negative (−) power, and the second driving power may be the other power of the positive (+) power and the negative (−) power.

In the flexible cable according to an embodiment of the present disclosure, the base member 11, the first line 13a of each of the plurality of conductive lines 13-1 to 13-4, and the protection layer 15 may implement a body portion BP, and the second line 13b of each of the plurality of conductive lines 13-1 to 13-4 may implement a finger portion FP protruding from the body portion BP.

The body portion BP may include the base member 11, the first line 13a of each of the plurality of conductive lines 13-1 to 13-4, and the protection layer 15.

The finger portion FP may include the second line 13b of each of the plurality of conductive lines 13-1 to 13-4 protruding from the body portion BP. A length L3 of the finger portion FP may be longer than a length L4 of the terminal portion 11a disposed in the base member 11 and/or a length L2 of the base member 11. The second line 13b of each of the plurality of conductive lines 13-1 to 13-4 may be a finger line. Accordingly, the flexible cable according to an embodiment of the present disclosure may include the body portion BP including the terminal portion 11a and a plurality of finger lines 13b protruding from the body portion BP.

The finger portion FP according to an embodiment of the present disclosure may include a plurality of finger line groups including at least one second line 13b among the second lines 13b of each of the plurality of conductive lines 13-1 to 13-4. According to an embodiment of the present disclosure, the finger portion FP may include a first finger line group and a second finger line group. The first finger line group may include some of the second lines 13b among the plurality of conductive lines 13-1 to 13-4, and the second finger line group may include the other second lines 13b except the second lines 13b of the first finger line group included in the second lines 13b among the plurality of conductive lines 13-1 to 13-4.

Figure 3:
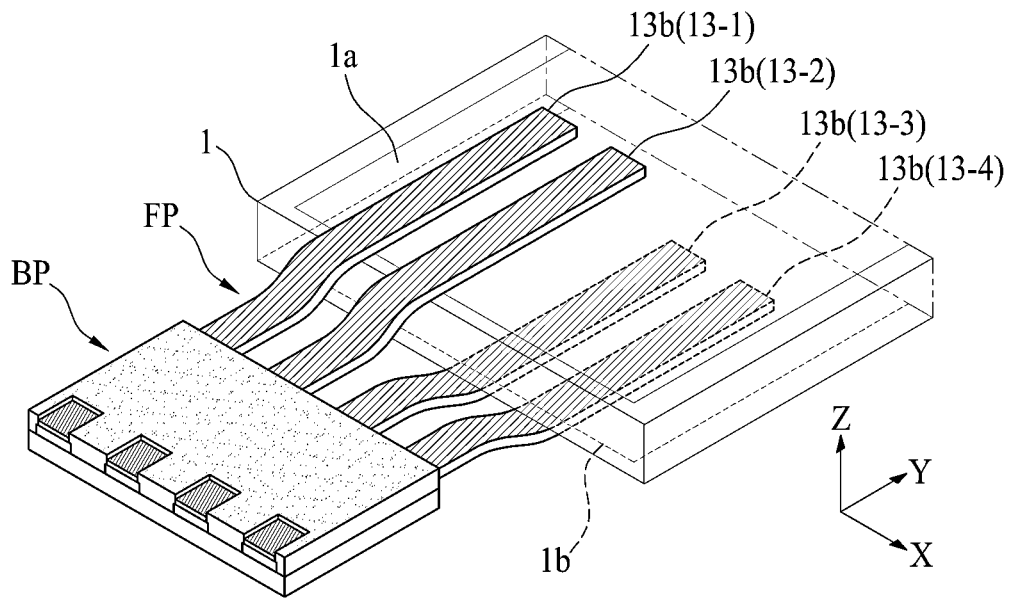
FIG. 3 illustrates an electrical connection structure between a driver and the flexible cable illustrated in FIG. 1.

FIG. 3 illustrates an electrical connection structure between the driver and the flexible cable illustrated in FIG. 1.

With reference to FIGS. 1 to 3, the flexible cable according to an embodiment of the present disclosure may be electrically connected to a driver 1 or actuator 1 through the second line 13b of each of the plurality of conductive lines 13-1 to 13-4. Some of the second lines 13b (or the first electrode group) among the plurality of conductive lines 13-1 to 13-4 and the other second lines 13b (or the second electrode group) may be electrically connected to the driver 1 to have a shape which is alternately disposed. For example, the driver 1 may be a vibration module, a vibration unit, a vibration device, or a flexible vibration device.

The driver 1 according to an embodiment of the present disclosure may include an upper electrode side or layer (or a first electrode layer) 1a disposed on an upper surface thereof and a lower electrode side or layer (or a second electrode layer) 1b disposed on a lower surface thereof. For example, the upper electrode layer 1a may be configured to be disposed on the upper surface of the driver 1. The lower electrode layer 1b may be configured to be disposed on the lower surface opposite to the first surface of the driver 1.

According to an embodiment of the present disclosure, in the flexible cable, some of the second lines 13b among the plurality of conductive lines 13-1 to 13-4 may be bent toward the upper surface of the driver 1 and may be electrically connected to the upper electrode layer 1a of the driver 1. The other second lines 13b of the second lines 13b among the plurality of conductive lines 13-1 to 13-4 may be bent toward the lower surface of the driver 1 and may be electrically connected to the lower electrode layer 1b of the driver 1. For example, the second lines 13b (or a plurality of first finger lines) of each of the first and second conductive lines 13-1 and 13-2 among the plurality of conductive lines 13-1 to 13-4 may be electrically connected to the upper electrode layer 1a of the driver 1, and the second lines 13b (or a plurality of second finger lines) of each of the third and fourth conductive lines 13-3 and 13-4 among the plurality of conductive lines 13-1 to 13-4 may be electrically connected to the lower electrode layer 1b of the driver 1. Therefore, the flexible cable includes a plurality of first finger lines and a plurality of second finger lines which may be electrically connected to the driver 1 to have a shape which is alternately disposed. Thus, a subgroup of finger lines is bent downwardly to be attached to the lower side of the driver, whereas another subgroup of finger lines is bent upwardly to be attached to the upper side of the driver.

Therefore, the flexible cable according to an embodiment of the present disclosure may include the second line 13b (or a finger line) of each of the plurality of conductive lines 13-1 to 13-4 protruding from the base member 11 (or the body portion BP), and thus, may be electrically connected to the driver 1 through the second line 13b having flexibility. Accordingly, the flexible cable according to an embodiment of the present disclosure may be used as a common cable which is electrically connectable to various drivers having different terminal structures, and the degree of freedom in design of a terminal (or electrode pad) position of each driver may be increased.

Figure 4:
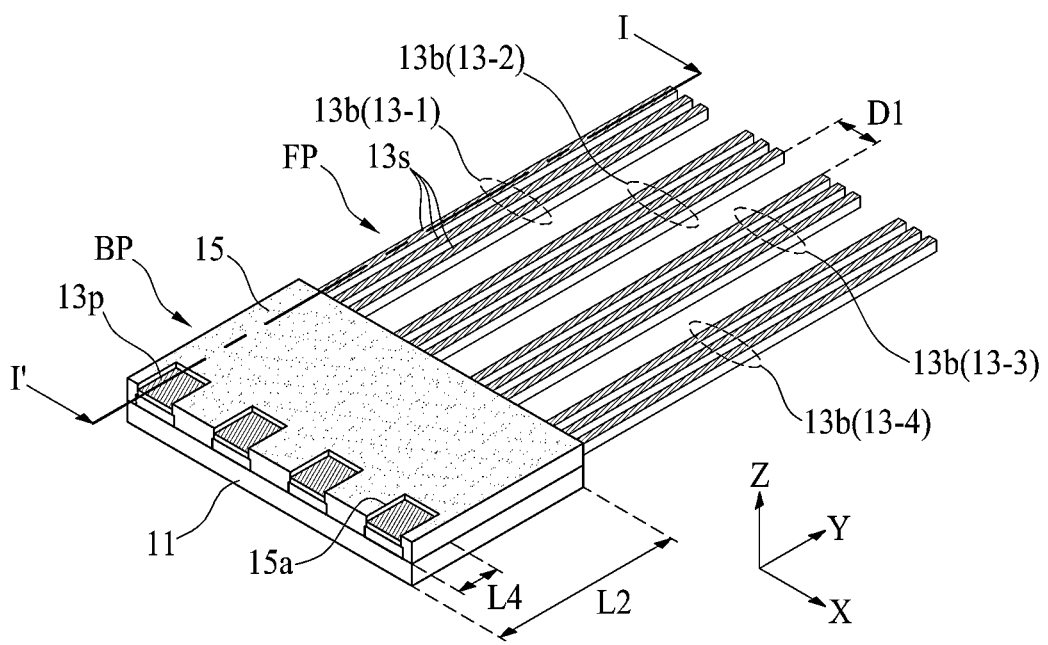
FIG. 4 illustrates a flexible cable according to another embodiment of the present disclosure.

FIG. 4 illustrates a flexible cable according to another embodiment of the present disclosure and illustrates an embodiment where a structure of the conductive line illustrated in FIGS. 1 and 2 is modified. Hereinafter, therefore, repetitive descriptions of elements other than a conductive line are omitted or will be briefly given. A cross-sectional surface taken along line I-I' illustrated in FIG. 4 is illustrated in FIG. 2.

With reference to FIG. 4 in conjunction with FIG. 2, in the flexible cable according to another embodiment of the present disclosure, each of a plurality of conductive lines 13-1 to 13-4 may include a plurality of straps 13s. For example, each of the plurality of conductive lines 13-1 to 13-4 may include two or more straps 13s, but embodiments are not limited thereto. For example, the number of straps 13s may be adjusted within a range for minimizing or preventing a defect caused by the disconnection of a conductive line. For example, each of the plurality of straps 13s may be a fine electrode line.

Each of the plurality of conductive lines 13-1 to 13-4 according to an embodiment of the present disclosure may be divided into a plurality of straps 13s. The plurality of straps 13s may be disposed on one surface (or an upper surface) of a base member 11 so as to be parallel to a second direction Y and spaced apart from one another in a first direction X and may extend to the outside of a side surface of the base member 11. For example, each of the plurality of straps 13s may be disposed across the body portion BP and the finger portion FP of the flexible cable.

According another embodiment of the present disclosure, a second line 13b of each of the plurality of conductive lines 13-1 to 13-4 may be divided into the plurality of straps 13s. In each of the plurality of conductive lines 13-1 to 13-4, the plurality of straps 13s may extend (or protrude) from a first line 13a so as to be parallel to the second direction Y and spaced apart from one another in the first direction X, and thus, may be a finger line connected to the first line 13a in common.

An interval or distance between the plurality of straps 13s may be adjusted within a minimum range for preventing electrical short circuit between the straps 13s. For example, an interval between the plurality of straps 13s may be adjusted to 1 mm or more, but embodiments are not limited thereto.

Therefore, the flexible cable according to another embodiment of the present disclosure may include the plurality of conductive lines 13-1 to 13-4 having the plurality of straps 13s, and thus, a defect caused by the disconnection of a conductive line occurring in a process of manufacturing the flexible cable may be minimized or prevented.

Figure 5:
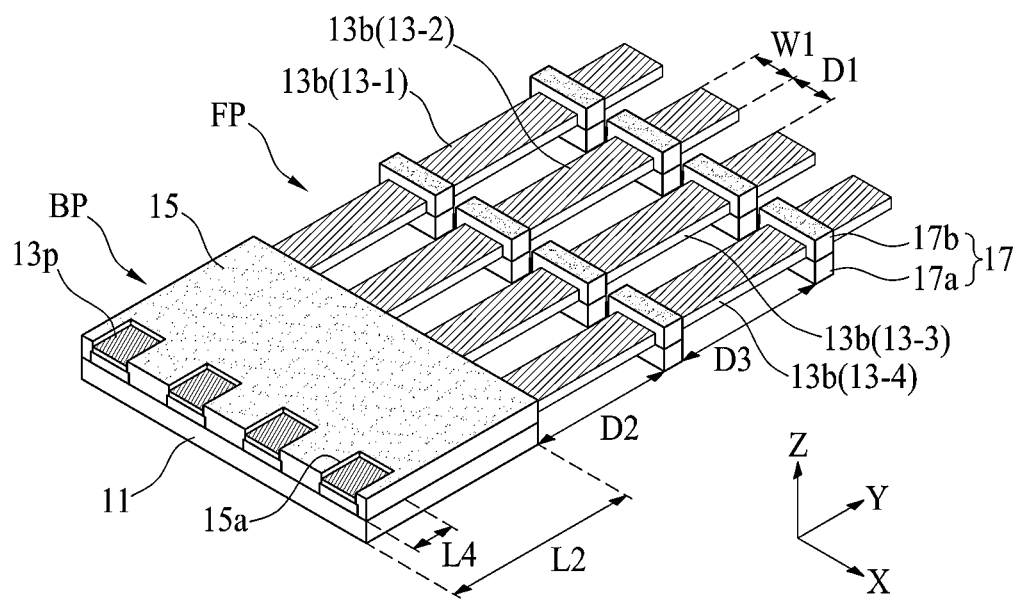
FIG. 5 illustrates a flexible cable according to another embodiment of the present disclosure.

FIG. 5 illustrates a flexible cable according to another embodiment of the present disclosure and illustrates an embodiment where a supporter is additionally provided in the flexible cable illustrated in FIG. 1. Hereinafter, therefore, repetitive descriptions of elements other than a supporter are omitted or will be briefly given.

With reference to FIG. 5, the flexible cable according to another embodiment of the present disclosure may further include a supporter 17 which is disposed on a second line 13b of each of a plurality of conductive lines 13-1 to 13-4. In describing an embodiment of the present disclosure, the second line 13b of each of the plurality of conductive lines 13-1 to 13-4 may be referred to as "a plurality of finger lines 13b".

The supporter 17 may support the plurality of finger lines 13b, and thus, may maintain a separation distance D1 between the finger lines 13b to prevent electrical short circuit between the second lines 13b.

The supporter 17 according to an embodiment of the present disclosure may support some portion of each of the plurality of finger lines 13b. For example, the supporter 17 may cover or surround a center portion of each of the plurality of finger lines 13b.

According to another embodiment of the present disclosure, the supporter 17 may be provided in plurality, and the plurality of supporters 17 may be arranged at certain intervals or distances D2 and D3 in a second direction Y and may support a center portion of a second line 13b of each of the plurality of finger lines 13b. For example, when the flexible cable according to another embodiment of the present disclosure includes the plurality of supporters 17, a second interval or a second distance D2 between the base member 11 and a first supporter 17 may be the same as or different from a third interval or a third distance D3 between the plurality of supporters 17. For example, the second interval D2 and the third interval D3 may be adjusted to be equal to or different from each other within a range where an electrical connection defect between the finger line 13b and a driver does not occur and within a total length of the finger line 13b.

The supporter 17 according to an embodiment of the present disclosure may include a first supporter 17a and a second supporter 17b.

The first supporter 17a may support the finger line 13b. The first supporter 17a may be a lower supporter which supports a lower portion of the finger line 13b. The first supporter 17a according to an embodiment of the present disclosure may include the same material as that of the base member 11, but embodiments are not limited thereto. For example, the first supporter 17a may be a portion of the base member 11 which is not removed in a process of manufacturing the flexible cable and supports the finger line 13b, but embodiments are not limited thereto.

The second supporter 17b may cover the finger line 13b. The second supporter 17b may be an upper supporter which surrounds an upper portion and a side portion of the finger line 13b. The second supporter 17b according to an embodiment of the present disclosure may include the same material as that of a protection layer 15, but embodiments are not limited thereto. For example, the second supporter 17b may be disposed on the finger line 13b along with the protection layer 15 or may be a portion of the protection layer 15 which is not removed in a process of manufacturing the flexible cable and covers the finger line 13b, but embodiments are not limited thereto.

Therefore, the flexible cable according to another embodiment of the present disclosure may further include the supporter 17 which is disposed on the second line 13b of each of the plurality of conductive lines 13-1 to 13-4, and thus, a separation distance D1 between the second lines 13b may be maintained, thereby preventing electrical short circuit between the second lines 13b.

Figure 6:
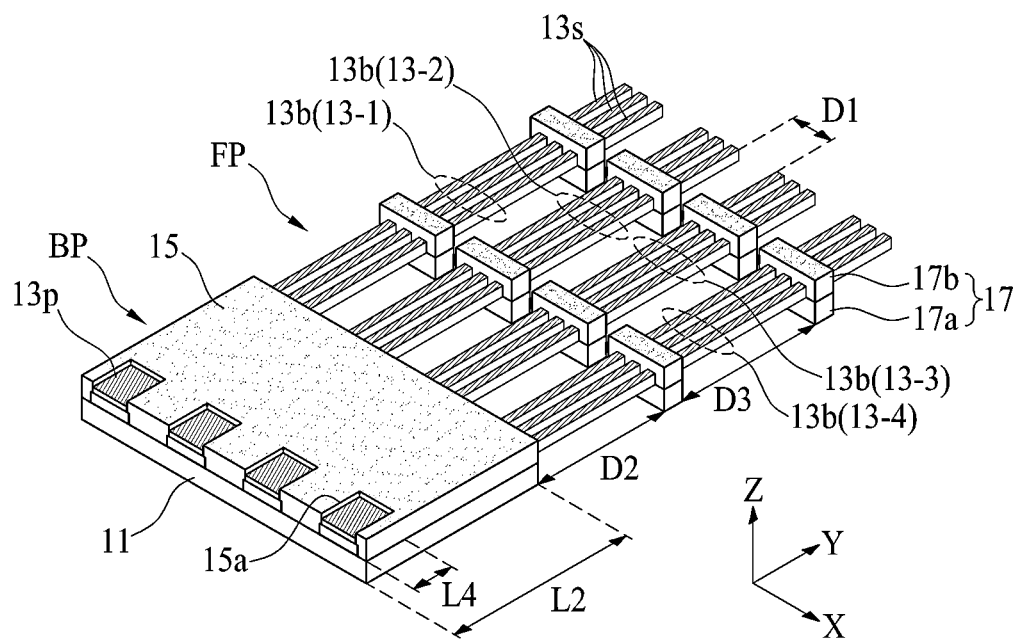
FIG. 6 illustrates a flexible cable according to another embodiment of the present disclosure.

FIG. 6 illustrates a flexible cable according to another embodiment of the present disclosure and illustrates an embodiment where the supporter illustrated in FIG. 5 is applied to the flexible cable illustrated in FIG. 4. Hereinafter, therefore, repetitive descriptions of elements other than a supporter and elements relevant thereto are omitted or will be briefly given.

With reference to FIG. 6, in the flexible cable according to another embodiment of the present disclosure, a second line 13b of each of a plurality of conductive lines 13-1 to 13-4 may include a plurality of straps 13s which are spaced apart from one another. The plurality of straps 13s may be substantially the same as the plurality of straps 13s described above with reference to FIG. 4, and thus, like reference numerals refer to like elements and their repetitive descriptions are omitted.

The supporter 17 may surround the plurality of straps 13s of the plurality of conductive lines 13-1 to 13-4 in common. The supporter 17 may surround a portion of each of the plurality of straps 13s in common. The supporter 17 may include first and second supporters 17a and 17b which surround a portion of each of the plurality of straps 13s in common. Except for that the first and second supporters 17a and 17b surround the straps 13s in common, the first and second supporters 17a and 17b may be substantially the same as the first and second supporters 17a and 17b described above with reference to FIG. 5, and thus, like reference numerals refer to like elements and their repetitive descriptions are omitted.

Therefore, the flexible cable according to another embodiment of the present disclosure may have an effect of the flexible cable illustrated in FIG. 4 and an effect of the flexible cable illustrated in FIG. 5. For example, the flexible cable according to another embodiment of the present disclosure may include the plurality of conductive lines 13-1 to 13-4 including the plurality of straps 13s, thereby minimizing or preventing a defect caused by the disconnection of a conductive line occurring in a process of manufacturing the flexible cable. For example, the flexible cable according to another embodiment of the present disclosure may further include the supporter 17 which is disposed on the second line 13b of each of the plurality of conductive lines 13-1 to 13-4, and thus, a separation distance D1 between the second lines 13b may be maintained, thereby preventing electrical short circuit between the second lines 13b.

Figure 7:
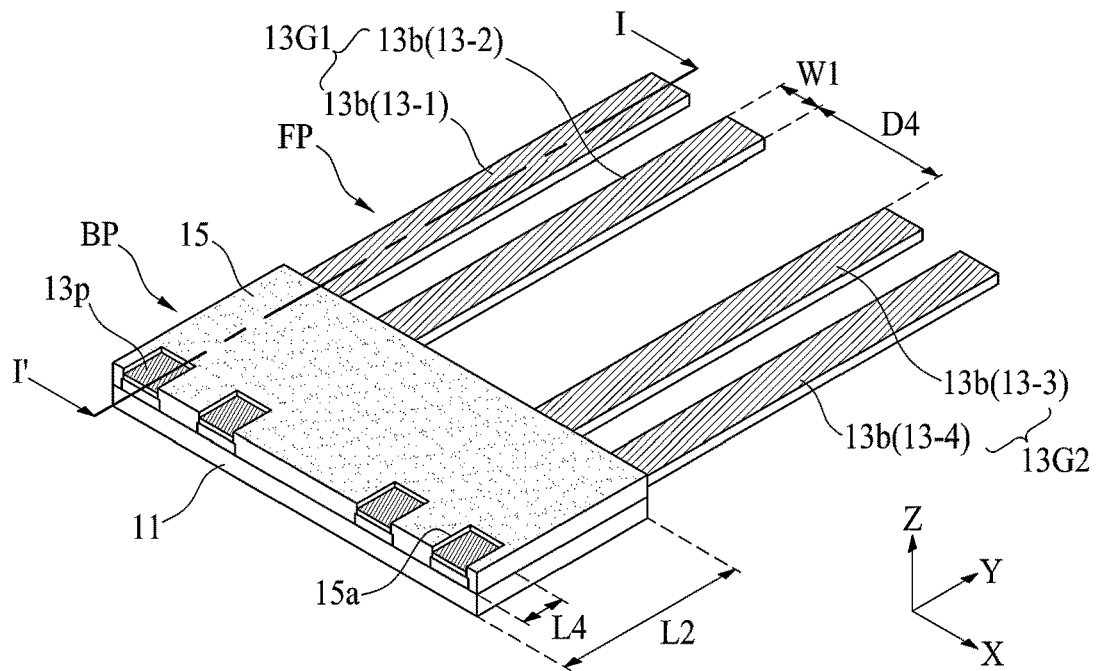
FIG. 7 illustrates a flexible cable according to another embodiment of the present disclosure.

FIG. 7 illustrates a flexible cable according to another embodiment of the present disclosure and illustrates an embodiment where a structure of the conductive line illustrated in FIG. 1 is modified. Hereinafter, therefore, repetitive descriptions of elements other than a conductive line are omitted or will be briefly given. A cross-sectional surface taken along line I-I' illustrated in FIG. 7 is illustrated in FIG. 2.

With reference to FIG. 7 in conjunction with FIG. 2, the flexible cable according to another embodiment of the present disclosure may include a plurality of conductive lines 13-1 to 13-4.

The plurality of conductive lines 13-1 to 13-4 may be grouped into first and second electrode groups 13G1 and 13G2.

For example, the first electrode group 13G1 may include a first conductive line 13-1 and a second conductive line 13-2. The second electrode group 13G2 may include a third conductive line 13-3 and a fourth conductive line 13-4.

The first electrode group 13G1 and the second electrode group 13G2 may be spaced apart from each other by a fourth interval D4 in a first direction X. For example, a second line 13b of the second conductive line 13-2 of the first electrode group 13G1 and a second line 13b of the third conductive line 13-3 of the second electrode group 13G2 may be spaced apart from each other by the fourth interval D4 in the first direction X, the fourth interval D4 may be larger than the distance between adjacent conductive lines included in one electrode group, such as the first or second electrode group 13G1 or 13G2.

According to an embodiment of the present disclosure, each of the first conductive line 13-1 of the first electrode group 13G1 and the third conductive line 13-3 of the second electrode group 13G2 may receive a first driving power through one portion of the first line 13a thereof and may output a first driving power through the second line 13b thereof. Each of the second conductive line 13-2 of the first electrode group 13G1 and the fourth conductive line 13-4 of the second electrode group 13G2 may receive a second driving power through one portion of the first line 13a thereof and may output a second driving power through the second line 13b thereof.

According to another embodiment of the present disclosure, each of the first conductive line 13-1 of the first electrode group 13G1 and the fourth conductive line 13-4 of the second electrode group 13G2 may receive the first driving power through one portion of the first line 13a thereof and may output the first driving power through the second line 13b thereof. Each of the second conductive line 13-2 of the first electrode group 13G1 and the third conductive line 13-3 of the second electrode group 13G2 may receive the second driving power through one portion of the first line 13a thereof and may output the second driving power through the second line 13b thereof.

Therefore, the flexible cable according to another embodiment of the present disclosure may simultaneously supply a driving power to each of first and second drivers divided in a driver through the first and second electrode groups 13G1 and 13G2.

Figure 8:
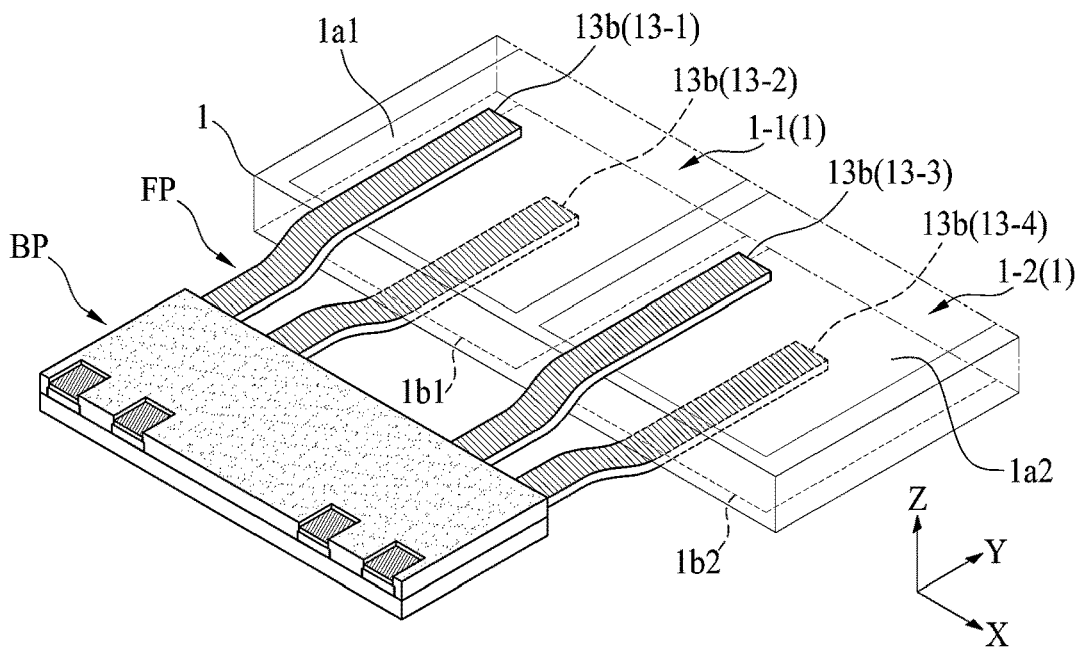
FIG. 8 illustrates an electrical connection structure between a driver and the flexible cable illustrated in FIG. 7.

FIG. 8 illustrates an electrical connection structure between the driver and the flexible cable illustrated in FIG. 7.

With reference to FIGS. 7 and 8, the flexible cable according to another embodiment of the present disclosure may be electrically connected to each of first and second drivers divided in a driver 1 through a second line 13b of each of a plurality of conductive lines 13-1 to 13-4 included in each of the first and second electrode groups 13G1 and 13G2.

A second line 13b (or a first finger line) of a first conductive line 13-1 and a second line 13b (or a second finger line) of a second conductive line 13-2, which are included in the first electrode group 13G1, may be electrically connected to the first driver of the driver 1 to have a shape which is alternately disposed. A second line 13b (or a third finger line) of a third conductive line 13-3 and a second line 13b (or a fourth finger line) of a fourth conductive line 13-4, which are included in the second electrode group 13G2, may be electrically connected to the second driver of the driver 1 to have a shape which is alternately disposed.

The driver 1 according to an embodiment of the present disclosure may include first and second drivers 1-1 and 1-2 which are electrically disconnected or isolated from each other. The first driver 1-1 may include a first upper electrode layer 1a1 disposed on an upper surface thereof and a first lower electrode layer 1b1 disposed on a lower surface thereof. The second driver 1-2 may include a second upper electrode layer 1a2 disposed on an upper surface thereof and a second lower electrode layer 1b2 disposed on a lower surface thereof.

According to an embodiment of the present disclosure, in the first electrode group 13G1, the second line 13b of the first conductive line 13-1 may be bent toward an upper surface of the first driver 1-1 and may be electrically connected to the first upper electrode layer 1a1 of the first driver 1-1. In the first electrode group 13G1, the second line 13b of the second conductive line 13-2 may be bent toward a lower surface of the first driver 1-1 and may be electrically connected to the first lower electrode layer 1b1 of the first driver 1-1.

In the second electrode group 13G2, the second line 13b of the third conductive line 13-3 may be bent toward an upper surface of the second driver 1-2 and may be electrically connected to the second upper electrode layer 1a2 of the second driver 1-2. In the second electrode group 13G2, the second line 13b of the fourth conductive line 13-4 may be bent toward a lower surface of the second driver 1-2 and may be electrically connected to the second lower electrode layer 1b2 of the second driver 1-2.

According to another embodiment of the present disclosure, in the second electrode group 13G2, the second line 13b of the third conductive line 13-3 may be bent toward the lower surface of the second driver 1-2 and may be electrically connected to the second lower electrode layer 1b2 of the second driver 1-2. In the second electrode group 13G2, the second line 13b of the fourth conductive line 13-4 may be bent toward the upper surface of the second driver 1-2 and may be electrically connected to the second upper electrode layer 1a2 of the second driver 1-2.

Therefore, the flexible cable according to another embodiment of the present disclosure may have the substantially same effect as that of the flexible cable illustrated in FIG. 1. The flexible cable according to an embodiment of the present disclosure may include the second line 13b (or the finger line) of each of the plurality of conductive lines 13-1 to 13-4 protruding from the base member 11 (or the body portion BP), and thus, may be electrically connected to the driver 1 through the second line 13b having flexibility. Accordingly, the flexible cable according to an embodiment of the present disclosure may be used as a common cable which is electrically connectable to various drivers having different terminal structures, and the degree of freedom in design of a terminal (or electrode pad) position of each driver may increase. The flexible cable according to another embodiment of the present disclosure may simultaneously supply the driving power to each of first and second drivers 1-1 and 1-2 of the driver 1 through the second line 13b (or the finger line) of each of the plurality of conductive lines 13-1 to 13-4 included in each of the first and second electrode groups 13G1 and 13G2.

Figure 9:
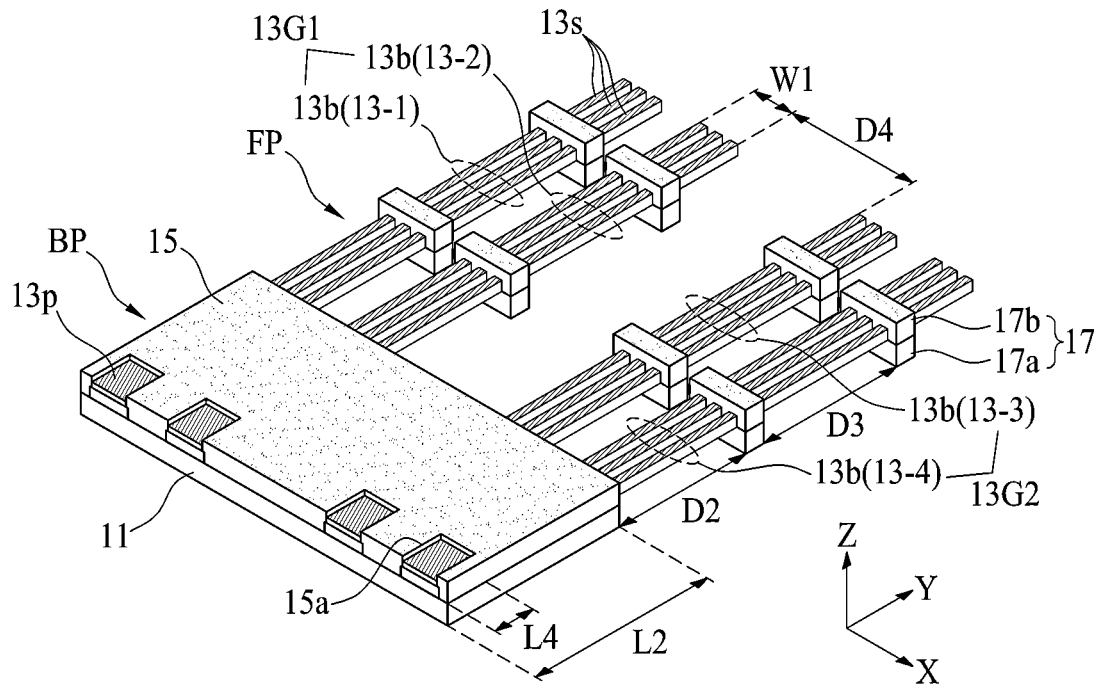
FIG. 9 illustrates a flexible cable according to another embodiment of the present disclosure.

FIG. 9 illustrates a flexible cable according to another embodiment of the present disclosure and illustrates an embodiment where the supporter illustrated in FIG. 5 is applied to the flexible cable illustrated in FIG. 7. Hereinafter, therefore, repetitive descriptions of elements other than a supporter and elements relevant thereto are omitted or will be briefly given.

With reference to FIG. 9, in the flexible cable according to another embodiment of the present disclosure, a second line 13b of each of a plurality of conductive lines 13-1 to 13-4 may include a plurality of straps 13s which are spaced apart from one another. The plurality of straps 13s may be substantially the same as the plurality of straps 13s described above with reference to FIG. 4, and thus, like reference numerals refer to like elements and their repetitive descriptions are omitted.

One or more supporters 17 may surround the plurality of straps 13s of the plurality of conductive lines 13-1 to 13-4 in common. The supporter 17 may surround a portion of each of the plurality of straps 13s in common. The supporter 17 may include first and second supporters 17a and 17b which surround a portion of each of the plurality of straps 13s in common. Except for that the first and second supporters 17a and 17b surround the straps 13s in common, the first and second supporters 17a and 17b may be substantially the same as the first and second supporters 17a and 17b described above with reference to FIG. 5, and thus, like reference numerals refer to like elements and their repetitive descriptions are omitted.

Therefore, the flexible cable according to another embodiment of the present disclosure may have an effect of the flexible cable illustrated in FIG. 7 and an effect of the flexible cable illustrated in FIG. 5. The flexible cable according to another embodiment of the present disclosure may simultaneously supply a driving power to each of first and second drivers of the driver 1 through the first and second electrode groups 13G1 and 13G2. For example, the flexible cable according to another embodiment of the present disclosure may further include the supporter 17 which is disposed on the second line 13b of each of the plurality of conductive lines 13-1 to 13-4, and thus, a separation distance D1 between the second lines 13b may be maintained, thereby preventing electrical short circuit between the second lines 13b.

Figure 10:
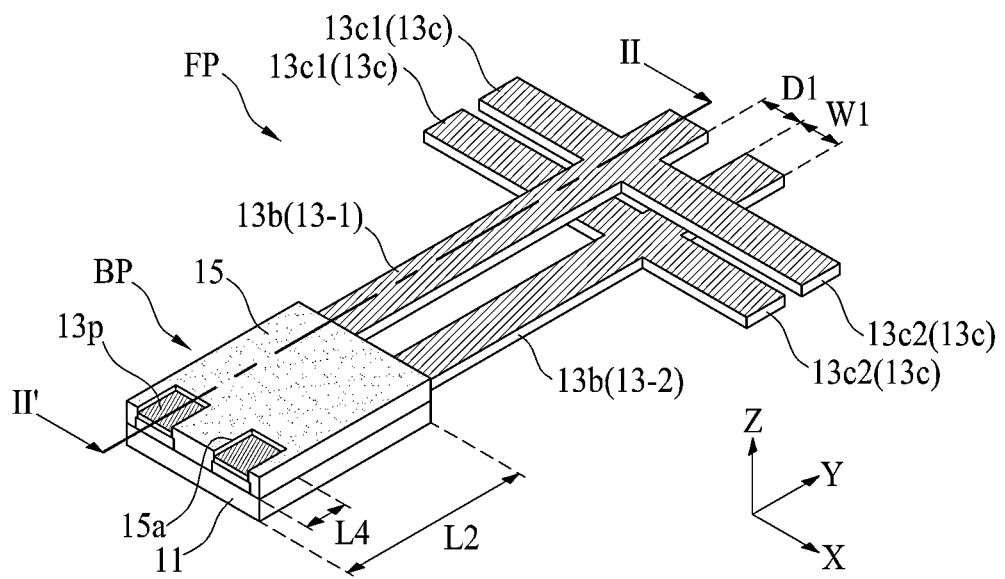
FIG. 10 illustrates a flexible cable according to another embodiment of the present disclosure.
Figure 11:
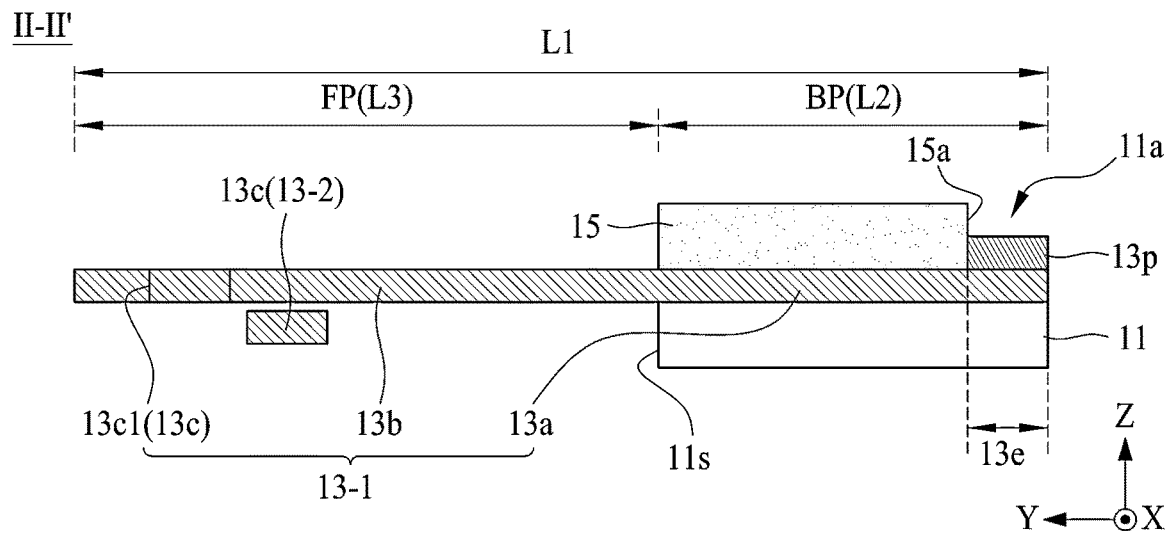
FIG. 11 is a cross-sectional view taken along line II-IP illustrated in FIG. 10.

FIG. 10 illustrates a flexible cable according to another embodiment of the present disclosure. FIG. 11 is a cross-sectional view taken along line II-IP illustrated in FIG. 10. FIGS. 10 and 11 illustrate an embodiment where a structure of the conductive line illustrated in FIG. 1 is modified. Hereinafter, therefore, repetitive descriptions of elements other than a conductive line are omitted or will be briefly given.

With reference to FIGS. 10 and 11, the flexible cable according to another embodiment of the present disclosure may include first and second conductive lines 13-1 and 13-2.

Each of the first and second conductive lines 13-1 and 13-2 may include a first line 13a which is disposed on a base member 11, a second line 13b which extends or protrudes from the first line 13a to the outside of a side surface of the base member 11 in a second direction Y, and at least one third line 13c which protrudes from the second line 13b in parallel with a first direction X.

In each of the first and second conductive lines 13-1 and 13-2, the first line 13a and the second line 13b may be substantially the same as the first line 13a and the second line 13b described above with reference to FIGS. 1 and 2, and thus, like reference numerals refer to like elements and their repetitive descriptions are omitted.

In each of the first and second conductive lines 13-1 and 13-2, at least one third line 13c may extend in the first direction X from at least one of one portion and the other portion of the second line 13b parallel to the second direction Y. For example, in each of the first and second conductive lines 13-1 and 13-2, the second line 13b and the third line 13c may have a ⊣-shaped, ⊢-shaped, +-shaped, †-shaped or ‡-shaped planar structure.

The third line 13c of the first conductive line 13-1 may be spaced apart from the third line 13c of the second conductive line 13-2 in the second direction Y, and thus, the third line 13c of the first conductive line 13-1 may be electrically insulated or disconnected (or isolated) from the third line 13c of the second conductive line 13-2. The third line 13c may be a wing line, but the terms are not limited thereto.

Each of the third line 13c of the first conductive line 13-1 and the third line 13c of the second conductive line 13-2 may have a length which is longer than a first width W1 of a corresponding second line 13b. The third line 13c of the first conductive line 13-1 and the third line 13c of the second conductive line 13-2 may have different lengths, but embodiments are not limited thereto.

The third line 13c of each of the first and second conductive lines 13-1 and 13-2 according to an embodiment of the present disclosure may include a 3-1$^{th}$ line 13c1, which extends in the first direction X from one portion of a corresponding second line 13b, and a 3-2$^{th}$ line 13c2 which extends in the first direction X from the other portion of the corresponding second line 13b. The 3-1$^{th}$ line 13c1 of the first conductive line 13-1 and the 3-2$^{th}$ line 13c2 of the second conductive line 13-2 may have the same length, but embodiments are not limited thereto. The 3-2$^{th}$ line 13c2 of the first conductive line 13-1 and the 3-1$^{th}$ line 13c1 of the second conductive line 13-2 may have the same length, but embodiments are not limited thereto.

Figure 12:
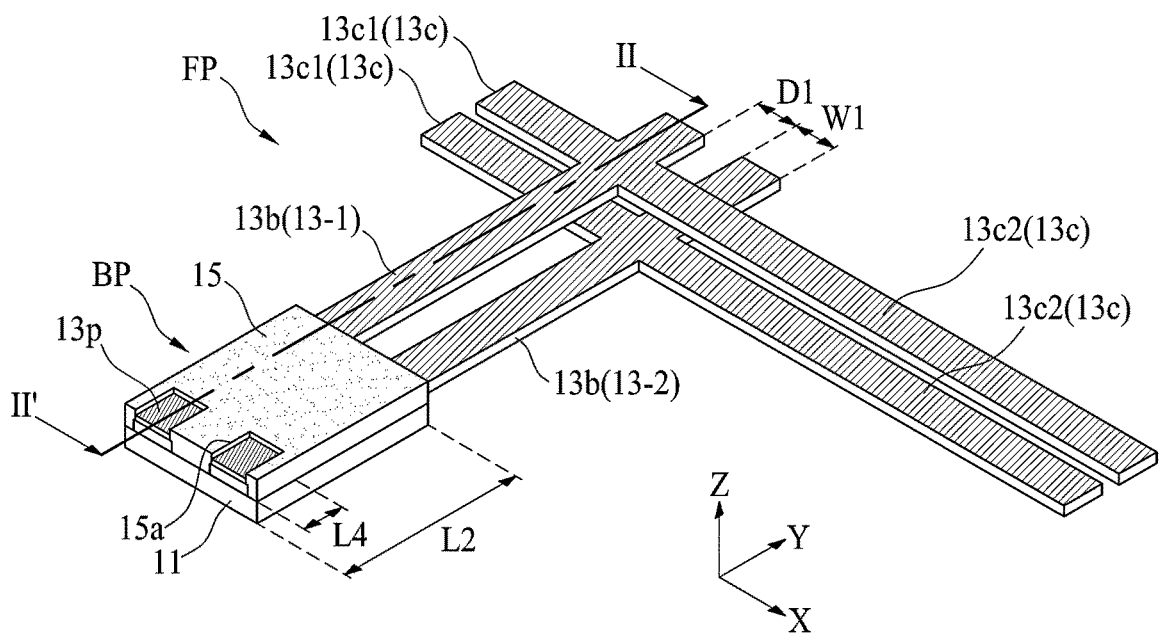
FIG. 12 illustrates a flexible cable according to another embodiment of the present disclosure.

In each of the first and second conductive lines 13-1 and 13-2 According to an embodiment of the present disclosure, the 3-1$^{th}$ wing line 13c1 and the 3-2$^{th}$ wing line 13c2 may have different lengths. For example, in each of the first and second conductive lines 13-1 and 13-2, as illustrated in FIG. 12, the 3-2$^{th}$ line 13c2 may have a length which is relatively longer than that of a corresponding 3-1$^{th}$ line 13c1 or the base member 11.

Therefore, the flexible cable according to another embodiment of the present disclosure may have an effect of the flexible cable illustrated in FIGS. 1 to 3. For example, the flexible cable according to an embodiment of the present disclosure may include the second line 13b (or the finger line) of each of the plurality of conductive lines 13-1 to 13-4 protruding from the base member 11 (or the body portion BP), and thus, may be electrically connected to a driver through the second line 13b having flexibility. Accordingly, the flexible cable according to another embodiment of the present disclosure may be used as a common cable which is electrically connectable to various drivers having different terminal structures, and the degree of freedom in design of a terminal (or electrode pad) position of each driver may increase. A contact area between the third line 13c of each of the first and second conductive lines 13-1 and 13-2 and a driver may increase, and thus, the flexible cable according to another embodiment of the present disclosure may supply a uniform driving power to the driver. Also, when the flexible cable illustrated in FIG. 12 is applied to the driver illustrated in FIG. 8, the flexible cable illustrated in FIG. 12 may simultaneously supply the driving power to first and second drivers 1-1 and 1-2 of the driver 1 through the third line 13c of each of the first and second conductive lines 13-1 and 13-2, and thus, the number of terminals may decrease.

Figure 13:
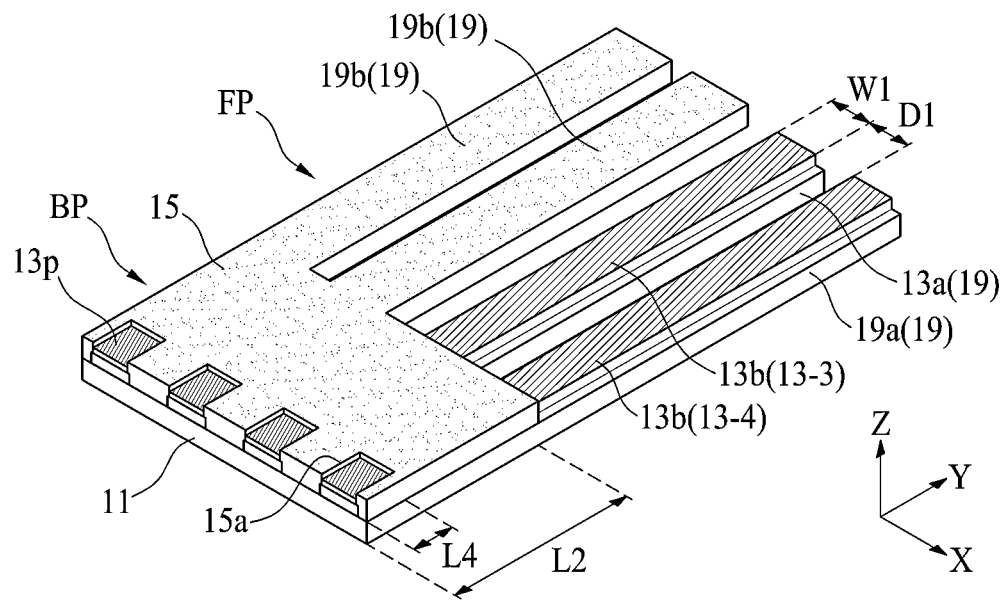
FIG. 13 illustrates a flexible cable according to another embodiment of the present disclosure.
Figure 14:
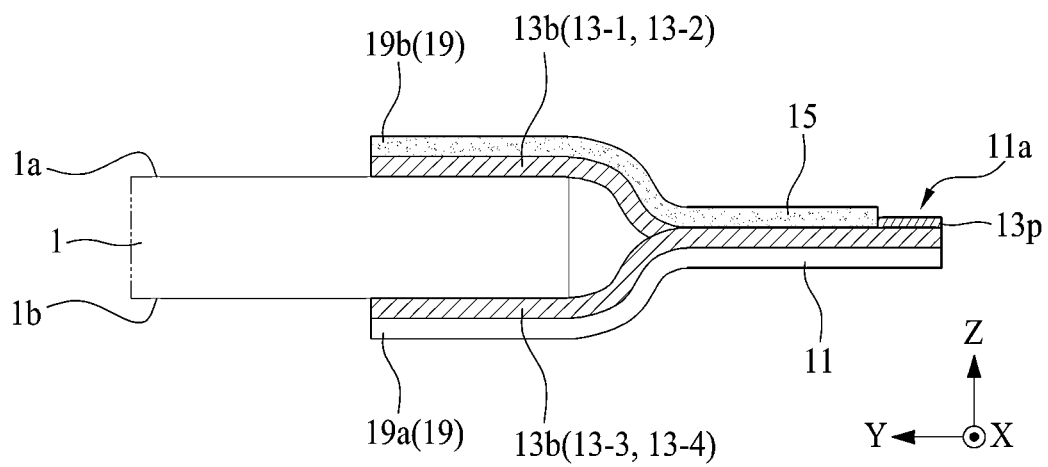
FIG. 14 illustrates a connection structure between a driver and the flexible cable illustrated in FIG. 13.

FIG. 13 illustrates a flexible cable according to another embodiment of the present disclosure. FIG. 14 illustrates a connection structure between a driver and the flexible cable illustrated in FIG. 13. FIGS. 13 and 14 illustrate an embodiment where one or more line supporting portions are additionally provided in the flexible cable illustrated in FIGS. 1 to 3. Hereinafter, therefore, repetitive descriptions of elements other than one or more line supporting portions are omitted or will be briefly given.

With reference to FIGS. 13 and 14, the flexible cable according to another embodiment of the present disclosure may further include one or more line supporting portions 19 which support a second line 13b of each of a plurality of conductive lines 13-1 to 13-4.

The one or more line supporting portions 19 may support a first surface (a front surface or one surface) and/or a second surface (a rear surface or the other surface) of a corresponding second line 13b of second lines 13b among the plurality of conductive lines 13-1 to 13-4.

The one or more line supporting portions 19 according to an embodiment of the present disclosure may include a first line supporting portion 19a, which supports some of the second lines 13b among the plurality of conductive lines 13-1 to 13-4, and/or a second line supporting portion 19b which supports the other second lines 13b of the second lines 13b among the plurality of conductive lines 13-1 to 13-4.

The first line supporting portion 19a may support or cover front surfaces of some of the second lines 13b among the plurality of conductive lines 13-1 to 13-4 in common or individually. For example, the first line supporting portion 19a may include the same material as that of a protection layer 15, but embodiments are not limited thereto. For example, the first line supporting portion 19a may be a portion of the protection layer 15 which is not removed in a process of manufacturing the flexible cable and covers a front surface and side surfaces of a corresponding second line 13b.

The second line supporting portion 19b may support or cover rear surfaces of some of the second lines 13b among the plurality of conductive lines 13-1 to 13-4 in common or individually. For example, the second line supporting portion 19b may include the same material as that of a base member 11, but embodiments are not limited thereto. For example, the second line supporting portion 19b may be a portion of the base member 11 which is not removed in a process of manufacturing the flexible cable and covers a rear surface of a corresponding second line 13b.

According to an embodiment of the present disclosure, for example, the first line supporting portion 19a may support a second line 13b of each of first and second conductive lines 13-1 and 13-2 included in a first electrode group among the plurality of conductive lines 13-1 to 13-4, and the second line supporting portion 19b may support a second line 13b of each of third and fourth conductive lines 13-3 and 13-4 included in a second electrode group among the plurality of conductive lines 13-1 to 13-4.

According to an embodiment of the present disclosure, some of the second lines 13b of the plurality of conductive lines 13-1 to 13-4 may be exposed in a rearward direction (or a downward direction) of the flexible cable, and as illustrated in FIG. 14, may be electrically connected to an upper electrode layer 1a disposed on an upper surface of a driver 1 and may not be exposed at a front surface of the flexible cable by the second line supporting portion 19b. According to an embodiment of the present disclosure, the other second lines 13b of the second lines 13b of the plurality of conductive lines 13-1 to 13-4 may be exposed in a forward direction (or an upward direction) of the flexible cable, and as illustrated in FIG. 14, may be electrically connected to a lower electrode layer 1b disposed on a lower surface of the driver 1 and may not be exposed at a rear surface of the flexible cable by the first line supporting portion 19a.

Therefore, in the flexible cable according to another embodiment of the present disclosure, the second line 13b of each of the plurality of conductive lines 13-1 to 13-4 may be supported by the line supporting portion 19, and thus, electrical short circuit between the second lines 13b may be prevented and the electrical adhesive characteristic and adhesive reliability between the driver and the second line 13b may be enhanced. The one or more line supporting portions 19 might be an electrically insulating.

Figure 15:
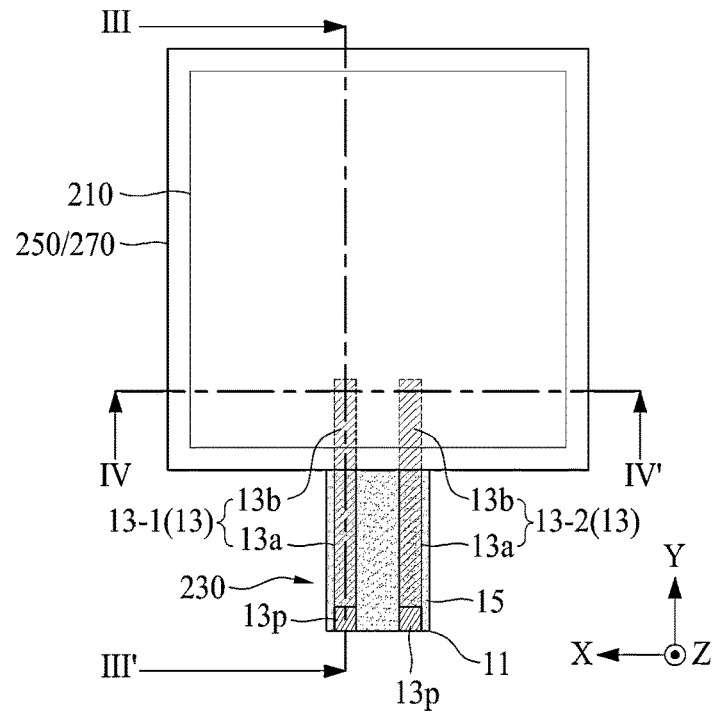
FIG. 15 illustrates a vibration device according to an embodiment of the present disclosure.
Figure 16:
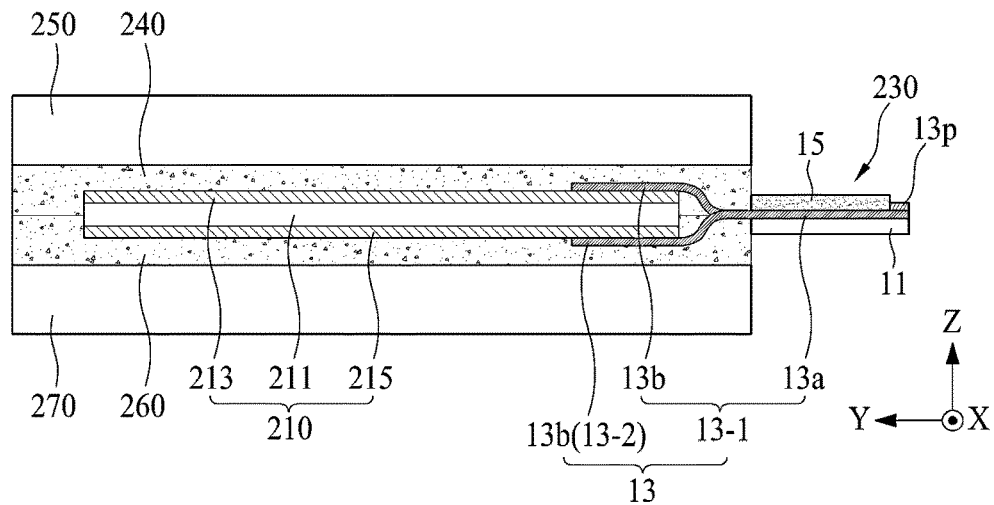
FIG. 16 is a cross-sectional view taken along line illustrated in FIG. 15.
Figure 17:
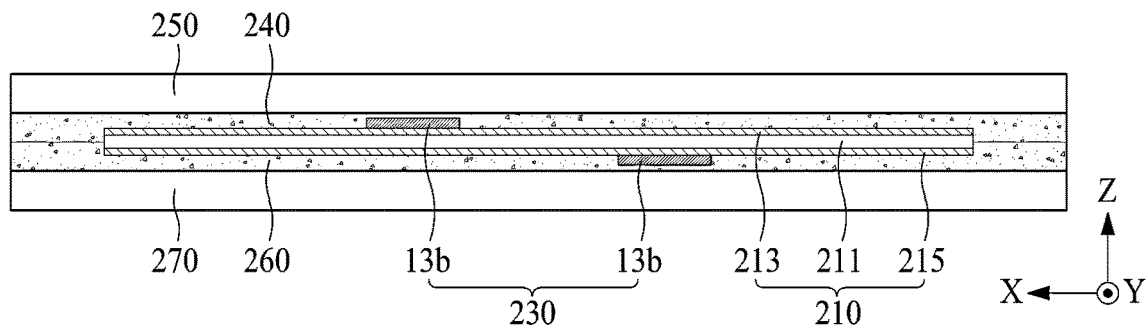
FIG. 17 is a cross-sectional view taken along line IV-IV' illustrated in FIG. 15.

FIG. 15 illustrates a vibration device according to an embodiment of the present disclosure, FIG. 16 is a cross-sectional view taken along line illustrated in FIG. 15, and FIG. 17 is a cross-sectional view taken along line IV-IV' illustrated in FIG. 15.

With reference to FIGS. 15 to 17, a vibration device according to an embodiment of the present disclosure may include a vibration structure 210 and a flexible cable 230. For example, the vibration device may be a vibration device in which the flexible cable 230 is integrated.

The vibration structure 210 may alternately and repeatedly contract and expand based on a piezoelectric effect (or a piezoelectric characteristic) to vibrate. The vibration structure 210 according to an embodiment of the present disclosure may alternately and repeatedly contract and expand based on an inverse piezoelectric effect (or a piezoelectric characteristic) to vibrate in a thickness direction Z.

The vibration structure 210 according to an embodiment of the present disclosure may include a vibration module including a piezoelectric layer 211, a first electrode layer 213, and a second electrode layer 215.

The piezoelectric layer 211 may include a piezoelectric material, a composite piezoelectric material, or an electro active material, which includes a piezoelectric effect. The piezoelectric layer 211 may be referred to as the other term such as a vibration layer, a piezoelectric material layer, a piezoelectric composite layer, an electro active layer, a vibration portion, a piezoelectric material portion, a piezoelectric composite portion, an electro active portion, a piezoelectric structure, a piezoelectric composite, or a piezoelectric ceramic composite.

The piezoelectric layer 211 according to an embodiment of the present disclosure may include a ceramic-based material capable of realizing a relatively high vibration. For example, the piezoelectric layer 211 may include a 1-3 composite having a piezoelectric characteristic of a 1-3 vibration mode or a 2-2 composite having a piezoelectric characteristic of a 2-2 vibration mode. For example, a piezoelectric deformation coefficient "$d_{33}$" of the piezoelectric layer 211 in a thickness direction Z may have 1,000 pC/N or more, but embodiments are not limited thereto. pC/N may be a unit of piezoelectric effect, which represents the amount of electricity generated on the surface of a piezoelectric material when a force of 1 Newton is applied.

The first electrode layer 213 may be disposed on a first surface (or an upper surface) of the piezoelectric layer 211 and may be electrically connected to the first surface of the piezoelectric layer 211. For example, the first electrode layer 213 may have a common electrode type disposed all over the first surface of the piezoelectric layer 211. The first electrode layer 213 according an embodiment of the present disclosure may include a transparent conductive material, a semitransparent (or translucent) conductive material, or an opaque conductive material. For example, examples of the transparent conductive material or the semitransparent conductive material may include indium tin oxide (ITO) or indium zinc oxide (IZO), but embodiments are not limited thereto. Examples of the opaque conductive material may include aluminum (Al), copper (Cu), gold (Au), silver (Ag), molybdenum (Mo), magnesium (Mg), and an alloy of any thereof, but embodiments are not limited thereto.

The second electrode layer 215 may be on a second surface (or a rear surface) opposite to the first surface of the piezoelectric layer 211, and may be electrically connected to the second surface of the piezoelectric layer 211. For example, the second electrode layer 215 may have a common electrode type disposed all over the second surface of the piezoelectric layer 211. The second electrode layer 215 according to an embodiment of the present disclosure may include a transparent conductive material, a semitransparent conductive material, or an opaque conductive material. For example, the second electrode layer 215 may include the same material as that of the first electrode layer 213, but embodiments are not limited thereto. As another example, the second electrode layer 215 may include a material different from that of the first electrode layer 213.

The piezoelectric layer 211 may be polarized by a certain voltage applied to the first electrode layer 213 and the second electrode layer 215 in a certain temperature atmosphere, or a temperature atmosphere that may be changed from a high temperature to a room temperature. Embodiments are not limited to these examples.

The flexible cable 230 may be electrically connected to the first and second electrode layers 213 and 215 of the vibration structure 210 at one portion of the vibration structure 210, and thus, may be integrated into the vibration structure 210. For example, the flexible cable 230 may be electrically and directly connected to the first and second electrode layers 213 and 215 of the vibration structure 210 at the one portion of the vibration structure 210, and thus, may be integrated into the vibration structure 210.

The flexible cable 230 according to an embodiment of the present disclosure may include a plurality of conductive lines 13-1 and 13-2. For example, some of the plurality of conductive lines 13-1 and 13-2 may be electrically connected to the first electrode layer 213 of the vibration structure 210, and the other conductive lines of the plurality of conductive lines 13-1 and 13-2 may be electrically connected to the second electrode layer 215 of the vibration structure 210. For example, some of the plurality of conductive lines 13-1 and 13-2 may be electrically and directly connected to the first electrode layer 213 of the vibration structure 210, and the other conductive lines of the plurality of conductive lines 13-1 and 13-2 may be electrically and directly connected to the second electrode layer 215 of the vibration structure 210. For example, the plurality of conductive lines 13-1 and 13-2 may be respectively bent toward corresponding electrode layers 213 and 215, but embodiments are not limited thereto.

The flexible cable 230 according to an embodiment of the present disclosure may include a body portion BP including a terminal portion 11a and a plurality of finger lines 13-1 and 13-2 protruding from the body portion BP. For example, some of the plurality of finger lines 13-1 and 13-2 may be electrically connected to the first electrode layer 213 of the vibration structure 210, and the other finger lines of the plurality of finger lines 13-1 and 13-2 may be electrically connected to the second electrode layer 215 of the vibration structure 210. For example, some of the plurality of finger lines 13-1 and 13-2 may be electrically and directly connected to the first electrode layer 213 of the vibration structure 210, and the other finger lines of the plurality of finger lines 13-1 and 13-2 may be electrically and directly connected to the second electrode layer 215 of the vibration structure 210. For example, the plurality of finger lines 13-1 and 13-2 may be respectively bent toward corresponding electrode layers 213 and 215, but embodiments are not limited thereto. For example, a protrusion length of each of the plurality of finger lines 13-1 and 13-2 may be longer than a length of the terminal portion 11a.

The flexible cable 230 according to an embodiment of the present disclosure may include a base member 11, a conductor layer 13 including first and second conductive lines 13-1 and 13-2, and a protection layer 15. Except for that the conductor layer 13 includes the first and second conductive lines 13-1 and 13-2, the flexible cable 230 may include substantially the same elements as those of the flexible cable 230 described above with reference to FIGS. 1 to 3, and thus, their repetitive descriptions are omitted.

Each of the first and second conductive lines 13-1 and 13-2 may include a first line 13a, which is disposed on the base member 11, and a second line 13b (or a finger line) which extends to the vibration structure 210 via a side surface 11s of the base member 11 from the first line 13a in the second direction Y. Each of the first and second conductive lines 13-1 and 13-2 may include substantially the same elements as those of each of the conductive lines 13-1 to 13-4 described above with reference to FIGS. 1 to 3, and thus, their repetitive descriptions are omitted.

In the flexible cable 230, the second line 13b of each of the first and second conductive lines 13-1 and 13-2 protruding from the base member 11 may be used as a line electrode and a pad electrode of the vibration structure 210.

The second line 13b of the first conductive line 13-1 may be electrically connected to the first electrode layer 213 of the vibration structure 210. For example, the second line 13b of the first conductive line 13-1 may be bent from one portion (or side) of the vibration structure 210 toward the first electrode layer 213 of the vibration structure 210 and may be electrically connected to one edge (or periphery) portion of the first electrode layer 213.

The second line 13b of the second conductive line 13-2 may be electrically connected to the second electrode layer 215 of the vibration structure 210. For example, the second line 13b of the second conductive line 13-2 may be bent from the one portion (or side) of the vibration structure 210 toward the second electrode layer 215 of the vibration structure 210 and may be electrically connected to one edge (or periphery) portion of the second electrode layer 215.

Each of the first and second conductive lines 13-1 and 13-2 may include the plurality of straps 13s described above with reference to FIG. 4, include the plurality of straps 13s and the supporter 17 described above with reference to FIG. 6, or further include the third line 13c described above with reference to FIG. 10.

Therefore, the flexible cable 230 may supply a driving power to the vibration structure 210 through the second line 13b of each of the first and second conductive lines 13-1 and 13-2, and thus, voltage drop caused by a surface resistance characteristic of each of the first and second electrode layers 213 and 215 disposed in the vibration structure 210 may decrease, an electrical characteristic of each of the first and second electrode layers 213 and 215 may be complemented, and the degree of selection freedom of a conductive material used for the first and second electrode layers 213 and 215 may increase.

The vibration device or the vibration structure 210 according to an embodiment of the present disclosure may further include a first protection member 250 and a second protection member 270.

The first protection member 250 may be disposed on a first surface of the vibration structure 210. For example, the first protection member 250 may be disposed on the first surface of the vibration structure 210 with the second line 13b of the first conductive line 13-1 interposed therebetween. The first protection member 250 may cover the first surface of the vibration structure 210 and the second line 13b of the first conductive line 13-1 of the flexible cable 230, and thus, may protect the first electrode layer 213 or the first surface of the vibration structure 210 and may maintain an electrical connection between the first electrode layer 213 of the vibration structure 210 and the second line 13b of the first conductive line 13-1 of the flexible cable 230.

The first protection member 250 according to an embodiment of the present disclosure may be connected to the first surface of the vibration structure 210 where the second line 13b of the first conductive line 13-1 of the flexible cable 230 is disposed, by a first adhesive layer 240. For example, the first protection member 250 may be attached on the first surface of the vibrations structure 210 including the second line 13b of the first conductive line 13-1 through a film laminating process using the first adhesive layer 240. Accordingly, the second line 13b (or a first finger line) of the first conductive line 13-1 of the flexible cable 230 may be disposed between the first surface of the vibration structure 210 and the first protection member 250 and may be integrated into the vibration structure 210. Alternatively, the first protection member 250 may be attached on the first surface of the vibrations structure 210 including the second line 13b of the first conductive line 13-1 through other process.

The second protection member 270 may be disposed on a second surface of the vibration structure 210. For example, the second protection member 270 may be disposed on the second surface of the vibration structure 210 with the second line 13b of the second conductive line 13-2 interposed therebetween. The second protection member 270 may cover the second surface of the vibration structure 210 and the second line 13b of the second conductive line 13-2 of the flexible cable 230, and thus, may protect the second electrode layer 215 or the second surface of the vibration structure 210 and may maintain an electrical connection between the second electrode layer 215 of the vibration structure 210 and the second line 13b of the second conductive line 13-2 of the flexible cable 230.

The second protection member 270 according to an embodiment of the present disclosure may be connected to the second surface of the vibration structure 210 where the second line 13b of the second conductive line 13-2 of the flexible cable 230 is disposed, by a second adhesive layer 260. For example, the second protection member 270 may be attached on the second surface of the vibrations structure 210 including the second line 13b of the second conductive line 13-2 through a film laminating process using the second adhesive layer 260. Accordingly, the second line 13b (or a second finger line) of the second conductive line 13-2 of the flexible cable 230 may be disposed between the second surface of the vibration structure 210 and the second protection member 270 and may be integrated into the vibration structure 210. Alternatively, the second protection member 270 may be attached on the second surface of the vibrations structure 210 including the second line 13b of the second conductive line 13-2 through other process.

For example, each of the first and second protection members 250 and 270 may not include a line or a pad electrically connected to the vibration structure 210, and thus, may be an insulation film or a protection film for protecting the vibration structure 210. Each of the first and second protection members 250 and 270 according to an embodiment of the present disclosure may include a plastic film. For example, each of the first and second protection members 250 and 270 may be a polyimide film or a polyethylene terephthalate film, but embodiments are not limited thereto.

As another example, each of the first and second protection members 250 and 270 may include a metal film or a metal plate including a metal material. Each of the first and second protection members 250 and 270 may be configured to be connected to the vibration structure 210 by the adhesive layer 240 and 260. Each of the first and second protection members 250 and 270 including a metal material may reinforce a mass of the vibration structure 210 to decrease a resonance frequency of the vibration structure 210 based on the increase in mass, and thus, may increase a sound pressure level characteristic of a low-pitched sound band generated based on a vibration of the vibration structure 210. For example, each of the first and second protection members 250 and 270 may include one or more materials of stainless steel, aluminum (Al), a magnesium (Mg), a Mg alloy, a magnesium-lithium (Mg—Li) alloy, and an Al alloy, but embodiments are not limited thereto.

As another example, one of the first and second protection members 250 and 270 may include a metal material, the other protection member among the first and second protection members 250 and 270 may include a plastic film. Even in this case, a sound pressure level characteristic of a low-pitched sound band generated based on a vibration of the vibration structure 210 may increase due to an increase in mass (or weight) caused by the one of the first and second protection members 250 and 270 including the metal material.

The first adhesive layer 240 may be disposed between the first electrode layer 213 and the first protection member 250 of the vibration structure 210. The first adhesive layer 240 may cover the second line 13b (or a first finger line) of the first conductive line 13-1 of the flexible cable 230. The second adhesive layer 260 may be disposed between the second electrode layer 215 and the second protection member 270 of the vibration structure 210. The second adhesive layer 260 may cover the second line 13b (or a second finger line) of the second conductive line 13-2 of the flexible cable 230.

According to an embodiment of the present disclosure, each of the first adhesive layer 240 and the second adhesive layer 260 may include an electric insulating material which has adhesiveness and is capable of compression and decompression. For example, each of the first adhesive layer 240 and the second adhesive layer 260 may include an epoxy resin, an acryl resin, a silicone resin, or a urethane resin, but embodiments are not limited thereto.

According to an embodiment of the present disclosure, when one of the first and second protection members 250 and 270 includes a metal material, each of the first adhesive layer 240 and the second adhesive layer 260 may act as an electrical insulation layer which electrically insulates the electrode layers 213 and 215 of the vibration structure 210 from the first and second protection members 250 and 270 including a metal material. For example, the first adhesive layer 240 may be a first electrical insulation layer, and the second adhesive layer 260 may be a second electrical insulation layer.

Therefore, the vibration device according an embodiment of the present disclosure may not need a soldering process between the vibration structure 210 and the flexible cable 230 and a patterning process of forming a line and a pad in each of the first and second protection members 250 and 270 based on an integration structure between the vibration structure 210 and the flexible cable 230, and thus, a structure of the vibration device and a process of manufacturing the vibration device may be simplified. Also, in the vibration device according an embodiment of the present disclosure, because a line and a pad are not disposed in each of the first and second protection members 250 and 270, it is not required to place a conductive sheet (or a conductive film) between each of the first and second protection members 250 and 270 and the vibration structure 210, and thus, because the conductive sheet is omitted, a vibration device having a thin thickness may be implemented. Also, in the vibration device according an embodiment of the present disclosure, a driving power may be directly supplied to the vibration structure 210 through the flexible cable 230. In the vibration device according an embodiment of the present disclosure, because the driving power is supplied to the vibration structure 210 through the flexible cable 230, an electrical characteristic of each of the first and second electrode layers 213 and 215 disposed in the vibration structure 210 may be complemented.

FIGS. 18A to 18G illustrate a piezoelectric layer of a vibration structure illustrated in FIGS. 15 to 17.

Figure 18A:
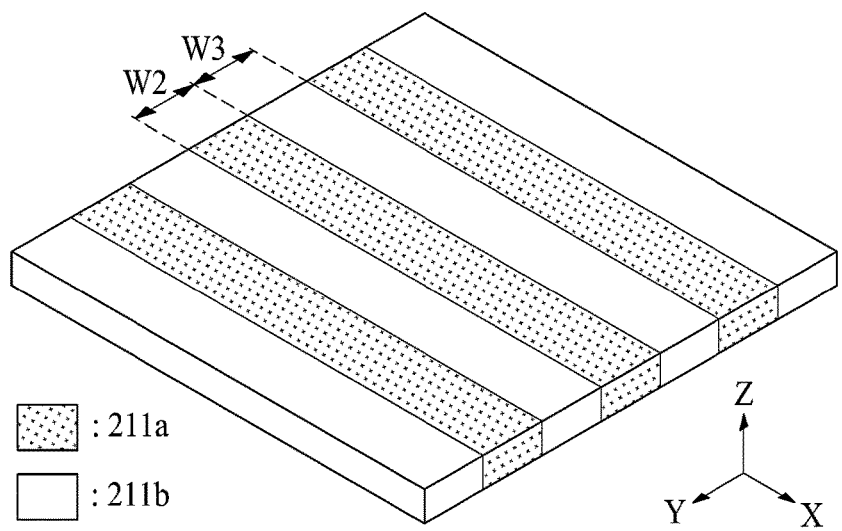
FIGS. 18A to 18G illustrate a piezoelectric layer of a vibration structure illustrated in FIGS. 15 to 17.

With reference to FIG. 18A, a piezoelectric layer 211 of the vibration structure 210 according an embodiment of the present disclosure may include a plurality of first portions 211a and a plurality of second portions 211b. For example, the plurality of first portions 211a and the plurality of second portions 211b may be alternately and repeatedly arranged in a second direction Y. Each of the plurality of first portions 211a may be disposed between two adjacent second portions 211b among the plurality of second portions 211b, and may have a second width W2 parallel to the second direction Y and a length parallel to a first direction X. Each of the plurality of second portions 211b may have a third width W3, which may be the same as the second width W2, and may have a length parallel to the first direction X. For example, the first portions 211a and the second portions 211b may each have a line type or a stripe type, each having the same size. Therefore, the piezoelectric layer 211 of the vibration structure 210 illustrated in FIG. 18A may include a 2-2 composite and thus may have a resonance frequency of 20 kHz or less, but embodiments are not limited thereto and a resonance frequency of the piezoelectric layer 211 may vary based on one or more of a shape, a length, and a thickness.

Figure 18B:
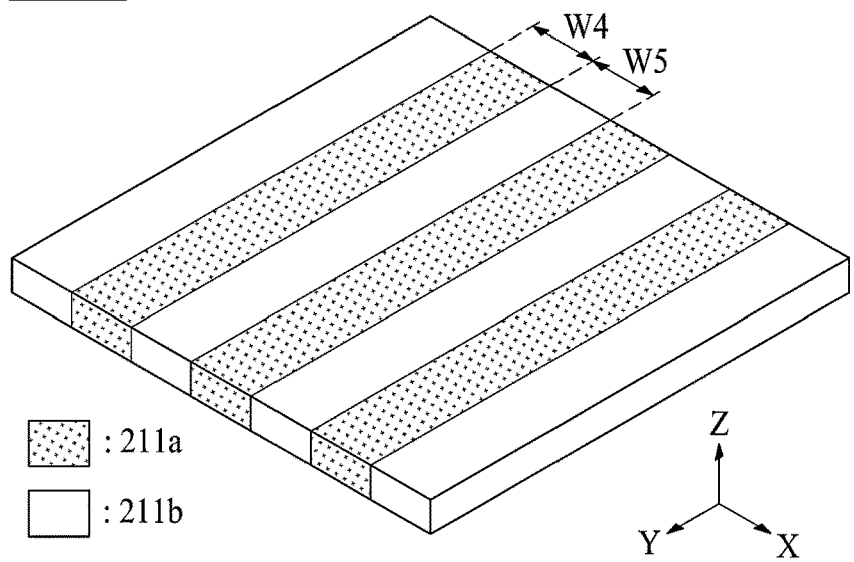

With reference to FIG. 18B, a piezoelectric layer 211 of the vibration structure 210 according to another embodiment of the present disclosure may include a plurality of first portions 211a and a plurality of second portions 211b, which are alternately and repeatedly arranged in a first direction X. Each of the plurality of first portions 211a may be disposed between two adjacent second portions 211b among the plurality of second portions 211b, and may have a fourth width W4 parallel to the first direction X and a length parallel to a second direction Y. Each of the plurality of second portions 211b may have a fifth width W5, which may be the same as the fourth width W4, and may have a length parallel to the second direction Y. For example, the first portions 211a and the second portions 211b may each have a line type or a stripe type, each having the same size. Therefore, the piezoelectric layer 211 of the vibration structure 210 illustrated in FIG. 18B may include a 2-2 composite and thus may have a resonance frequency of 20 kHz or less, but embodiments are not limited thereto and a resonance frequency of the piezoelectric layer 211 may vary based on one or more of a shape, a length, and a thickness.

In the piezoelectric layer 211 of the vibration structure 210 illustrated in each of FIGS. 18A and 18B, each of the plurality of first portions 211a and each of the plurality of second portions 211b may be disposed (or arranged) in parallel on the same plane (or the same layer). Each of the plurality of second portions 211b may be configured to fill a gap or a space between two adjacent first portions 211a, and thus, may be connected to or attached on an adjacent first portion 211a. For example, each of the plurality of second portions 211b may be connected to or attached on a side surface (or a lateral surface) of the adjacent first portion 211a. Accordingly, the piezoelectric layer 211 may be enlarged to have a desired size or length based on side coupling (or connection) between the first portion 211a and the second portion 211b.

In the piezoelectric layer 211 of the vibration structure 210 illustrated in each of FIGS. 18A and 18B, a width (or a size) W3 and W5 of each of the plurality of second portions 211b may progressively decrease in a direction from a center portion to both peripheries or both peripheries (or both ends) of the piezoelectric layer 211 or the vibration device.

A second portion 211b, having a largest width W3 and W5 among the plurality of second portions 211b, may be located in a portion on which a highest stress may concentrate when the piezoelectric layer 211 or the vibration device is vibrating in a vertical direction Z (or a thickness direction). A second portion 211b, having a smallest width W3 and W5 among the plurality of second portions 211b, may be located in a portion where a relatively low stress may occur when the piezoelectric layer 211 or the vibration device is vibrating in the vertical direction Z. For example, the second portion 211b, having the largest width W3 and W5 among the plurality of second portions 211b, may be disposed in the center portion of the piezoelectric layer 211, and the second portion 211b, having the smallest width W3 and W5 among the plurality of second portions 211b, may be disposed in each of the both edges or peripheries of the piezoelectric layer 211. Therefore, when the piezoelectric layer 211 or the vibration device is vibrating in the vertical direction Z, interference of a sound wave or overlapping of a resonance frequency, each occurring in the portion on which the highest stress concentrates, may be reduced or minimized. Thus, dipping phenomenon of a sound pressure level occurring in the low-pitched sound band may be reduced or minimized, thereby improving flatness of a sound characteristic in the low-pitched sound band. For example, flatness of a sound characteristic may be a level of a deviation between a highest sound pressure and a lowest sound pressure.

In the piezoelectric layer 211 of the vibration structure 210 illustrated in each of FIGS. 18A and 18B, each of the plurality of first portions 211a may have different sizes (or widths). For example, a size (or a width) of each of the plurality of first portions 211a may progressively decrease or increase in a direction from the center portion to the both peripheries (or both ends) of the piezoelectric layer 211 or the vibration device. For example, in the piezoelectric layer 211, a sound pressure level characteristic of a sound may be enhanced and a sound reproduction band may increase, based on various natural vibration frequencies according to a vibration of each of the plurality of first portions 211a having different sizes.

Figure 18C:
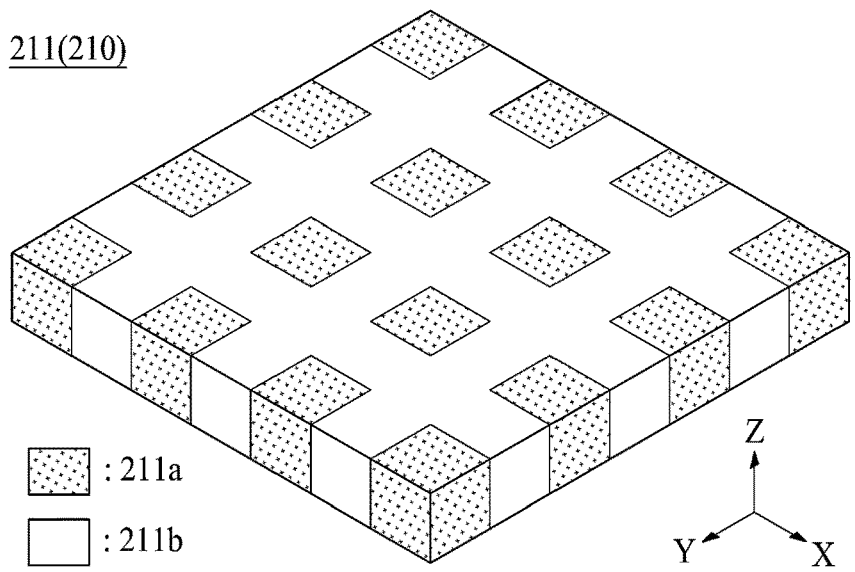

With reference to FIG. 18C, a piezoelectric layer 211 of the vibration structure 210 according to another embodiment of the present disclosure may include a plurality of first portions 211a, which are spaced apart from one another in a first direction X and a second direction Y, and a second portion 211b disposed between the plurality of first portions 211a. The plurality of first portions 211a may be disposed to be spaced apart from one another in the first direction X and the second direction Y. For example, each of the plurality of first portions 211a may have a hexahedral shape having the same size and may be disposed in a lattice shape. The second portion 211b may be disposed between the plurality of first portions 211a in each of the first direction X and the second direction Y. The second portion 211b may be configured to fill a gap or a space between two adjacent first portions 211a or to surround each of the plurality of first portions 211a, and thus, may be connected to or attached on an adjacent first portion 211a. According to an embodiment of the present disclosure, a width of a second portion 211b disposed between two first portions 211a adjacent to each other in the first direction X may be the same as or different from that of the first portion 211a, and a width of a second portion 211b disposed between two first portions 211a adjacent to each other in the second direction Y may be the same as or different from that of the first portion 211a. Therefore, the piezoelectric layer 211 of the vibration structure 210 illustrated in FIG. 18C may include a 1-3 composite and thus may have a resonance frequency of 30 MHz or less, but embodiments are not limited thereto and a resonance frequency of the piezoelectric layer 211 may vary based on one or more of a shape, a length, and a thickness.

Figure 18D:
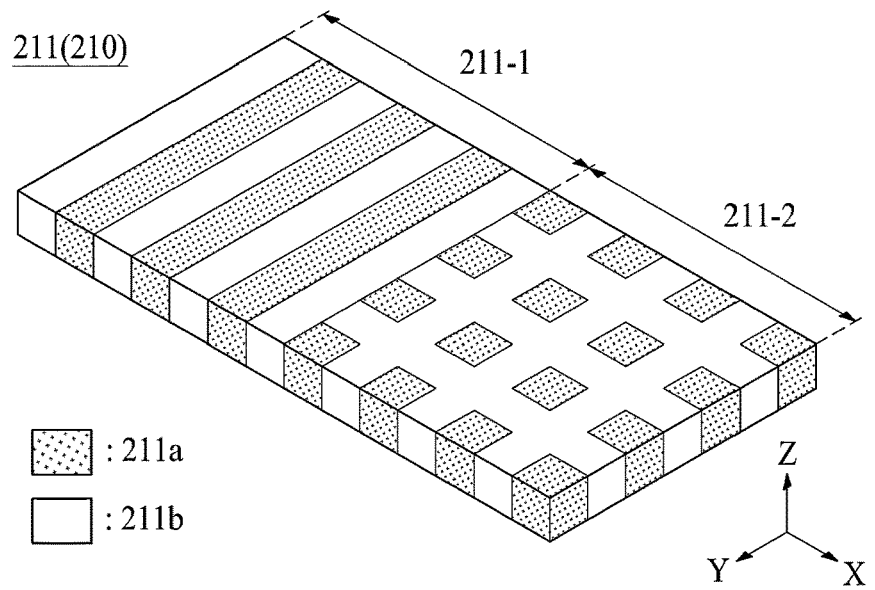

With reference to FIG. 18D, a piezoelectric layer 211 of the vibration structure 210 according to another embodiment of the present disclosure may include a first piezoelectric region 211-1 and a second piezoelectric region 211-2.

The first piezoelectric region 211-1 and the second piezoelectric region 211-2 may include different composites or may have different vibration modes. For example, the first piezoelectric region 211-1 may include a 2-2 composite, and the second piezoelectric region 211-2 may include a 1-3 composite.

The first piezoelectric region 211-1 according to another embodiment of the present disclosure may include a plurality of first portions 211a and a plurality of second portions 211b, which are alternately and repeatedly arranged in a first direction X. The first portions 211a and the second portions 211b disposed in the first piezoelectric region 211-1 may be substantially the same as the piezoelectric layer 211 described above with reference to FIG. 18B, and thus, like reference numerals refer to like elements and their repetitive descriptions are omitted.

The second piezoelectric region 211-2 according to another embodiment of the present disclosure may include a plurality of first portions 211a, which are spaced apart from one another in a first direction X and a second direction Y, and a second portion 211b disposed between the plurality of first portions 211a. For example, the second portion 211b may be configured to fill a gap or a space between two adjacent first portions 211a or to surround each of the plurality of first portions 211a. The first portions 211a and the second portions 211b disposed in the second piezoelectric region 211-2 may be substantially the same as the piezoelectric layer 211 described above with reference to FIG. 18C, and thus, like reference numerals refer to like elements and their repetitive descriptions are omitted.

Therefore, the piezoelectric layer 211 of the vibration structure 210 illustrated in FIG. 18D may have a resonance frequency of 20 kHz or less by the a 2-2 composite of the first piezoelectric region 211-1 and a resonance frequency of 30 MHz or less by the 1-3 composite of the second piezoelectric region 211-2, but embodiments are not limited thereto and a resonance frequency of the piezoelectric layer 211 may vary based on one or more of a shape, a length, and a thickness. For example, the first piezoelectric region 211-1 may be a speaker or a haptic device, and the second piezoelectric region 211-2 may be a sensor device.

Figure 18E:
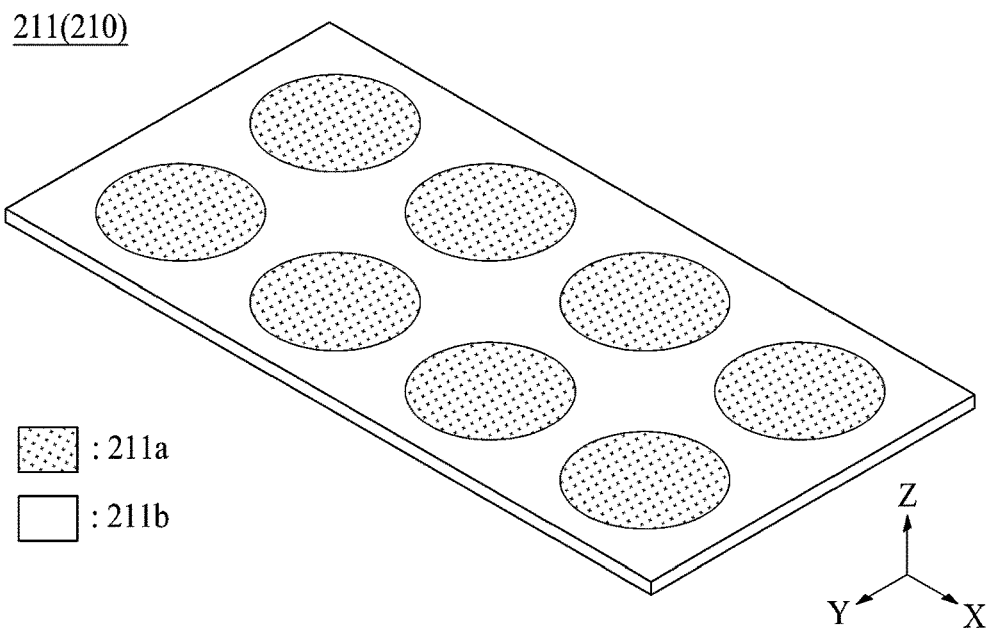

With reference to FIG. 18E, a piezoelectric layer 211 of the vibration structure 210 according to another embodiment of the present disclosure may include a plurality of first portions 211a, which are spaced apart from one another in a first direction X and a second direction Y, and a second portion 211b which surrounds each of the plurality of first portions 211a. Each of the plurality of first portions 211a may have a flat structure of a circular shape. For example, each of the plurality of first portions 211a may have a circular plate shape, but embodiments are not limited thereto and may have a dot shape including an oval shape, a polygonal shape, or a donut shape. The second portion 211b may be configured to surround each of the plurality of first portions 211a, and thus, may be connected to or attached on a side surface of each of the plurality of first portions 211a. Each of the plurality of first portions 211a and the second portion 211b may be disposed (or arranged) in parallel on the same plane (or the same layer). Therefore, the piezoelectric layer 211 illustrated in FIG. 18E may include a 1-3 composite and may be implemented as a circular vibration source (or vibrator), and thus, may be enhanced in vibration characteristic or sound output characteristic and may have a resonance frequency of 30 MHz or less. However, embodiments of the present disclosure are not limited thereto, and a resonance frequency of the piezoelectric layer 211 may vary based on one or more of a shape, a length, and a thickness of a piezoelectric layer.

Figure 18F:
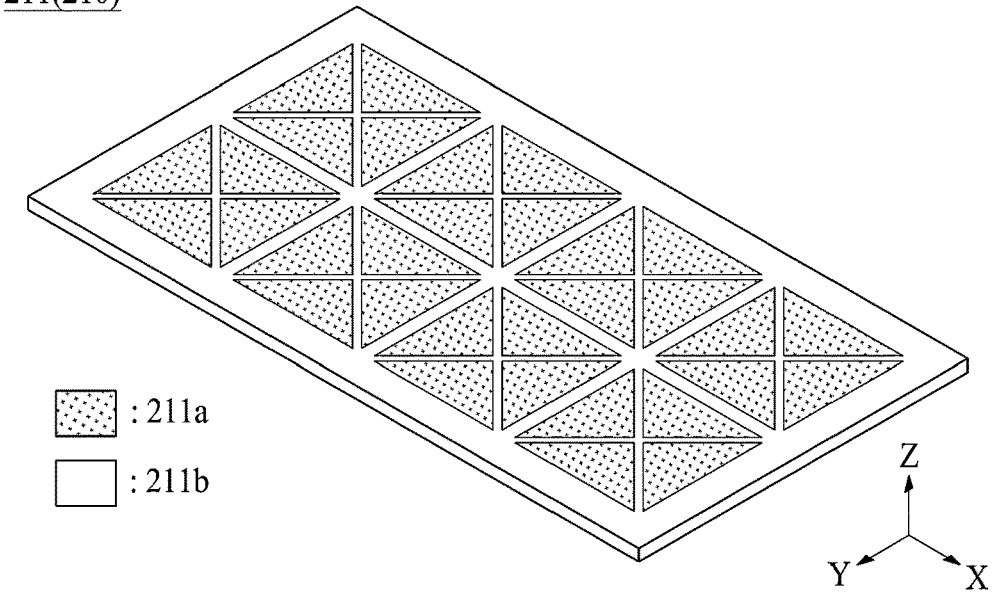

With reference to FIG. 18F, a piezoelectric layer 211 of the vibration structure 210 according to another embodiment of the present disclosure may include a plurality of first portions 211a, which are spaced apart from one another in a first direction X and a second direction Y, and a second portion 211b which surrounds each of the plurality of first portions 211a. Each of the plurality of first portions 211a may have a flat structure of a triangular shape. For example, each of the plurality of first portions 211a may have a triangular plate shape.

As another example, four adjacent first portions 211a among the plurality of first portions 211a may be adjacent to one another to form a tetragonal or quadrilateral shape (or a square shape). Vertices of the four adjacent first portions 211a forming a tetragonal shape may be adjacent to one another in a center portion (or a central portion) of the tetragonal shape. The second portion 211b may be configured to surround each of the plurality of first portions 211a, and thus, may be connected to or attached on a side surface (or a lateral surface) of each of the plurality of first portions 211a. Each of the plurality of first portions 211a and the second portion 211b may be disposed (or arranged) in parallel on the same plane (or the same layer).

Figure 18G:
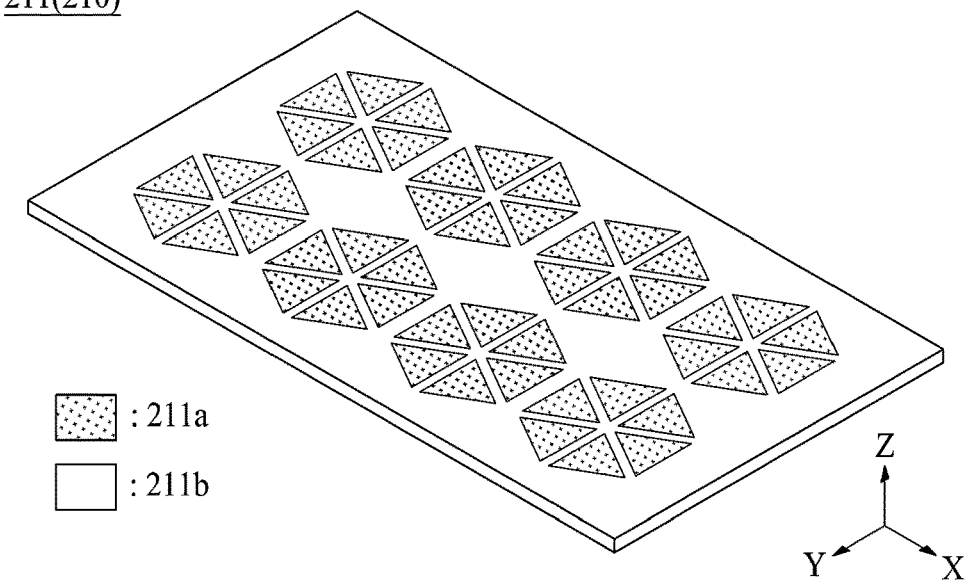

As another example, as illustrated in FIG. 18G, six adjacent first portions 211a among the plurality of first portions 211a may be adjacent to one another to form a hexagonal shape (or a regularly hexagonal shape). Vertices of the six adjacent first portions 211a forming a hexagonal shape may be adjacent to one another in a center portion (or a central portion) of the hexagonal shape. The second portion 211b may be configured to surround each of the plurality of first portions 211a, and thus, may be connected to or attached on a side surface (or a lateral surface) of each of the plurality of first portions 211a. Each of the plurality of first portions 211a and the second portion 211b may be disposed (or arranged) in parallel on the same plane (or the same layer).

With reference to FIGS. 18F and 18G, 2N (where N is a natural number greater than or equal to 2) adjacent first portions 210 among the plurality of first portions 211a having the triangular shape may be disposed adjacent to one another to form a 2N-angular shape.

In FIGS. 18A to 18G, the plurality of first portions 211a according to an embodiment of the present disclosure may each be configured as an inorganic material portion. The inorganic material portion may include a piezoelectric material or an electroactive material. The piezoelectric material or the electroactive material may have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a reverse voltage applied thereto. As described above with reference to FIGS. 16 and 17, a first surface of each of the plurality of first portions 211a may be electrically connected to the first electrode layer 213, and a second surface of each of the plurality of first portions 211a may be electrically connected to the second electrode layer 215.

In FIGS. 18A to 18G, the inorganic material portion included in each of the plurality of first portions 211a may include a ceramic-based material for generating a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "ABO$_3$". In the chemical formula, "A" may include a divalent metal element, and "B" may include a tetravalent metal element. For example, in the chemical formula "ABO$_3$", "A", and "B" may be cations, and "O" may be anions. For example, the chemical formula "ABO$_3$" may include one of lead(II) titanate (PbTiO$_3$), lead zirconate (PbZrO$_3$), lead zirconate titanate(PbZrTiO$_3$), barium titanate (BaTiO$_3$), and strontium titanate (SrTiO$_3$), but embodiments of the present disclosure are not limited thereto.

When the perovskite crystalline structure includes a center ion (for example, lead(II) titanate), a position of a titanium (Ti) ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal (or quadrilateral), orthorhombic, or rhombohedral structure corresponding to an unsymmetric structure, and thus, a piezoelectric effect may be generated. In a tetragonal (or quadrilateral), orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

According to an embodiment of the present disclosure, the inorganic material portion included in each of the plurality of first portions 211a may include one or more materials of lead (Pb), zirconium (Zr), titanium (Ti), zinc (Zn), nickel (Ni), and niobium (Nb), but embodiments of the present disclosure are not limited thereto.

According to another embodiment of the present disclosure, the inorganic material portion included in each of the plurality of first portions 211a may include a lead zirconate titanate (PZT)-based material, including lead (Pb), zirconium (Zr), and titanium (Ti); or may include a lead zirconate nickel niobate (PZNN)-based material, including lead (Pb), zirconium (Zr), nickel (Ni), and niobium (Nb), but embodiments of the present disclosure are not limited thereto. Also, the inorganic material portion may include at least one or more of calcium titanate (CaTiO$_3$), BaTiO$_3$, and SrTiO$_3$, each without Pb, but embodiments of the present disclosure are not limited thereto.

According to another embodiment of the present disclosure, an inorganic material portion included in each of the plurality of first portions 211a may have a piezoelectric deformation coefficient "$d_{33}$" of 1,000 pC/N or more in a thickness direction Z. The inorganic material portion may be applied to a display panel having a large size and may need to have a high piezoelectric deformation coefficient "$d_{33}$", for having a sufficient vibration characteristic or piezoelectric characteristic. For example, the inorganic material portion may include a PZT-based material (for example, PbZrTiO$_3$) as a main component and may include a softner dopant material doped into A site (Pb) and a relaxor ferroelectric material doped into B site (ZrTi).

The softner dopant material may enhance a piezoelectric characteristic and a dielectric characteristic of the inorganic material portion, and for example, may increase the piezoelectric deformation coefficient "$d_{33}$" of the inorganic material portion. When the softner dopant material includes a monovalent element "+1", the inventors have confirmed that a piezoelectric characteristic and a dielectric characteristic are reduced. For example, when the softner dopant material includes kalium (K) and rubidium (Rb), the inventors have confirmed that a piezoelectric characteristic and a dielectric characteristic are reduced. Therefore, by performing various experiments, the inventors have recognized that the softner dopant material should include a dyad element "+2" to a triad element "+3", for enhancing a piezoelectric characteristic and a dielectric characteristic. The softner dopant material according to an embodiment of the present disclosure may include a dyad element "+2" to a triad element "+3". Morphotropic phase boundary (MPB) may be implemented by adding the softner dopant material to the PZT-based material (PbZrTiO$_3$), and thus, a piezoelectric characteristic and a dielectric characteristic may be enhanced. For example, the softner dopant material may include strontium (Sr), barium (Ba), lanthanum (La), neodymium (Nd), calcium (Ca), yttrium (Y), erbium (Er), or ytterbium (Yb). For example, ions (Sr$^{2+}$, Ba$^{2+}$, La$^{2+}$, Nd$^{3+}$, Ca$^{2+}$, Y$^{3+}$, Er$^{3+}$, Yb$^{3+}$) of the softner dopant material doped into the PZT-based material (PbZrTiO$_3$) may substitute a portion of lead (Pb) in the PZT-based material (PbZrTiO$_3$), and a substitution rate thereof may be about 2 mol % to about 20 mol %. For example, when the substitution rate is less than 2 mol % or greater than 20 mol %, a perovskite crystal structure may be broken, and thus, an electromechanical coupling coefficient "kP" and the piezoelectric deformation coefficient "$d_{33}$" may decrease. When the softner dopant material is substituted, the MPB may be formed, and a piezoelectric characteristic and a dielectric characteristic may be high in the MPB, thereby implementing a vibration device having a high piezoelectric characteristic and a high dielectric characteristic.

According to an embodiment of the present disclosure, the relaxor ferroelectric material doped into the PZT-based material (PbZrTiO$_3$) may enhance an electric deformation characteristic of the inorganic material portion. The relaxor ferroelectric material according to an embodiment of the present disclosure may include a lead magnesium niobate (PMN)-based material or a lead nickel niobate (PNN)-based material, but embodiments are not limited thereto. The PMN-based material may include Pb, Mg, and Nb, and for example, may include Pb(Ni, Nb)O$_3$. For example, the relaxor ferroelectric material doped into the PZT-based material (PbZrTiO$_3$) may substitute a portion of each of zirconium (Zr) and titanium (Ti) in the PZT-based material (PbZrTiO$_3$), and a substitution rate thereof may be about 5 mol % to about 25 mol %. For example, when the substitution rate is less than 5 mol % or greater than 25 mol %, a perovskite crystal structure may be broken, and thus, the electromechanical coupling coefficient "kP" and the piezoelectric deformation coefficient "$d_{33}$" may decrease.

According to an embodiment of the present disclosure, the inorganic material portion provided in each of the plurality of first portions 211a may further include a donor material doped into B site (ZrTi) of the PZT-based material (PbZrTiO$_3$), in order to more enhance a piezoelectric coefficient. For example, the donor material doped into the B site (ZrTi) may include a tetrad element "+4" or a hexad element "+6". For example, the donor material doped into the B site (ZrTi) may include tellurium (Te), germanium (Ge), uranium (U), bismuth (Bi), niobium (Nb), tantalum (Ta), antimony (Sb), or tungsten (W).

The inorganic material portion provided in each of the plurality of first portions 211a of the piezoelectric layer 211 according to an embodiment of the present disclosure may be expressed as the following Formula 1.

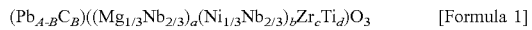

$(Pb_{A-B}C_B)((Mg_{1/3}Nb_{2/3})_a(Ni_{1/3}Nb_{2/3})_bZr_cTi_d)O_3$ [Formula 1]

Here, C may be one of Ca, Sr, and Ba. Also, a+b+c+d=1, 0.02≤B≤0.20, 0.80≤A-B≤0.98, 0.05≤a≤0.25, 0.05≤b≤0.25, 0.10≤c≤0.50, and 0.10≤d≤0.50.

The inorganic material portion provided in each of the plurality of first portions 211a according to an embodiment of the present disclosure may have a piezoelectric deformation coefficient "$d_{33}$" of 1,000 pC/N or more in a thickness direction Z, thereby implementing a vibration device having an enhanced vibration characteristic. For example, a vibration device having an enhanced vibration characteristic may be implemented in a large-area display apparatus.

In FIGS. 18A to 18G, the second portion 211b may be disposed between the plurality of first portions 211a, or may be disposed to surround each of the plurality of first portions 211a. Therefore, in the piezoelectric layer 211 of the vibration structure 210 or the vibration device, vibration energy based on a link in a unit lattice of each first portion 211a may increase by a corresponding second portion 211b. Thus, a vibration may increase, and a piezoelectric characteristic and flexibility may be secured. For example, the second portion 211b may include at least one of an epoxy-based polymer, an acryl-based polymer, and a silicone-based polymer, but embodiments are not limited thereto.

The second portion 211b according to an embodiment of the present disclosure may be configured as an organic material portion. For example, the organic material portion may be disposed between the inorganic material portions and may absorb an impact applied to the inorganic material portion (or the first portion), may release a stress concentrating on the inorganic material portion to enhance the total durability of the piezoelectric layer 211 of the vibration structure 210 or the vibration device, and may provide flexibility to the piezoelectric layer 211 of the vibration structure 210 or the vibration device.

The second portion 211b according to an embodiment of the present disclosure may have modulus and viscoelasticity that are lower than those of each first portion 211a, and thus, the second portion 211b may enhance the reliability of each first portion 211a vulnerable to an impact due to a fragile characteristic. For example, the second portion 211b may each include a material having a loss coefficient (or loss factor) of about 0.01 to about 1.0 and modulus of about 0.1 [GPa] to about 10 [GPa]. Herein, the modulus may be understood as the dynamic modulus, which describes the ratio of stress to strain under vibratory conditions or calculates by dividing tensile stress by tensile strain. Herein, the loss coefficient of a material may be understood as the ratio of dissipated energy to strain energy.

The organic material portion included in the second portion 211b may include one or more of an organic material, an organic polymer, an organic piezoelectric material, and an organic non-piezoelectric material that has a flexible characteristic in comparison with the inorganic material portion of the first portions 211a. For example, the second portion 211b may be referred to as an adhesive portion, an elastic portion, a bending portion, a damping portion, or a flexible portion each having flexibility, but embodiments of the present disclosure are not limited thereto.

Therefore, the plurality of first portions 211a and the second portion 211b may be disposed on (or connected to) the same plane and/or parallel to each other, and thus, the piezoelectric layer 211 of the vibration structure 210 according to various embodiments of the present disclosure may have a single thin film-type. For example, the piezoelectric layer 211 may be vibrated in a vertical direction (or a thickness direction) by the first portion 211a having a vibration characteristic and may be bent in a curved shape by the second portion 211b having flexibility. Also, in the piezoelectric layer 211 of the vibration structure 210 according to various embodiments of the present disclosure, a size of the first portion 211a and a size of the second portion 211b may be adjusted or set based on a piezoelectric characteristic and flexibility needed for the piezoelectric layer 211. Thus, depending on the application and the demands resulting thereof the width ratio of first portion 211a and the second portion 211b may be adjusted. For example, in a case where the piezoelectric layer 211 needs a piezoelectric characteristic rather than flexibility, a size of the first portion 211a may be adjusted to be greater than that of the second portion 211b. As another example, in a case where the piezoelectric layer 211 needs flexibility rather than a piezoelectric characteristic, a size of the second portion 211b may be adjusted to be greater than that of the first portion 211a. For example, the size of the second portion 211b and the size of the first portion 211a may one or more of a width, a length, and a thickness. Accordingly, a size of the piezoelectric layer 211 may be adjusted based on a characteristic needed therefor, and thus, the piezoelectric layer 211 may be easy to design.

Figure 19:
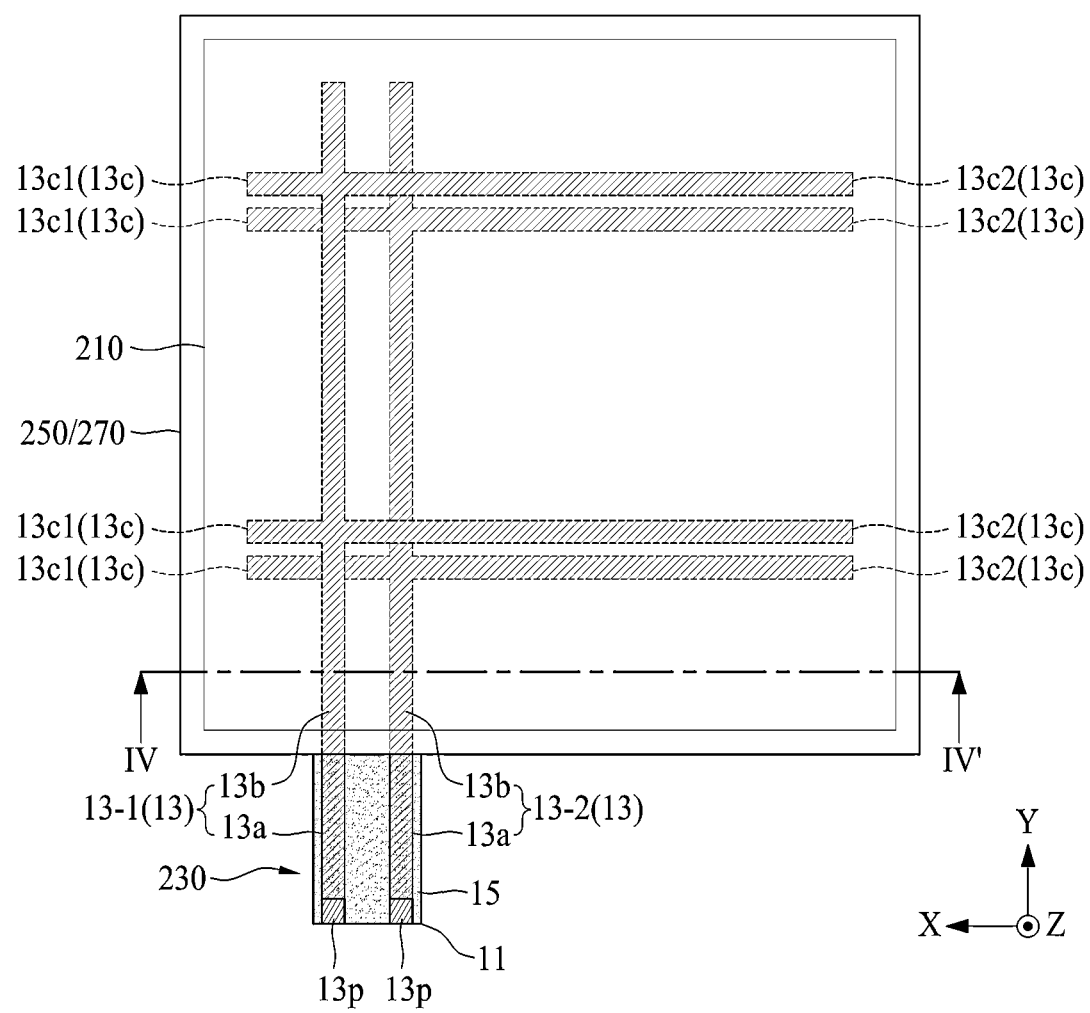
FIG. 19 illustrates a vibration device according to another embodiment of the present disclosure.

FIG. 19 illustrates a vibration device according to another embodiment of the present disclosure and illustrates an embodiment where a vibration structure and a conductive line in the vibration device illustrated in FIG. 15 are modified. Hereinafter, therefore, repetitive descriptions of elements other than a vibration structure, a conductive line, and elements relevant thereto are omitted or will be briefly given. A cross-sectional surface taken along line IV-IV' illustrated in FIG. 19 is illustrated in FIG. 17.

With reference to FIG. 19, in the vibration device according to another embodiment of the present disclosure, except for that a vibration structure 210 is enlarged to have a relatively wide size unlike the vibration structure of FIG. 15, the vibrations structure 210 may be substantially the same as the vibration structure of FIG. 15, and thus, its repetitive description is omitted.

In the vibration device according to another embodiment of the present disclosure, a flexible cable 230 may include a base member 11, a conductor layer 13 including first and second conductive lines 13-1 and 13-2, and a protection layer 15. Except for that the conductor layer 13 includes the first and second conductive lines 13-1 and 13-2, the flexible cable 230 may include substantially the same elements as those of the flexible cable 230 described above with reference to FIGS. 1 to 3, and thus, their repetitive descriptions are omitted.

Each of the first and second conductive lines 13-1 and 13-2 may include a first line 13a which is disposed on the base member 11, a second line 13b which extends to the vibration structure 210 via a side surface of the base member 11 from the first line 13a in a second direction Y, and at least one third line 13c which protrudes from the second line 13b in parallel with a first direction X. Each of the first and second conductive lines 13-1 and 13-2 may include substantially the same elements as those of each of the conductive lines 13-1 to 13-4 described above with reference to FIG. 12, and thus, their repetitive descriptions are omitted.

Each of the second line 13b of the first conductive line 13-1 and the at least one third line 13c may be electrically connected to the first electrode layer 213 of the vibration structure 210. For example, the second line 13b of the first conductive line 13-1 may be bent from one portion (or side) of the vibration structure 210 toward the first electrode layer 213 of the vibration structure 210 and may be electrically connected to one periphery portion (or an edge portion) of the first electrode layer 213 in the second direction Y. The at least one third line 13c of the first conductive line 13-1 may be disposed on the first electrode layer 213 in the first direction X and may be electrically connected to the first electrode layer 213.

Each of the second line 13b of the second conductive line 13-2 and the at least one third line 13c may be electrically connected to the second electrode layer 215 of the vibration structure 210. For example, the second line 13b of the second conductive line 13-2 may be bent from the one portion of the vibration structure 210 toward the second electrode layer 215 of the vibration structure 210 and may be electrically connected to one periphery portion of the second electrode layer 215 in the second direction Y. The at least one third line 13c of the second conductive line 13-2 may be disposed on the second electrode layer 215 in the first direction X and may be electrically connected to the second electrode layer 215.

Therefore, the vibration device according to another embodiment of the present disclosure may have the same effect as that of the vibration device illustrated in FIGS. 15 to 17. For example, the vibration device according another embodiment of the present disclosure may not need a soldering process between the vibration structure 210 and the flexible cable 230 and a patterning process of forming a line and a pad in each of the first and second protection members 250 and 270 based on an integration structure between the vibration structure 210 and the flexible cable 230, and thus, a structure of the vibration device and a process of manufacturing the vibration device may be simplified. Also, in the vibration device according another embodiment of the present disclosure, because a line and a pad are not disposed in each of the first and second protection members 250 and 270, it is not required to place a conductive sheet (or a conductive film) between each of the first and second protection members 250 and 270 and the vibration structure 210, and thus, because the conductive sheet is omitted, a vibration device having a thin thickness may be implemented. Also, in the vibration device according another embodiment of the present disclosure, a driving power may be directly supplied to the vibration structure 210 through the flexible cable 230, and thus, an electrical characteristic of each of the first and second electrode layers 213 and 215 disposed in the vibration structure 210 may be complemented. In the vibration device according another embodiment of the present disclosure, a uniform driving power may be supplied to the vibration structure 210 by the third line 13c of each of the first and second conductive lines 13-1 and 13-2, and thus, a uniform vibration characteristic may be realized in a whole region of the vibration structure 210.

Figure 20:
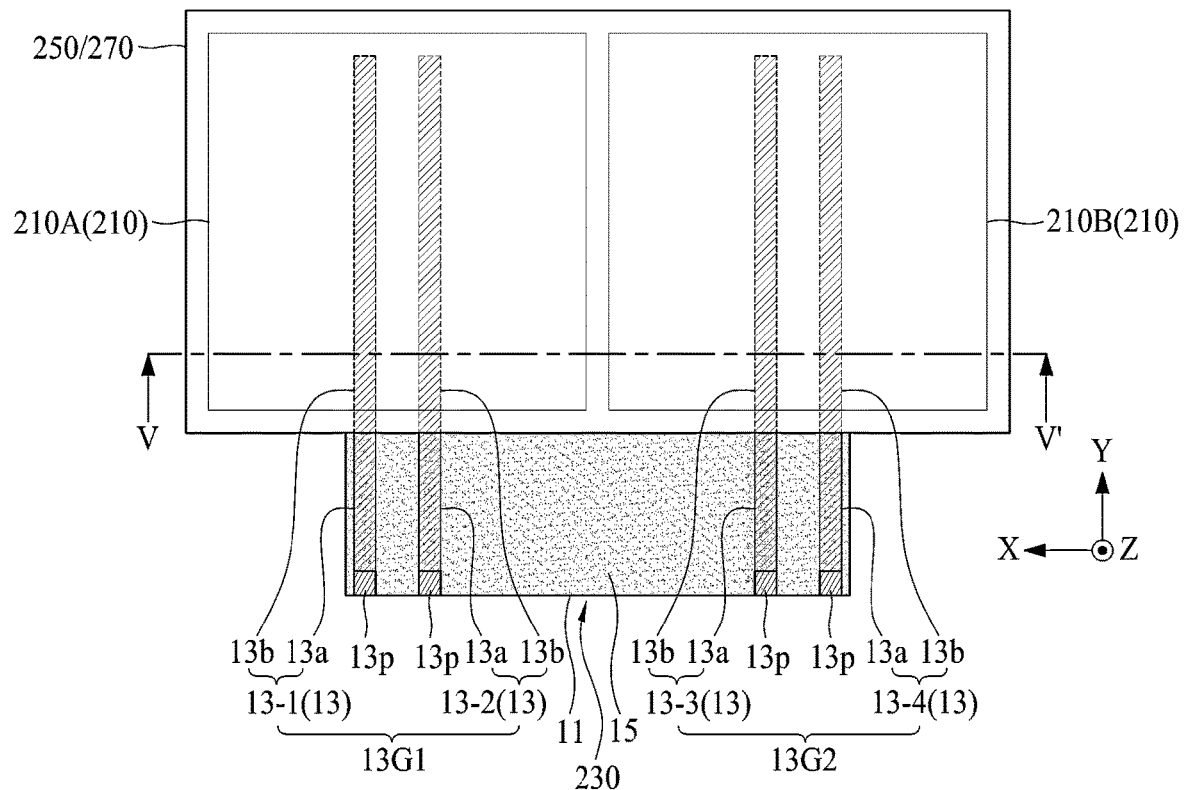
FIG. 20 illustrates a vibration device according to another embodiment of the present disclosure.
Figure 21:
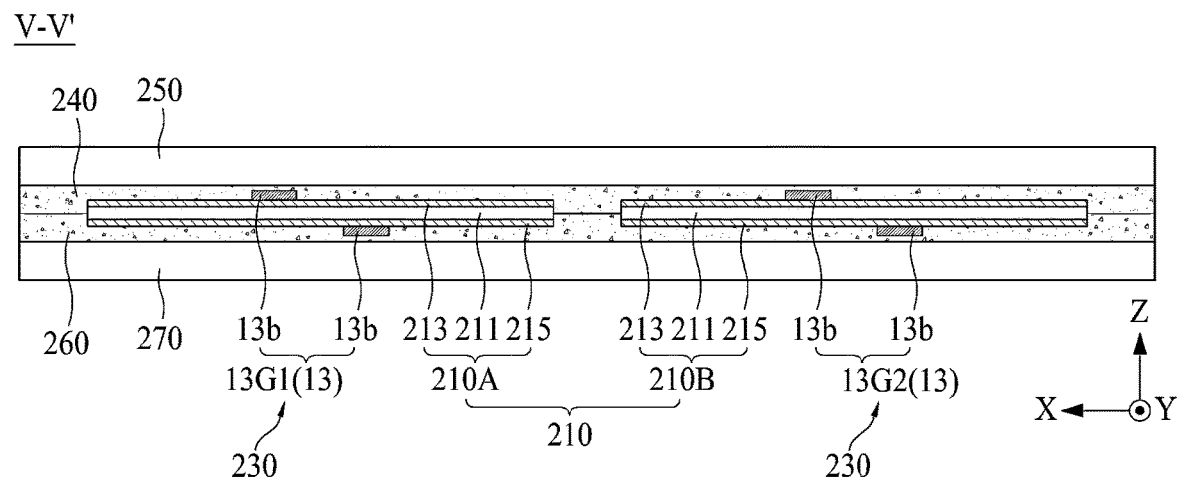
FIG. 21 is a cross-sectional view taken along line V-V' illustrated in FIG. 20.

FIG. 20 illustrates a vibration device according to another embodiment of the present disclosure, FIG. 21 is a cross-sectional view taken along line V-V' illustrated in FIG. 20. FIGS. 20 and 21 illustrate a vibration device with the flexible cable of FIG. 7 integrated thereinto.

With reference to FIGS. 20 and 21, the vibration device according to another embodiment of the present disclosure may include a vibration structure 210 and a flexible cable 230.

The vibration structure 210 may include a first vibration module 210A and a second vibration module 210B, which are spaced apart from each other and are electrically disconnected (or separated or isolated) from each other.

According to an embodiment of the present disclosure, the first vibration module 210A and the second vibration module 210B may be disposed between a first protection member 250 and a second protection member 270 so as to be spaced apart from each other in a first direction X. For example, each of the first protection member 250 and the second protection member 270 may be connected to the first and second vibration modules 210A and 210B in common or may support the first and second vibration modules 210A and 210B in common, and thus, may drive the first and second vibration modules 210A and 210B as one vibration device (or a single vibration device). For example, the first and second vibration modules 210A and 210B may be tiled (or integrated) at a certain interval in the first and second protection members 250 and 270, and thus, may be implemented as one complete vibration device (or a single vibration device) which is not independently driven and is driven as one complete single body type. According to an embodiment of the present disclosure, the first and second vibration modules 210A and 210B may be arranged or tiled to have the separation distances (or intervals) of 0.1 mm or more and less than 3 cm, and thus, may be driven as one complete vibration device, thereby increasing a reproduction band and a sound pressure level characteristic of a sound which is generated based on a complete single body vibration of the first and second vibration modules 210A and 210B. For example, in order to increase a reproduction band of a sound generated based on a complete single body vibration of the first and second vibration modules 210A and 210B and to increase a sound of a low-pitched sound band (for example, a sound pressure level characteristic in 500 Hz or less), the first and second vibration modules 210A and 210B may be arranged on the same plane (or the same layer) to have an interval of 0.1 mm or more and less than 5 mm, but embodiments are not limited thereto.

According to an embodiment of the present disclosure, in a case where the first and second vibration modules 210A and 210B are arranged at the intervals of less than 0.1 mm or without the intervals, the reliability of the vibration modules 210A and 210B or the vibration structure 210 may be reduced due to damage or a crack caused by a physical contact therebetween which occurs when each of the vibration modules 210A and 210B vibrates.

According to an embodiment of the present disclosure, in a case where the first and second vibration modules 210A and 210B are arranged at the intervals of 3 cm or more, the first and second vibration modules 210A and 210B may not be driven as one complete vibration device due to an independent vibration of each of the first and second vibration modules 210A and 210B. Therefore, a reproduction band and a sound pressure level characteristic of a sound which is generated based on vibration of the first and second vibration modules 210A and 210B may be reduced. For example, in a case where the first and second vibration modules 210A and 210B are arranged at the intervals of 3 cm or more, a sound characteristic and a sound pressure level characteristic of the low-pitched sound band (for example, in 500 Hz or less) may each be reduced.

According to an embodiment of the present disclosure, in a case where the first and second vibration modules 210A and 210B are arranged at an interval of 5 mm, each of the first and second vibration modules 210A and 210B may not be driven as one complete vibration device, and thus, a sound characteristic and a sound pressure level characteristic of the low-pitched sound band (for example, in 200 Hz or less) may each be reduced.

According to another embodiment of the present disclosure, in a case where the first and second vibration modules 210A and 210B are arranged at an interval of 1 mm, each of the first and second vibration modules 210A and 210B may be driven as one complete vibration device, and thus, a reproduction band of a sound may increase and a sound of the low-pitched sound band (for example, a sound pressure level characteristic in 500 Hz or less) may increase. For example, in a case where the first and second vibration modules 210A and 210B are arranged at an interval of 1 mm, the vibration structure 210 may be implemented as a large-area vibrator which is enlarged based on optimization of a separation distance between the first and second vibration modules 210A and 210B. Therefore, the vibration structure 210 may be driven as a large-area vibrator based on a complete single body vibration of the first and second vibration modules 210A and 210B, and thus, a sound characteristic and a sound pressure level characteristic may each increase in the low-pitched sound band and a reproduction band of a sound generated based on a large-area vibration of the vibration structure 210.

Therefore, in order to implement a complete single body vibration (or one vibration device) of the first and second vibration modules 210A and 210B, a separation distance between the first and second vibration modules 210A and 210B may be adjusted to 0.1 mm or more and less than 3 cm. Also, in order to implement a complete single body vibration (or one vibration device) of the first and second vibration modules 210A and 210B and to increase a sound pressure level characteristic of a sound of the low-pitched sound band, the separation distance between the first and second vibration modules 210A and 210B may be adjusted to 0.1 mm or more and less than 5 mm.

Each of the first and second vibration modules 210A and 210B may include a piezoelectric layer 211, a first electrode layer 213, and a second electrode layer 215. The piezoelectric layer 211, the first electrode layer 213, and the second electrode layer 215 of each of the first and second vibration modules 210A and 210B may be substantially the same as a piezoelectric layer 211, a first electrode layer 213, and a second electrode layer 215 of the vibration structure 210 described above with reference to FIGS. 15 to 18G, and thus, like reference numerals refer to like elements and their repetitive descriptions are omitted.

According to an embodiment of the present disclosure, the piezoelectric layer 211 of the first vibration modules 210A may be configured the same as any one of the piezoelectric layer 211 described above with reference to FIGS. 18A to 18G. The piezoelectric layer 211 of the second vibration modules 210B may be configured the same as any one of the piezoelectric layer 211 described above with reference to FIGS. 18A to 18G. In addition, the piezoelectric layer 211 of the first vibration modules 210A and the piezoelectric layer 211 of the second vibration modules 210B may be configured the same piezoelectric layers or different piezoelectric layers among the piezoelectric layers 211 described above with reference to FIGS. 18A to 18G.

The flexible cable 230 may include a base member 11, a conductor layer 13 including first to fourth conductive lines 13-1 to 13-4, and a protection layer 15, and the first to fourth conductive lines 13-1 to 13-4 may be grouped into a first electrode group 13G1 and a second electrode group 13G2. This may be substantially the same as the flexible cable described above with reference to FIG. 7, and thus, its repetitive description is omitted.

In the flexible cable 230, a second line 13b of each of the first and second conductive lines 13-1 and 13-2 included in the first electrode group 13G1 may be electrically connected to the first vibration module 210A. A second line 13b of each of the third and fourth conductive lines 13-3 and 13-4 included in the second electrode group 13G2 may be electrically connected to the second vibration module 210B.

According to an embodiment of the present disclosure, in the first electrode group 13G1, the second line 13b of the first conductive line 13-1 may be bent from one portion (or side) of the first vibration module 210A toward a first electrode layer 213 of the first vibration module 210A and may be electrically connected to the first electrode layer 213 of the first vibration module 210A in the second direction Y. In the first electrode group 13G1, the second line 13b of the second conductive line 13-2 may be bent from one portion (or side) of the first vibration module 210A toward a second electrode layer 215 of the first vibration module 210A and may be electrically connected to the second electrode layer 215 of the first vibration module 210A in the second direction Y.

According to an embodiment of the present disclosure, in the second electrode group 13G2, the second line 13b of the third conductive line 13-3 may be bent from one portion (or side) of the second vibration module 210B toward a first electrode layer 213 of the second vibration module 210B and may be electrically connected to the first electrode layer 213 of the second vibration module 210B in the second direction Y. In the second electrode group 13G2, the second line 13b of the fourth conductive line 13-4 may be bent from one portion (or side) of the second vibration module 210B toward a second electrode layer 215 of the second vibration module 210B and may be electrically connected to the second electrode layer 215 of the second vibration module 210B in the second direction Y.

Alternatively, according to another embodiment of the present disclosure, in the first electrode group 13G1, the second line 13b of the first conductive line 13-1 may be bent from one portion (or side) of the first vibration module 210A toward a second electrode layer 213 of the first vibration module 210A and may be electrically connected to the second electrode layer 215 of the first vibration module 210A in the second direction Y. The second line 13b of the second conductive line 13-2 may be bent from one portion (or side) of the first vibration module 210A toward a first electrode layer 213 of the first vibration module 210A and may be electrically connected to the first electrode layer 213 of the first vibration module 210A in the second direction Y. In the second electrode group 13G2, the second line 13b of the third conductive line 13-3 may be bent from one portion (or side) of the second vibration module 210B toward a second electrode layer 215 of the second vibration module 210B and may be electrically connected to the second electrode layer 215 of the second vibration module 210B in the second direction Y. The second line 13b of the fourth conductive line 13-4 may be bent from one portion (or side) of the second vibration module 210B toward a first electrode layer 213 of the second vibration module 210B and may be electrically connected to the first electrode layer 213 of the second vibration module 210B in the second direction Y.

Therefore, the vibration device according to another embodiment of the present disclosure may have the same effect as that of the vibration device illustrated in FIGS. 15 to 17. For example, the vibration device according another embodiment of the present disclosure may not need a soldering process between the vibration structure 210 and the flexible cable 230 and a patterning process of forming a line and a pad in each of the first and second protection members 250 and 270 based on an integration structure between the vibration structure 210 and the flexible cable 230, and thus, a structure of the vibration device and a process of manufacturing the vibration device may be simplified. Also, in the vibration device according another embodiment of the present disclosure, because a line and a pad are not disposed in each of the first and second protection members 250 and 270, it is not required to place a conductive sheet (or a conductive film) between each of the first and second protection members 250 and 270 and the vibration structure 210, and thus, because the conductive sheet is omitted, a vibration device having a thin thickness may be implemented. Also, in the vibration device according another embodiment of the present disclosure, a driving power may be directly supplied to the vibration structure 210 through the flexible cable 230, and thus, an electrical characteristic of each of the first and second electrode layers 213 and 215 disposed in the vibration structure 210 may be complemented. In the vibration device according another embodiment of the present disclosure, two vibration modules 210A and 210B may be simultaneously or individually driven with a driving power supplied through one flexible cable 230, and thus, an electrical connection structure between the vibration structure 210 and the flexible cable 230 for driving the two vibration modules 210A and 210B may be simplified.

Alternatively, in the vibration device described above with reference to FIGS. 20 and 21, the flexible cable 230 may be replaced by the flexible cable described above with reference to FIG. 9 or the flexible cable described above with reference to FIG. 13. For example, a vibration device with the flexible cable of FIG. 9 integrated thereinto may be enhanced in adhesive characteristic between the vibration structure 210 and the first and second protection members 250 and 270 by the plurality of straps 13s and the supporter 17 described above with reference to FIG. 9, and a defect caused by the disconnection of a conductive line occurring in a manufacturing process may be minimized or prevented by the plurality of straps 13s. For example, in a vibration device with the flexible cable of FIG. 13 integrated thereinto, the second line 13b of the conductive line may be supported by the line supporting portion 19 described above with reference to FIG. 13, and thus, an adhesive characteristic between the vibration structure 210 and the first and second protection members 250 and 270 may be enhanced and the reliability of the flexible cable may be enhanced.

Figure 22:
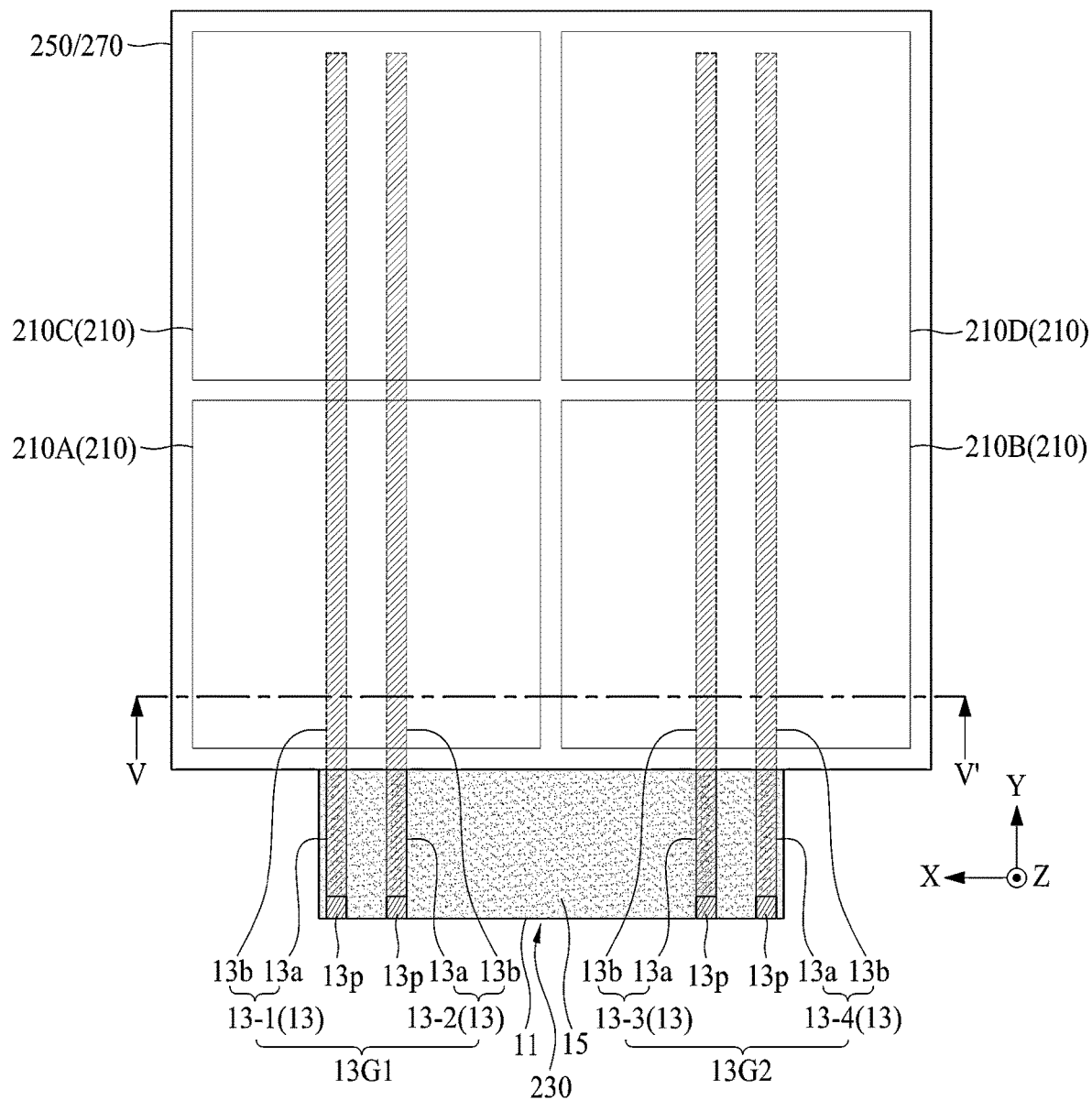
FIG. 22 illustrates a vibration device according to another embodiment of the present disclosure.

FIG. 22 illustrates a vibration device according to another embodiment of the present disclosure and illustrates an embodiment where a vibration structure in the vibration device illustrated in FIGS. 20 and 21 are modified. Hereinafter, therefore, repetitive descriptions of elements other than a vibration structure and elements relevant thereto are omitted or will be briefly given. A cross-sectional surface taken along line V-V' illustrated in FIG. 22 is illustrated in FIG. 21.

With reference to FIG. 22 in conjunction with FIG. 21, in vibration device according to another embodiment of the present disclosure, the vibration structure 210 may include first to fourth vibration modules 210A to 210D which are electrically disconnected (or isolated) from one another and are disposed apart from one another in each of the first direction X and the second direction Y. For example, the first to fourth vibration modules 210A to 210D may be arranged or tiled in 2×2 form.

The vibration structure 210 may include the first to fourth vibration modules 210A to 210D which are arranged or tiled at a certain interval, and thus, the vibration structure 210 may be referred to as, for example, a vibration array structure, a vibration array portion, a tiling vibration structure, a vibration module array portion, a tiling vibration array, a tiling vibration module, or a tiling vibration film.

The first and second vibration modules 210A and 210B may be spaced apart from each other in the first direction X. The third and fourth vibration modules 210C and 210D may be spaced apart from each other in the first direction X and may be spaced apart from each of the first and second vibration modules 210A and 210B in the second direction Y. The first and third vibration modules 210A and 210C may be spaced apart from each other in the second direction Y to face each other. The second and fourth vibration modules 210B and 210D may be spaced apart from each other in the second direction Y to face each other.

The first to fourth vibration modules 210A to 210D may be disposed between a first protection member 250 and a second protection member 270. For example, each of the first protection member 250 and the second protection member 270 may be connected to the first to fourth vibration modules 210A to 210D in common or may support the first to fourth vibration modules 210A to 210D in common, and thus, may drive the first to fourth vibration modules 210A to 210D as one vibration device (or a single vibration device). For example, the first to fourth vibration modules 210A to 210D may be tiled (or integrated) at a certain interval in the first and second protection members 250 and 270, and thus, may be driven as one complete vibration device (or a single vibration device).

According to an embodiment of the present disclosure, the first to fourth vibration modules 210A to 210D may be arranged (or tiled) at the intervals of 0.1 mm or more and less than 3 cm or may be arranged (or tiled) at 0.1 mm or more and less than 5 mm in each of the first direction X and the second direction Y, so that the first to fourth vibration modules 210A to 210D are driven as one complete vibration device or are for a complete single body vibration or a vibration of a large-area vibrator of the vibration structure 210.

Each of the first to fourth vibration modules 210A to 210D may include a piezoelectric layer 211, a first electrode layer 213, and a second electrode layer 215. The piezoelectric layer 211, the first electrode layer 213, and the second electrode layer 215 of each of the first to fourth vibration modules 210A to 210D may be substantially the same as a piezoelectric layer 211, a first electrode layer 213, and a second electrode layer 215 of the vibration structure 210 described above with reference to FIGS. 15 to 18G, and thus, like reference numerals refer to like elements and their repetitive descriptions are omitted.

According to an embodiment of the present disclosure, each of the first to fourth vibration modules 210A to 210D may include one or more of the piezoelectric layers 211 described above with reference to FIGS. 18A to 18G, or may include different piezoelectric layers 211.

According to an embodiment of the present disclosure, some and the other vibration structures of the first to fourth vibration modules 210A to 210D may include different piezoelectric layers 211 among the piezoelectric layers 211 described above with reference to FIGS. 18A to 18G.

The flexible cable 230 may include a base member 11, a conductor layer 13 including first to fourth conductive lines 13-1 to 13-4, and a protection layer 15, and the first to fourth conductive lines 13-1 to 13-4 may be grouped into a first electrode group 13G1 and a second electrode group 13G2. This may be substantially the same as the flexible cable described above with reference to FIG. 7, and thus, its repetitive description is omitted.

In the flexible cable 230, a second line 13b of each of the first and second conductive lines 13-1 and 13-2 included in the first electrode group 13G1 may be electrically (or commonly) connected to each of the first and third vibration modules 210A and 210C. A second line 13b of each of the third and fourth conductive lines 13-3 and 13-4 included in the second electrode group 13G2 may be electrically (or commonly) connected to each of the second and fourth vibration modules 210B and 210D.

According to an embodiment of the present disclosure, in the first electrode group 13G1, the second line 13b of the first conductive line 13-1 may be bent from one portion (or side) of the first vibration module 210A toward a first electrode layer 213 of each of the first and third vibration modules 210A and 210C and may be electrically connected to the first electrode layer 213 of each of the first and third vibration modules 210A and 210C in the second direction Y. The second line 13b of the second conductive line 13-2 may be bent from one portion (or side) of the first vibration module 210A toward a second electrode layer 215 of each of the first and third vibration modules 210A and 210C and may be electrically connected to the second electrode layer 215 of each of the first and third vibration modules 210A and 210C in the second direction Y.

According to an embodiment of the present disclosure, in the second electrode group 13G2, the second line 13b of the third conductive line 13-3 may be bent from one portion (or side) of the second vibration module 210B toward a first electrode layer 213 of each of the second and fourth vibration modules 210B and 210D and may be electrically connected to the first electrode layer 213 of each of the second and fourth vibration modules 210B and 210D in the second direction Y. The second line 13b of the fourth conductive line 13-4 may be bent from one portion (or side) of the second vibration module 210B toward a second electrode layer 215 of each of the second and fourth vibration modules 210B and 210D and may be electrically connected to the second electrode layer 215 of each of the second and fourth vibration modules 210B and 210D in the second direction Y.

Alternatively, according to another embodiment of the present disclosure, in the first electrode group 13G1, the second line 13b of the first conductive line 13-1 may be bent from one portion (or side) of the first vibration module 210A toward a second electrode layer 215 of each of the first and third vibration modules 210A and 210C and may be electrically connected to the second electrode layer 215 of each of the first and third vibration modules 210A and 210C in the second direction Y. The second line 13b of the second conductive line 13-2 may be bent from one portion (or side) of the first vibration module 210A toward a first electrode layer 213 of each of the first and third vibration modules 210A and 210C and may be electrically connected to the first electrode layer 213 of each of the first and third vibration modules 210A and 210C in the second direction Y. In the second electrode group 13G2, the second line 13b of the third conductive line 13-3 may be bent from one portion (or side) of the second vibration module 210B toward a second electrode layer 215 of each of the second and fourth vibration modules 210B and 210D and may be electrically connected to the second electrode layer 215 of each of the second and fourth vibration modules 210B and 210D in the second direction Y. The second line 13b of the fourth conductive line 13-4 may be bent from one portion (or side) of the second vibration module 210B toward a first electrode layer 213 of each of the second and fourth vibration modules 210B and 210D and may be electrically connected to the first electrode layer 213 of the second vibration module 210B in the second direction Y.

Therefore, the vibration device according to another embodiment of the present disclosure may have the same effect as that of the vibration device illustrated in FIG. 20. Also, in the vibration device according to another embodiment of the present disclosure, four vibration modules 210A to 210D may be simultaneously driven with a driving power supplied through one flexible cable 230, and thus, an electrical connection structure between the vibration structure 210 and the flexible cable 230 for driving the four vibration modules 210A to 210D may be simplified.

Alternatively, in the vibration device described above with reference to FIGS. 21 and 22, the flexible cable 230 may be replaced by the flexible cable described above with reference to FIG. 9 or the flexible cable described above with reference to FIG. 13. For example, a vibration device with the flexible cable of FIG. 9 integrated thereinto may be enhanced in adhesive characteristic between the vibration structure 210 and the first and second protection members 250 and 270 by the plurality of straps 13s and the supporter 17 described above with reference to FIG. 9, and a defect caused by the disconnection of a conductive line occurring in a manufacturing process may be minimized or prevented by the plurality of straps 13s. For example, in a vibration device with the flexible cable of FIG. 13 integrated thereinto, the second line 13b of the conductive line may be supported by the line supporting portion 19 described above with reference to FIG. 13, and thus, an adhesive characteristic between the vibration structure 210 and the first and second protection members 250 and 270 may be enhanced and the reliability of the flexible cable may be enhanced.

Figure 23:
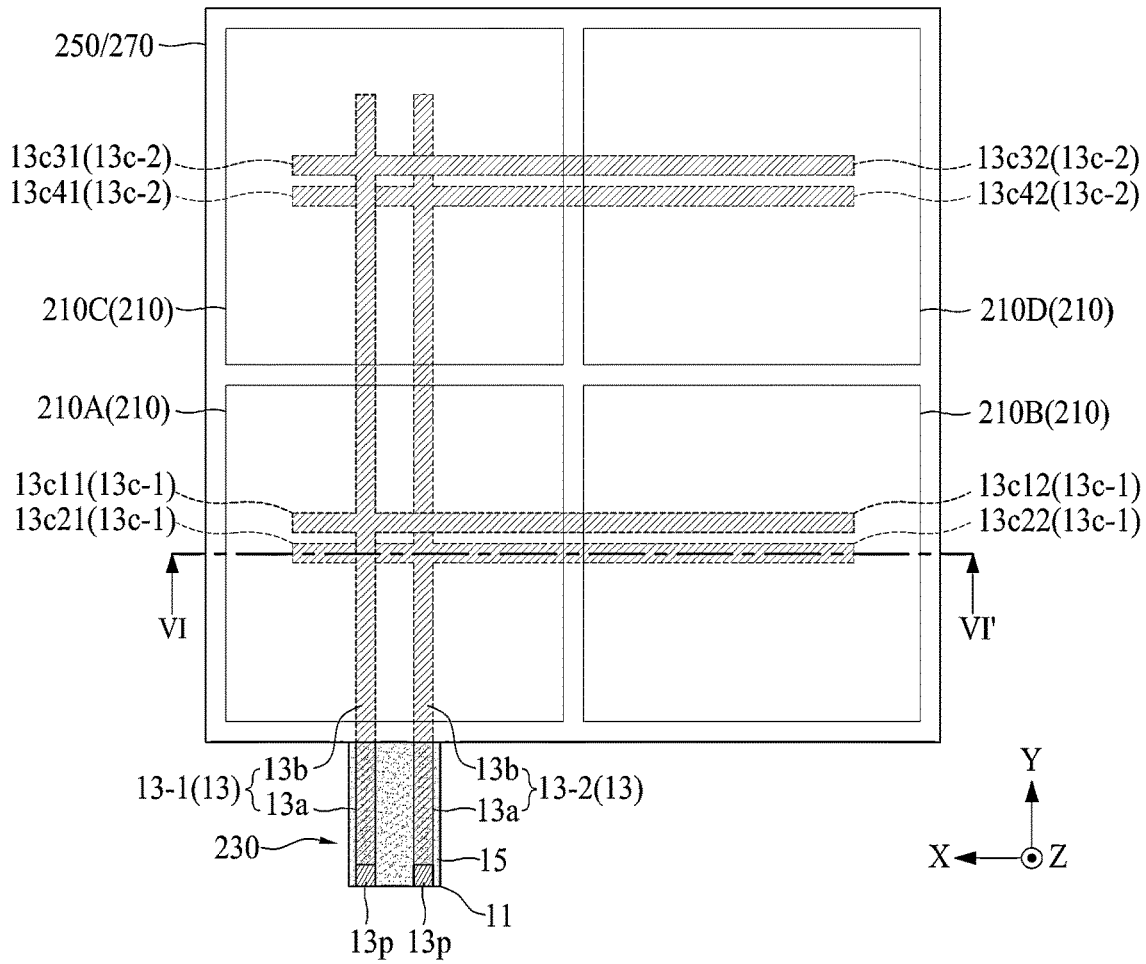
FIG. 23 illustrates a vibration device according to another embodiment of the present disclosure.
Figure 24:
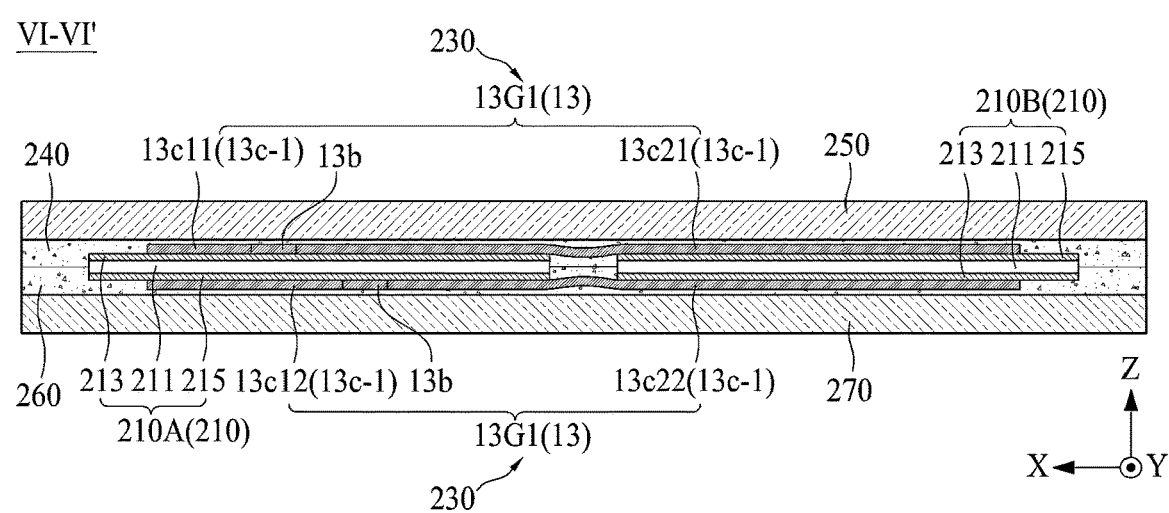
FIG. 24 is a cross-sectional view taken along line VI-VI' illustrated in FIG. 23.

FIG. 23 illustrates a vibration device according to another embodiment of the present disclosure. FIG. 24 is a cross-sectional view taken along line VI-VI' illustrated in FIG. 23. This is an embodiment which is configured by replacing the flexible cable of the vibration device of FIG. 22 with the flexible cable illustrated in FIG. 12.

With reference to FIGS. 23 and 24, in the vibration device according to another embodiment of the present disclosure, a vibration structure 210 may include first to fourth vibration modules 210A to 210D which are spaced apart from one another and are electrically disconnected (or isolated) from one another in a first direction X and a second direction Y. The vibration structure 210 may be substantially the same as the vibration structure 210 described above with reference to FIG. 22, and thus, its repetitive description is omitted.

In the vibration device according to another embodiment of the present disclosure, a flexible cable 230 may include a base member 11, a conductor layer 13 including first and second conductive lines 13-1 and 13-2, and a protection layer 15. Each of the first and second conductive lines 13-1 and 13-2 may include a first line 13a which is disposed on the base member 11, a second line 13b which extends to the vibration structure 210 via a side surface 11s of the base member 11 from the first line 13a in the second direction Y, and a 3-1$^{th}$ line portion 13c-1 and a 3-2$^{th}$ line portion 13c-2 which protrude from the second line 13b in parallel with the first direction X. In the flexible cable 230, elements other than the 3-1$^{th}$ line portion 13c-1 and the 3-2$^{th}$ line portion 13c-2 may be substantially the same as the first and second conductive lines 13-1 to 13-2 described above with reference to FIG. 12, and thus, their repetitive descriptions are omitted.

In the flexible cable 230 according to another embodiment of the present disclosure, the second line 13b of each of the first and second conductive lines 13-1 and 13-2 may be electrically (or commonly) connected to each of the first and third vibration modules 210A and 210C arranged (or tiled) in the vibration structure 210.

According to an embodiment of the present disclosure, the second lines 13b (or a first finger line) of the first conductive lines 13-1 may be bent from one portion (or side) of the first vibration module 210A toward a first electrode layer 213 of each of the first and third vibration modules 210A and 210C and may be electrically connected to the first electrode layer 213 of each of the first and third vibration modules 210A and 210C in the second direction Y. The second line 13b (or a second finger line) of the second conductive line 13-2 may be bent from one portion of the first vibration module 210A toward a second electrode layer 215 of each of the first and third vibration modules 210A and 210C and may be electrically connected to the second electrode layer 215 of each of the first and third vibration modules 210A and 210C in the second direction Y.

According to another embodiment of the present disclosure, the second line 13b (or a first finger line) of the first conductive line 13-1 may be bent from one portion (or side) of the first vibration module 210A toward a second electrode layer 215 of each of the first and third vibration modules 210A and 210C and may be electrically connected to the second electrode layer 215 of each of the first and third vibration modules 210A and 210C in the second direction Y. The second line 13b (or a second finger line) of the second conductive line 13-2 may be bent from one portion (or side) of the first vibration module 210A toward a first electrode layer 213 of each of the first and third vibration modules 210A and 210C and may be electrically connected to the first electrode layer 213 of each of the first and third vibration modules 210A and 210C in the second direction Y.

According to an embodiment of the present disclosure, the 3-1$^{th}$ line portion 13c-1 may extend in the first direction X from each of the second line 13b (or the first finger line) of the first conductive line 13-1 and the second line 13b (or the second finger line) of the second conductive line 13-2 and may be electrically connected to the first and second vibration modules 210A and 210B.

The 3-1$^{th}$ line portion 13c-1 according to an embodiment of the present disclosure may include at least one 1-1$^{th}$ wing line 13c11, which extends in the first direction X from one sidewall of a second line 13b (or a first finger line) of the first conductive line 13-1 and is electrically connected to the first vibration module 210A, and at least one 1-2$^{th}$ wing line 13c12 which extends in the first direction X from the other sidewall of the second line 13b of the first conductive line 13-1 and is electrically connected to each of the first and second vibration modules 210A and 210B. The 3-1$^{th}$ line portion 13c-1 may include at least one 2-1$^{th}$ wing line 13c21, which extends in the first direction X from one sidewall of a second line 13b (or a second finger line) of the second conductive line 13-2 and is electrically connected to the first vibration module 210A, and at least one 2-2$^{th}$ wing line 13c22 which extends in the first direction X from the other sidewall of the second line 13b of the second conductive line 13-2 and is electrically connected to each of the first and second vibration modules 210A and 210B.

According to an embodiment of the present disclosure, when the second line 13b of the first conductive line 13-1 is electrically connected to the first electrode layer 213 of the first vibration module 210A and the second line 13b of the second conductive line 13-2 is electrically connected to the second electrode layer 215 of the first vibration module 210A, the at least one 1-1$^{th}$ wing line 13c11 may be electrically connected to the first electrode layer 213 of the first vibration module 210A, and the at least one 1-2$^{th}$ wing line 13c12 may be electrically connected to the first electrode layer 213 of each of the first and second vibration modules 210A and 210B. The at least one 2-1$^{th}$ wing line 13c21 may be electrically connected to the second electrode layer 215 of the first vibration module 210A, and the at least one 2-2$^{th}$ wing line 13c22 may be electrically connected to the second electrode layer 215 of each of the first and second vibration modules 210A and 210B.

According to an embodiment of the present disclosure, the 3-2$^{th}$ line portion 13c-2 may extend in the first direction X from the second line 13b (or the first finger line) of the first conductive line 13-1 and the second line 13b (or the second finger line) of the second conductive line 13-2 and may be electrically connected to the third and fourth vibration modules 210C and 210D.

The 3-2$^{th}$ line portion 13c-2 according to an embodiment of the present disclosure may include at least one 3-1$^{th}$ wing line 13c31, which extends in the first direction X from the one sidewall of the second line 13b (or the first finger line) of the first conductive line 13-1 and is electrically connected to the third vibration module 210C, and at least one 3-2$^{th}$ wing line 13c32 which extends in the first direction X from the other sidewall of the second line 13b of the first conductive line 13-1 and is electrically connected to each of the third and fourth vibration modules 210C and 210D. The 3-2$^{th}$ line portion 13c-2 may include at least one 4-1$^{th}$ wing line 13c41, which extends in the first direction X from the one sidewall of the second line 13b (or the second finger line) of the second conductive line 13-2 and is electrically connected to the second vibration module 210B, and at least one 4-2$^{th}$ wing line 13c42 which extends in the first direction X from the other sidewall of the second line 13b of the second conductive line 13-2 and is electrically connected to each of the third and fourth vibration modules 210C and 210D.

According to an embodiment of the present disclosure, when the second line 13b of the first conductive line 13-1 is electrically connected to the first electrode layer 213 of the third vibration module 210C and the second line 13b of the second conductive line 13-2 is electrically connected to the second electrode layer 215 of the third vibration module 210C, the at least one 3-1$^{th}$ wing line 13c31 may be electrically connected to the first electrode layer 213 of the third vibration module 210C, and the at least one 3-2$^{th}$ wing line 13c32 may be electrically connected to the first electrode layer 213 of each of the third and fourth vibration modules 210C and 210D. The at least one 4-1$^{th}$ wing line 13c41 may be electrically connected to the second electrode layer 215 of the third vibration module 210C, and the at least one 4-2th wing line 13c42 may be electrically connected to the second electrode layer 215 of each of the third and fourth vibration modules 210C and 210D.

Therefore, in the vibration device according to another embodiment of the present disclosure, four vibration modules 210A to 210D may be simultaneously driven with a driving power which is supplied through the second line 13b and the 3-1$^{th}$ and 3-2$^{th}$ line portions 13c-1 and 13c-2 of each of the first and second conductive lines 13-1 and 13-2 disposed in one flexible cable 230. Accordingly, an electrical connection structure between the vibration structure 210 and the flexible cable 230 for driving the four vibration modules 210A to 210D may be simplified. Also, in the vibration device according to another embodiment of the present disclosure, the number of terminals disposed in one flexible cable 230 for driving the four vibration modules 210A to 210D may be reduced.

As another example of the present disclosure, in the vibration device described above with reference to FIGS. 23 and 24, the flexible cable 230 may further include the line supporting portion 19 of the flexible cable described above with reference to FIG. 13. Therefore, in the vibration device according to another embodiment of the present disclosure, each of the second line 13b and the 3-1$^{th}$ and 3-2$^{th}$ line portions 13c-1 and 13c-2 of each of the first and second conductive lines 13-1 and 13-2 may be supported by the line supporting portion 19 described above with reference to FIG. 13, and thus, an adhesive characteristic between the vibration structure 210 and the first and second protection members 250 and 270 may be enhanced and the reliability of the flexible cable may be enhanced.

Figure 25:
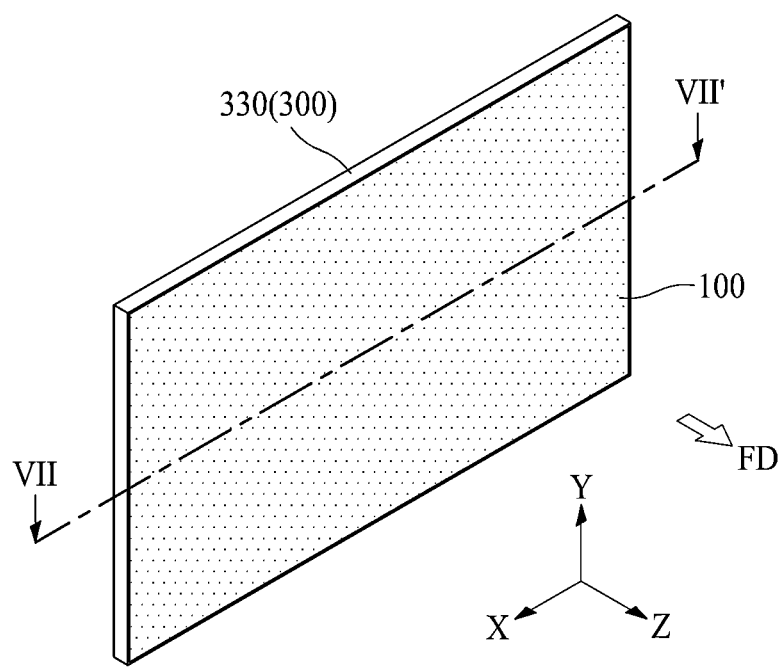
FIG. 25 illustrates a display apparatus according to an embodiment of the present disclosure.
Figure 26:
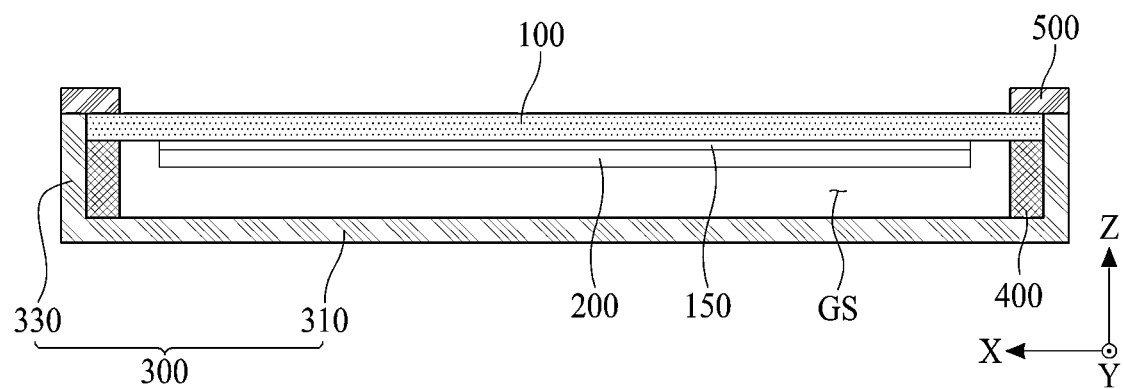
FIG. 26 is a cross-sectional view taken along line VII-VII' illustrated in FIG. 25.

FIG. 25 illustrates a display apparatus according to an embodiment of the present disclosure, FIG. 26 is a cross-sectional view taken along line VII-VII' illustrated in FIG. 25.

With reference to FIGS. 25 and 26, a display apparatus according to an embodiment of the present disclosure may include a display panel 100 and a vibration device 200 on a rear surface of the display panel 100. A "rear surface" may denote a surface of the display panel 100 opposite to a front surface of the display panel 100 including the display area for displaying an image.

The display panel 100 may display an electronic image or a digital image. For example, the display panel 100 may be configured to output light to display an image.

According an embodiment of the present disclosure, the display panel 100 may be a curved display panel, or may be any type of display panel, such as a liquid crystal display panel, an organic light-emitting display panel, a quantum dot light-emitting display panel, a micro light-emitting diode display panel, an electrophoresis display panel, and an electro-wetting display panel. According another embodiment of the present disclosure, the display panel 100 may a flexible display panel. For example, the display panel 100 may a flexible liquid crystal display panel, a flexible organic light-emitting display panel, a flexible quantum dot light-emitting display, a flexible micro light emitting diode display panel, a flexible electrophoretic display panel, or a flexible electro-wetting display panel, but embodiments of the present disclosure are not limited thereto. According to another embodiment of the present disclosure, the display panel 100 may be a display panel with integrated touch panel. For example, the display panel with integrated touch panel may include a touch panel attached on a display panel, or may include a touch electrode layer disposed in the display panel.

The display panel 100 according to an embodiment of the present disclosure may include a display area, which displays an image based on driving of a plurality of pixels arranged on a substrate, and a non-display area which surrounds the display area. For example, the display panel 100 may be implemented so that an entire front surface of the substrate is implemented as the display area without the non-display area, based on a non-bezel (or bezel-less) structure. For example, the display panel 100 may be a transparent display panel which includes a light transmission portion disposed in at least one of the plurality of pixels.

The display panel 100 according to an embodiment of the present disclosure may include a pixel array layer (or a display unit) including an anode electrode, a cathode electrode, and a light emitting device layer. The display panel 100 may be configured to display an image in a type such as a top emission type, a bottom emission type, or a dual emission type, based on a structure of the pixel array layer. For example, in the top emission type, an image may be displayed by outputting visible light generated from the pixel array layer to the forward region in front of a base substrate of the display panel 100. In the bottom emission type, an image may be displayed by outputting visible light generated from the pixel array layer to the backward region in rear of a base substrate of the display panel 100. The micro light emitting diode device may be a light emitting diode implemented as an integrated circuit (IC) or chip type and may include a first terminal electrically connected to the anode electrode and a second terminal electrically connected to the cathode electrode. The cathode electrode may be connected to a light emitting device of a light emitting device layer provided in each pixel area in common.

The display panel 100 according to an embodiment of the present disclosure may include a bending portion that may be bent or curved to have a curved shape or a certain curvature radius.

The bending portion of the display panel 100 may be implemented in at least one of one periphery (or an edge) and the other periphery of the display panel 100, which are parallel to each other. The one periphery and/or the other periphery, where the bending portion is implemented, of the display panel 100 may include only the non-display area, or may include both the non-display area and a periphery (or an edge) of the display area. For example, the display panel 100 including the bending portion implemented by bending of the non-display area may have a one-side bezel bending structure or a both-side bezel bending structure. Also, the display panel 100 including the bending portion implemented by bending of the periphery (or the edge) of the display area and the non-display area may have a one-side active bending structure or a both-side active bending structure.

The display apparatus according to an embodiment of the present disclosure may further include a supporting member 300 disposed at a rear surface of the display panel 100 and a panel connection member 400 disposed between the display panel 100 and the supporting member 300.

The supporting member 300 may be referred to, for example, as a cover bottom, a plate bottom, a back cover, a base frame, a metal frame, a metal chassis, a chassis base, or an m-chassis. Therefore, the supporting member 300 may be a supporter that supports the display panel 100, and may be implemented as a frame or a plate structure of an arbitrary type, on a rear surface of the display apparatus. The supporting member 300 may be a rear surface structure or a rear structure.

The supporting member 300 may cover a rear surface of the display panel 100. For example, the supporting member 300 may cover a whole rear surface of the display panel 100 with a gap space GS therebetween. For example, the supporting member 300 according to an embodiment of the present disclosure may include at least one of a glass material, a metal material, and a plastic material. For example, a periphery or a sharp corner of the supporting member 300 may have an inclined shape or a curved shape, e.g., through a chamfer process or a corner rounding process. For example, the supporting member 300 of the glass material may be sapphire glass. For example, the supporting member 300 of the metal material may include one or more of aluminum (Al), an Al alloy, a magnesium (Mg), a Mg alloy, and an iron (Fe)-nickel (Ni) alloy.

The supporting member 300 according to an embodiment of the present disclosure may additionally cover a side surface of the display panel 100. For example, the supporting member 300 may include a rear part 310 that covers the rear surface of the display panel 100 with the gap space GS therebetween, and a side part 330 connected to an end of the rear part 310 and covering the side surface of the display panel 100. However, embodiments of the present disclosure are not limited thereto. For example, the rear part 310 and the side part 330 of the supporting member 300 may be integrated as one body.

The side part 330 may be implemented as a separated middle frame coupled (or connected) to the rear part 310. For example, the side part 330 implemented as the middle frame may cover the supporting member 300, and for example, may cover all of a side surface of the rear part 310 and the side surface of the display panel 100. For example, the side part 330 implemented as the middle frame may include a material that is the same as or different from that of the supporting member 300 among a metal material and plastic material.

The supporting member 300 according to an embodiment of the present disclosure may be coupled (or connected) to a rear periphery (or a rear edge) of the display panel 100 using a panel connection member 400. For example, the panel connection member 400 may be disposed between the rear periphery of the display panel 100 and a periphery (or an edge) of the supporting member 300, and may attach the display panel 100 to the supporting member 300. The panel connection member 400 according to an embodiment of the present disclosure may be implemented with a double-sided tape, a single-sided tape, or a double-sided adhesive foam pad, but embodiments of the present disclosure are not limited thereto.

The display apparatus according to an embodiment of the present disclosure may further include a front member 500 that covers at least or only a portion of the periphery (or edge) of a front surface of the display panel 100. The front member 500 may have a frame shape that may include an opening overlapping the display area of the display panel 100. For example, the front member 500 may be coupled (or connected) to the side part 330 of the supporting member 300 or the middle frame, and may cover the periphery of the front surface of the display panel 100, thereby supporting or fixing the display panel 100. The front member 500 may be in the periphery of the front surface of the display panel 100, and may be directly exposed (visible) to a user (or a viewer). Thus, an aesthetic design appearance of the display apparatus may be reduced, and a bezel width of the display apparatus may increase. To solve such a problem, the display panel 100 may be coupled (or connected) to the supporting member 300 by the panel connection member 400. Thus, the front member 500 may be omitted (or removed), thereby decreasing the bezel width of the display apparatus and enhancing the aesthetic design appearance of the display apparatus.

The vibration device 200 may be disposed or coupled (or connected) to the rear surface (or a back surface) of the display panel 100. The vibration device 200 may be attached to the rear surface of the display panel 100 by an adhesive member 150.

The adhesive member 150 according to an embodiment of the present disclosure may be between the rear surface of the display panel 100 and the vibration device 200. For example, the adhesive member 150 may include an adhesive or a double-sided adhesive tape, including an adhesive layer that has a good adhesive force or attaching force between the vibration device 200 and the rear surface of the display panel 100. For example, the adhesive layer of the adhesive member 150 may include one or more of epoxy, acryl, silicone, or urethane, but embodiments are not limited thereto. The adhesive layer of the adhesive member 150 may further include an additive, such as a tackifier or an adhesion enhancing agent, a wax component, or an anti-oxidation agent.

The adhesive member 150 according to another embodiment of the present disclosure may further include a hollow portion between the display panel 100 and the vibration device 200. The hollow portion of the adhesive member 150 may provide an air gap between the display panel 100 and the vibration device 200. Due to the air gap, a sound wave (or a sound pressure) based on a vibration of the vibration device 200 may not be dispersed by the adhesive member 150, and may concentrate on the display panel 100. Thus, the loss of a vibration caused by the adhesive member 150 may be minimized or reduced, thereby increasing a sound pressure level characteristic of a sound generated based on a vibration of the display panel 100.

The vibration device 200 according to an embodiment of the present disclosure may be implemented as a film-type. The vibration device 200 may have a thickness that is thinner than that of the display panel 100. Thus, a thickness of the display panel 100 may not increase, despite the presence of the vibration device 200. The vibration device 200 may be referred to as, for example, a vibration apparatus, a sound generating device, a sound generating module, a film actuator, a film-type piezoelectric composite actuator, a film speaker, a film-type piezoelectric speaker, a film-type piezoelectric composite speaker, or an ultrasonic transmitting and receiving device that each uses the display panel 100 as a vibration plate, but the term is not limited thereto.

The vibration device 200 according to an embodiment of the present disclosure may include one or more of the vibration device described above with reference to FIGS. 15 to 24, and thus, its repetitive description is omitted.

The vibration device 200 including one or more of the vibration device described above with reference to FIGS. 15 to 24 may be disposed on the rear surface of the display panel 100 to overlap the display area of the display panel 100. For example, the vibration structure of the vibration device 200 may overlap half or more of the display area of the display panel 100. As another example, the vibration structure of the vibration device 200 may overlap the whole display area of the display panel 100.

The vibration device 200 according to an embodiment of the present disclosure may vibrate according to an electric signal applied through the flexible cable 230 to vibrate the display panel 100. For example, the vibration device 200 may vibrate according to an electric signal applied through the flexible cable 230 to directly vibrate the display panel 100. As one example, the vibration device 200 may vibrate according to a voice signal synchronized with an image displayed by the display panel 100 to vibrate the display panel 100. As another example, the vibration device 200 may vibrate according to a haptic feedback signal (or a tactile feedback signal) synchronized with a user touch applied to a touch panel (or a touch sensor layer) which is disposed on the display panel 100 or embedded into the display panel 100 to vibrate the display panel 100. Accordingly, the display panel 100 may vibrate based on a vibration of the vibration device 200 to provide a user (or a viewer) with at least one or more of sound and a haptic feedback. Embodiments are not limited to the above examples.

According to an embodiment of the present disclosure, when an alternating current (AC) voltage is applied to the inorganic material portion (or a plurality of first portion) disposed in the vibration structure, the inorganic material portion may vibrate by alternately repetitive contract and expand based on an inverse piezoelectric effect, and thus, the vibration device 200 may provide sound and/or a haptic feedback to a user by vibrating the display panel 100 through the vibration thereof. For example, the vibration device 200 may cover most of the display panel 100. Also, a vibration generated by the vibration device 200 may vibrate the entire display panel 100. Thus, localization of a sound generated by the vibration device 200 may be high, and satisfaction of a user may be improved. Also, a contact area (or panel coverage) between the display panel 100 and the vibration device 200 may increase. Thus, a vibration region of the display panel 100 may increase, thereby improving a sound of a middle- and/or a low-pitched sound band generated based on a vibration of the display panel 100. Also, in a large-sized display apparatus, the entire display panel 100 having a large size (or a large area) may vibrate. Thus, localization of a sound based on a vibration of the display panel 100 may be further enhanced, thereby realizing a stereophonic sound effect.

The vibration device 200 according to an embodiment of the present disclosure may be on the rear surface of the display panel 100 to sufficiently vibrate the display panel 100 in a vertical (or front-to-rear) direction (or with respect to a transverse direction of the display panel), thereby outputting a desired sound to a forward region FD in front of the display apparatus. Also, the vibration device 200 may include an organic material portion and an inorganic material portion. Thus, an area (or a size) of the vibration device 200 may infinitely increase, whereby panel coverage of the vibration device 200 with respect to the display panel 100 may increase to enhance a sound characteristic based on a vibration of the display panel 100. Also, the vibration device 200 may be slimmed as a thin-film type, thereby minimizing or reducing or preventing the increase in a driving voltage. For example, the vibration device 200 may be configured to have a wide area corresponding to the same size as that of the display panel 100. Thus, a sound pressure characteristic of a low-pitched sound band, which is a drawback of a film-type piezoelectric, for example, a piezoelectric where a plurality of layers are stacked, may be improved, and the driving voltage may be reduced. Also, the vibration device 200 according to an embodiment of the present disclosure may include the inorganic material portion and the organic material portion, and may be implemented as a thin-film type. Thus, the vibration device 200 may be integrated into or equipped in the display apparatus or a vibration plate without interference caused by a mechanical element and/or another element of the display apparatus or a vibration plate.

Therefore, the display apparatus according to an embodiment of the present disclosure may output a sound, generated by a vibration of the display panel 100 based on a vibration of the vibration device 200, in a forward direction FD of the display panel. Also, in the display apparatus according to an embodiment of the present disclosure, a most region of the display panel 100 may be vibrated by the large-area vibration device having a film-type, thereby more enhancing a sense of sound localization and a sound pressure level characteristic of a sound based on the vibration of the display panel 100 or a vibration plate.

Figure 27:
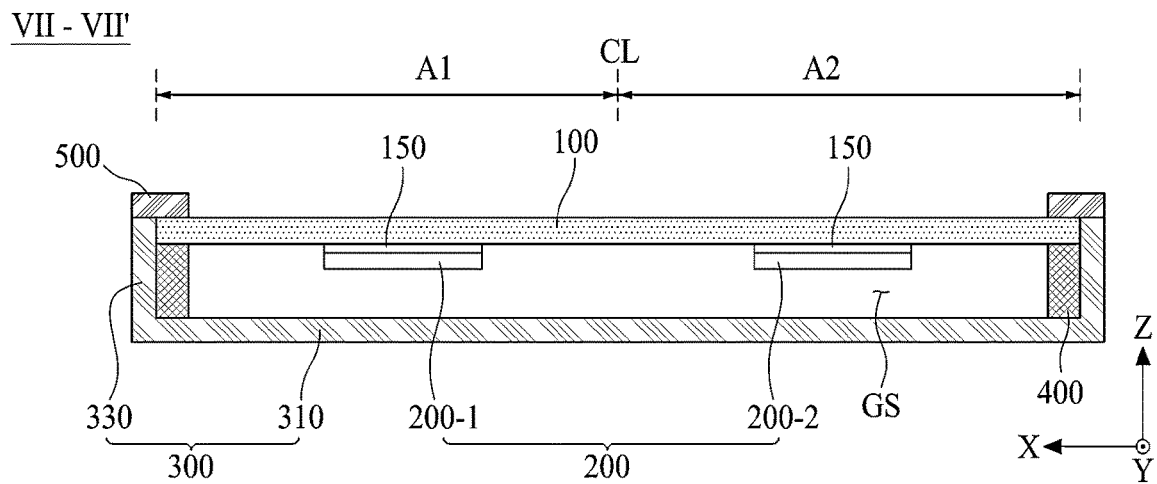
FIG. 27 is another cross-sectional view taken along line VII-VII' illustrated in FIG. 25.

FIG. 27 is a cross-sectional view taken along line VII-VII' illustrated in FIG. 25, and illustrates an embodiment where the vibration device in the display apparatus illustrated in FIG. 26 is modified. Hereinafter, therefore, repetitive descriptions of elements other than the vibration device and elements relevant thereto are omitted or will be briefly given.

With reference to FIG. 27 in conjunction with FIG. 25, in the display apparatus according to another embodiment of the present disclosure, a rear surface (or a back surface) of a display panel 100 may include a first region (or a first rear area) A1 and a second region (or a second rear area) A2. For example, the rear surface of the display panel 100 may be divided into the first region A1 and the second region A2. For example, in the rear surface of the display panel 100, the first region A1 may be a left rear region, and the second region A2 may be a right rear region. The terms "left" and "right" are used herein for convenience of explanation, and are interchangeable as should be understood by one of ordinary skill in the art. The first and second regions A1 and A2 may be a left-right symmetrical (or bilaterally symmetrical) with respect to a center line CL of the display panel 100 in a first direction X, but embodiments are not limited thereto. For example, each of the first and second regions A1 and A2 may overlap the display area of the display panel 100.

The vibration device 200 according to an embodiment of the present disclosure may include a first vibration device 200-1 and a second vibration device 200-2 disposed in the rear surface of the display panel 100.

The first vibration device 200-1 may be disposed in the first region A1 of the display panel 100. For example, the first vibration device 200-1 may be disposed close to a center or a periphery (or an edge) in the first region A1 of the display panel 100 based on the first direction X. The first vibration device 200-1 according to an embodiment of the present disclosure may directly vibrate the first region A1 of the display panel 100, and thus, may generate a first vibration sound or a first haptic feedback in the first region A1 of the display panel 100. For example, the first vibration sound may be a left sound. A size of the first vibration device 200-1 according to an embodiment of the present disclosure may have a size corresponding to half or less of the first region A1 or half or more of the first region A1 based on a characteristic of the first vibration sound or a sound characteristic needed for a display apparatus.

The second vibration device 200-2 may be disposed in the second region A2 of the display panel 100. For example, the second vibration device 200-2 may be disposed close to a center or a periphery (or an edge) in the second region A2 of the display panel 100 based on the first direction X. The second vibration device 200-2 according to an embodiment of the present disclosure may directly vibrate the second region A2 of the display panel 100, and thus, may generate a second vibration sound or a second haptic feedback in the second region A2 of the display panel 100. For example, the second vibration sound may be a right sound. A size of the second vibration device 200-2 according to an embodiment of the present disclosure may have a size corresponding to half or less of the second region A2 or half or more of the second region A2 based on a characteristic of the second vibration sound or a sound characteristic needed for a display apparatus. For example, the first vibration device 200-1 and the second vibration device 200-2 may have the same size or different sizes to each other based on a sound characteristic of left and right sounds and/or a stereo sound characteristic of the display apparatus and may be disposed in a left-right symmetrical structure or a left-right asymmetrical structure with respect to the center line CL of the display panel 100.

Each of the first vibration device 200-1 and the second vibration device 200-2 may include one or more among the vibration device 200 described above with reference to FIGS. 15 to 24, and thus, their detailed descriptions are omitted.

A piezoelectric layer of vibration structure included in the first vibration device 200-1 and a piezoelectric layer of vibration structure included in the second vibration device 200-2 may be the same or differ. For example, based on a sound characteristic needed for a display apparatus, the piezoelectric layers of each of the first and second vibration devices 200-1 and 200-2 may include the same piezoelectric layers 211 as one or more of the piezoelectric layers 211 described above with reference to FIGS. 18A to 18G, or may include different piezoelectric layers 211.

Each of the first vibration device 200-1 and the second vibration device 200-2 may be attached (or connected) on the rear surface of the display panel 100 by the adhesive member 150.

The adhesive member 150 according to an embodiment of the present disclosure may be between each of the first vibration device 200-1 and the second vibration device 200-2 and the rear surface of the display panel 100. The adhesive member 150 may be substantially the same as the adhesive member 150 described above with reference to FIGS. 25 and 26, and thus, its repetitive description is omitted.

Therefore, the display apparatus according to another embodiment of the present disclosure may output, through the first vibration device 200-1 and the second vibration device 200-2, a left sound and a right sound to a forward region FD in front of the display panel 100 to provide a stereo sound or sound to a user.

Figure 28:
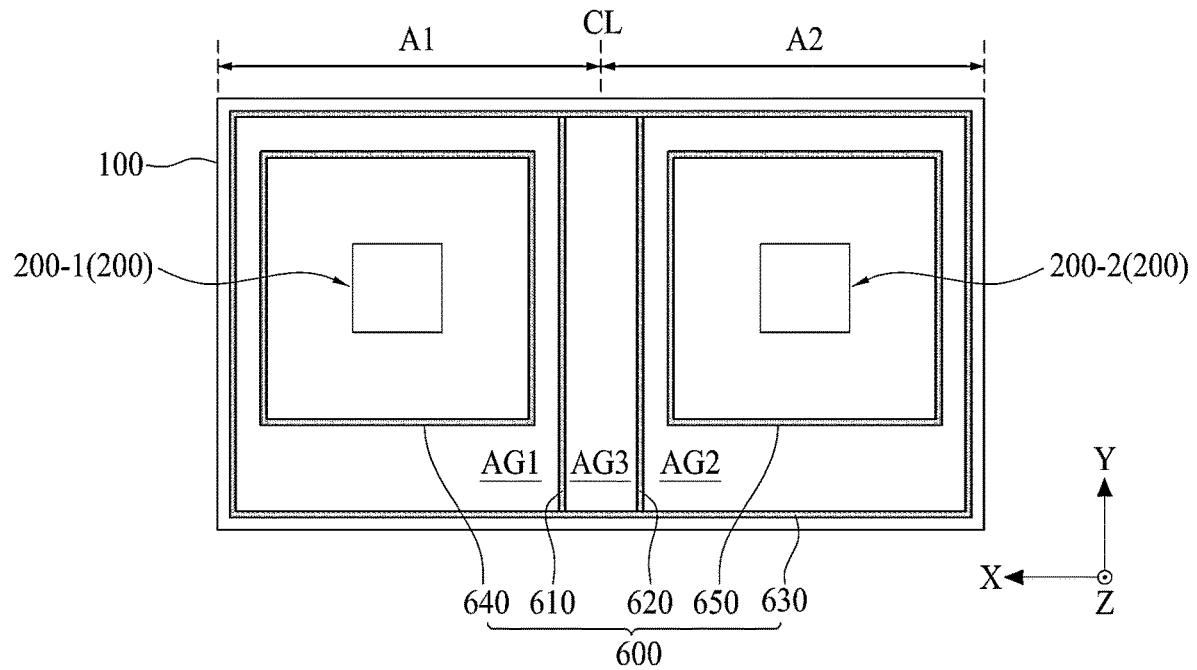
FIG. 28 illustrates a display apparatus according to another embodiment of the present disclosure.

FIG. 28 illustrates a display apparatus according to another embodiment of the present disclosure and illustrates an embodiment where a partition is further configured in the display apparatus illustrated in FIG. 27. Hereinafter, therefore, repetitive descriptions of elements other than the partition and elements relevant thereto are omitted or will be briefly given.

With reference to FIG. 28 in conjunction with FIG. 27, the display apparatus according to another embodiment of the present disclosure may further include a partition 600 for dividing the first and second regions A1 and A2 of the display panel 100.

The partition 600 may be an air gap or a space, where sounds are generated when the display panel 100 is vibrated by the first and second vibration devices 200-1 and 200-2. For example, a partition 600 may separate the sounds or a channel and may minimize or prevent or decrease the reduction of a sound characteristic caused by interference of the sounds. The partition 600 may be disposed between the display panel 100 and the supporting member 300. For example, the partition 600 may be disposed between a rear surface of the display panel 100 and a front surface of the supporting member 300. The partition 600 may be disposed on the support member 300 in order to minimize or reduce the effect of the image quality on the display panel 100 due to the partition 600. The partition 600 may be referred to as a sound blocking member, a sound separation member, a space separation member, an enclosure or a baffle, but the terms are not limited thereto.

The partition 600 according to an embodiment of the present disclosure may include first and second partition members 610 and 620 between the first and second vibration devices 200-1 and 200-2.

The first and second partition members 610 and 620 may be between the display panel 100 and a supporting member 300 corresponding to a center region (or a middle region) of the display panel 100. The first and second partition members 610 and 620 may separate the first vibration sound and the second vibration sound respectively generated by the first vibration device 200-1 and the second vibration device 200-2. For example, the first and second partition members 610 and 620 may reduce, block, or prevent the transfer of a vibration, generated by the first vibration device 200-1 in the first region A1 of the display panel 100, to the second region A2 of the display panel 100, or may reduce, block, or prevent the transfer of a vibration, generated by the second vibration device 200-2 in the second region A2 of the display panel 100, to the first region A1 of the display panel 100. Therefore, the first and second partition members 610 and 620 may attenuate or absorb a vibration of the display panel 100 at a center of the display panel 100. Thus, the first and second partition members 610 and 620 may reduce, block, or prevent the transfer of a sound of the first region A1 to the second region A2, or may reduce, block, or prevent the transfer of a sound of the second region A2 to the first region A1. Accordingly, the first and second partition members 610 and 620 may separate a left sound and a right sound to further enhance a sound output characteristic of the display apparatus. Thus, the display apparatus according to an embodiment of the present disclosure may separate the left and right sounds by the first and second partition members 610 and 620 to output a two-channel stereo sound to a forward region FD in front of the display panel 100.

As an example, the partition 600 may include a material having an elastic force that enables compression to be made to some degree. For example, the partition 600 may include polyurethane, polyolefin, and/or the like, but embodiments are not limited thereto. As another example, the partition 600 may include a single-sided tape, a single-sided foam pad, a double-sided tape, a double-sided foam tape, or a double-sided foam pad, and/or the like, but embodiments are not limited thereto.

As another example, any one of the first and second partition members 610 and 620 may be omitted. For example, only one of the first and second partition members 610 and 620 may be configured. For example, even when any one of the first and second partition members 610 and 620 is between the first vibration device 200-1 and the second vibration device 200-2, a left sound and a right sound may be separated from each other. For example, when the second partition member 620 among the first and second partition members 610 and 620 is omitted, the first partition member 610 may be disposed between the display panel 100 and the supporting member 300 to correspond to a rear center line CL of the display panel 100.

Therefore, the first and/or second partition members 610 and 620 may separate a left sound and a right sound to further enhance a sound output characteristic of the display apparatus. A display apparatus including the first partition member 610 and/or the second partition member 620 may separate the left and right sounds by the first partition member 610 and/or the second partition member 620 to output a two-channel stereo sound to the forward region in front of the display panel 100.

The partition 600 according to an embodiment of the present disclosure may further include a third partition member 630 between the display panel 100 and the supporting member 300. For example, the partition 600 may further include a third partition member 630 interposed between the display panel 100 and the supporting member 300.

The third partition member 630 may be disposed along a space between a rear periphery (or a rear edge) of the display panel 100 and a front periphery (or a front edge) of the supporting member 300 to surround all of the first and second vibration devices 200-1 and 200-2. The third partition member 630 may be referred to as an edge partition, a sound blocking member, an edge enclosure, or an edge baffle, but the term is not limited thereto. As an example, the third partition member 630 may be adjacent to or in contact with the panel connection member 400 illustrated in FIG. 26, and may be surrounded by the panel connection member 400. As another example, the third partition member 630 may be integrated as one body with the panel connection member 400.

The third partition member 630 may provide first to third air gaps AG1 to AG3 between the display panel 100 and the supporting member 300, along with the first and second partition members 610 and 620. For example, each of the first to third air gaps AG1 to AG3 may be referred to as a vibration space, a sound pressure space, a sound box, a sound part, a resonance box, or a resonance part, but the term is not limited thereto.

The first air gap AG1 may be provided in the first region A1 of the display panel 100 surrounded by the first partition member 610 and the third partition member 630.

The second air gap AG2 may be provided in the second region A2 of the display panel 100 surrounded by the second partition member 620 and the third partition member 630.

The third air gap AG3 may be provided in a third region (or a rear center region) of the display panel 100 surrounded by the first and second partition members 610 and 620 and the third partition member 630. For example, the third air gap AG3 may be provided between the second air gap AG2 and the first air gap AG1, including the rear center line CL of the display panel 100. The third air gap AG3 may be referred to as a sound separation space, a sound blocking space, or a sound interference prevention space, but the term is not limited thereto. The third air gap AG3 may spatially separate the first air gap AG1 from the second air gap AG2. Thus, the third air gap AG3 may reduce or prevent a resonance phenomenon or an interference phenomenon generated in a certain frequency band in each of the first air gap AG1 and the second air gap AG2.

The first vibration device 200-1 may be surrounded by the first partition member 610 and the third partition member 630 providing the first air gap AG1. The second vibration device 200-2 may be surrounded by the second partition member 620 and the third partition member 630 providing the second air gap AG2.

When any one of the first and second partition members 610 and 620 is omitted, the third air gap AG3 may be omitted.

Therefore, the third partition member 630 may surround an area between the display panel 100 and the supporting member 300, and may individually surround each of the first and second vibration devices 200-1 and 200-2, along with the first and second partition members 610 and 620, to secure a vibration space of each of the first and second vibration devices 200-1 and 200-2. Thus, the third partition member 630 may enhance a sound pressure lever characteristic of left and right sounds. Further, the third partition member 630 may reduce or prevent sound or a sound pressure level from being leaked to the outside through the side surface between the display panel 100 and the supporting member 300, thereby further enhancing a sound output characteristic of the display apparatus.

The partition 600 according to an embodiment of the present disclosure may further include a fourth partition member 640 and a fifth partition member 650. The fourth partition member (or a first enclosure) 640 may surround the first vibration device 200-1. The fifth partition member (or a second enclosure) 650 may surround the second vibration device 200-2.

The fourth partition member 640 may be disposed between the display panel 100 and the supporting member 300 to correspond to the first air gap AG1, and may individually (or independently) surround the first vibration device 200-1. The fourth partition member 640 according to an embodiment of the present disclosure may have a rectangular shape surrounding the first vibration device 200-1, but embodiments are not limited thereto. For example, the fourth partition member 640 may have a shape that is the same as or different from a whole shape of the first vibration device 200-1. For example, when the first vibration device 200-1 has a rectangular shape, the fourth partition member 640 may have a rectangular shape having a size that is relatively greater than that of the first vibration device 200-1. For example, when the first vibration device 200-1 has a square shape, the fourth partition member 640 may have a square shape, a circular shape or an oval shape having a size relatively larger than that is relatively greater than that of the first vibration device 200-1.

The fourth partition member 640 may limit (or define) a vibration region (or a vibration area) of the display panel 100 based on the first vibration device 200-1. For example, in the first region A1 of the display panel 100, as a size of the fourth partition member 640 increases, a vibration region of the first region A1 may increase. Thus, a low-pitched sound band characteristic of a left sound may be enhanced. As another example, in the first region A1 of the display panel 100, as a size of the fourth partition member 640 decreases, the vibration region of the first region A1 may decrease. Thus, a high-pitched sound band characteristic of the left sound may be enhanced. Accordingly, a size of the fourth partition member 640 may be adjusted based on a desired characteristic of a sound band, based on a vibration of the display panel 100.

The fifth partition member 650 may be provided between the display panel 100 and the supporting member 300 to correspond to the second air gap AG2. The fifth partition member 650 may individually (or independently) surround the second vibration device 200-2. For a left sound to be symmetrical with a right sound, the fifth partition member 650 according to an embodiment of the present disclosure may have the same shape as that of the fourth partition member 640 and a symmetrical structure with the fourth partition member 640 with respect to the rear center line CL of the display panel 100. Thus, description relevant thereto is omitted.

The fifth partition member 650 may limit (or define) a vibration region (or a vibration area) of the display panel 100 based on the second vibration device 200-2. For example, in the second region A2 of the display panel 100, as a size of the fifth partition member 650 increases, a vibration region of the second region A2 may increase. Thus, the low-pitched sound band characteristic of the right sound may be enhanced. As another example, in the second region A2 of the display panel 100, as a size of the fifth partition member 650 decreases, the vibration region of the second region A2 may decrease. Thus, the high-pitched sound band characteristic of the right sound may be enhanced. Accordingly, a size of the fifth partition member 650 may be adjusted based on a desired characteristic of a sound band, based on a vibration of the display panel 100.

The fourth and fifth partition members 640 and 650 may limit a vibration region (or a vibration area) of each of the first and second vibration devices 200-1 and 200-2. Thus, the fourth and fifth partition members 640 and 650 may enhance lateral symmetricity of a left sound and a right sound each generated based on a vibration of the display panel 100, and may optimize a sound pressure level characteristic and a sound reproduction band of each of the left and right sounds. As another example, when the fourth and fifth partition members 640 and 650 are provided, the third partition member 630 may be omitted. As another example, when the fourth and fifth partition members 640 and 650 are provided, one or more of the first to third partition members 610 to 630 may be omitted.

Therefore, when the display apparatus according to an embodiment of the present disclosure includes the partition 600, the sound pressure level characteristic and the sound reproduction band of each of the left and right sounds may be improved or optimized. For example, the display apparatus according to an embodiment of the present disclosure may include at least one of the first and second partition members 610 and 620. As another example, the display apparatus according to an embodiment of the present disclosure may include the third partition member 630 and one of the first and second partition members 610 and 620. As another example, the display apparatus according to an embodiment of the present disclosure may include the third to fifth partition members 630, 640, and 650. As another example, the display apparatus according to an embodiment of the present disclosure may include the first to fifth partition members 610 to 650.

The display apparatus according to another embodiment of the present disclosure may output, through the first and second vibration devices 200-1 and 200-2, a left sound and a right sound to a forward region FD in front of the display panel 100 to provide a stereo sound to a user. Further, the display apparatus according to another embodiment of the present disclosure may separate the left and right sounds by the partition 600 to output a two-channel stereo sound to the forward region FD in front of the display panel 100. Moreover, in the display apparatus according to another embodiment of the present disclosure, at least one of the first and second protection member 250 and 270 of each of the first and second vibration devices 200-1 and 200-2 may include a metal plate or a metal film including a metal material, and thus, the flatness of a sound pressure level characteristic may be improved due to decrease in a resonance frequency caused by the protection member 250 and 270 including a metal material.

Figure 29:
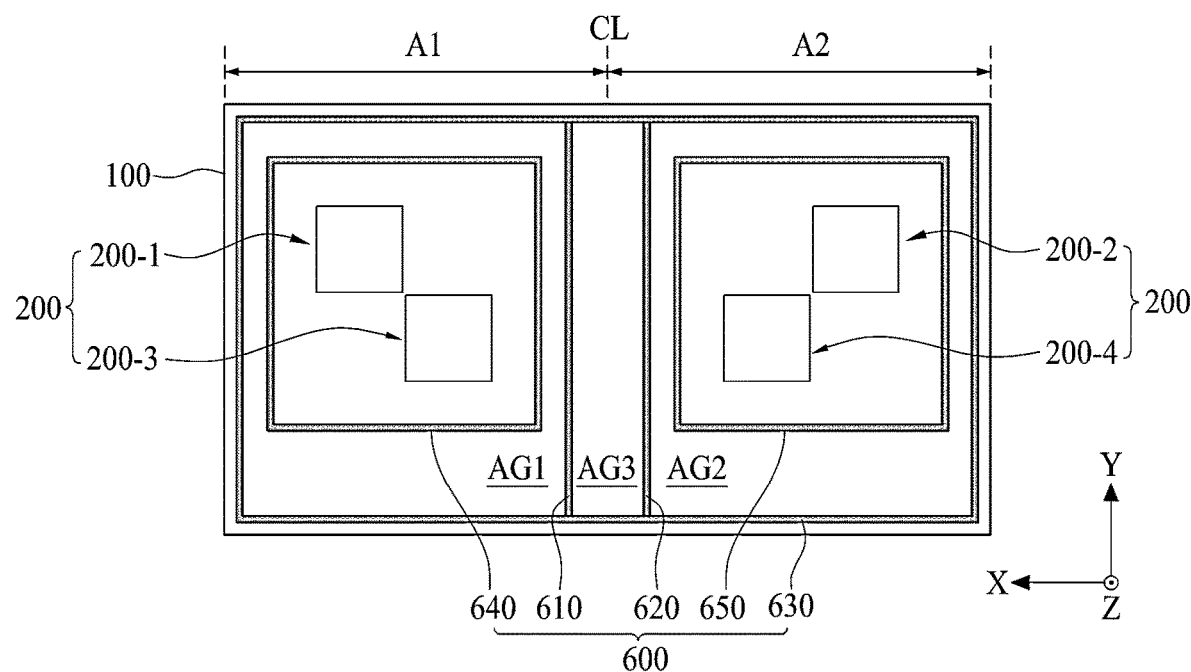
FIG. 29 illustrates a display apparatus according to another embodiment of the present disclosure.

FIG. 29 illustrates a display apparatus according to another embodiment of the present disclosure and illustrates an embodiment where the vibration device in the display apparatus illustrated in FIG. 28 is modified. Hereinafter, therefore, repetitive descriptions of elements other than the vibration device and elements relevant thereto are omitted or will be briefly given.

With reference to FIG. 29, the display apparatus according to another embodiment of the present disclosure may include first to fourth vibration devices 200-1 to 200-4 on a rear surface of a display panel 100.

The first and third vibration devices 200-1 and 200-3 may be alternately disposed or in a diagonal direction in the first region A1 of the display panel 100. Thus, the first and third vibration devices 200-1 and 200-3 may increase a vibration region of the first region A1 of the display panel 100. For example, the diagonal direction may be a direction between the first direction X and the second direction Y. The first and third vibration devices 200-1 and 200-3 may be surrounded by the partition 600. For example, the first and third vibration devices 200-1 and 200-3 may be surrounded by the fourth partition member (or a first enclosure) 640.

Each of the first and third vibration devices 200-1 and 200-3 may vibrate the first region A1 of the display panel 100 to generate a first vibration sound (or a left sound) or a first haptic feedback in the first region A1 of the display panel 100. For example, a vibration region of the first region A1 of the display panel 100 may increase based on a diagonal arrangement structure of the first and third vibration devices 200-1 and 200-3 and thus, a low-pitched sound band characteristic of a left sound may be enhanced. For example, in addition to the first vibration device 200-1, a third vibration device 200-3 may be further disposed in a first region A1 of the display panel 100, and thus, a first vibration sound or a first haptic feedback according to another embodiment of the present disclosure may be more enhanced than the first vibration sound or the first haptic feedback described above with reference to FIG. 28.

The first vibration device 200-1 may be disposed close to a periphery of the first region A1 of the display panel 100. For example, the first vibration device 200-1 may be disposed in a left upper region, which is adjacent to a periphery of the display panel 100, of the first region A1 of the display panel 100. The third vibration device 200-3 may be disposed close to a center line CL of the display panel 100 in the first region A1 of the display panel 100. For example, the third vibration device 200-3 may be disposed in a right lower region, which is adjacent to the center line CL of the display panel 100, of the first region A1 of the display panel 100. The third vibration device 200-3 may be alternately disposed with respect to the first vibration device 200-1 in the first region A1 of the display panel 100, and thus, may not overlap the first vibration device 200-1 in a first direction X and a second direction Y.

The first and third vibration devices 200-1 and 200-3 may be in parallel in the first direction X or a second direction Y in the first region A1 of the display panel 100. For example, the vibration region of the first region A1 of the display panel 100 may increase based on a parallel arrangement structure of the first and third vibration devices 200-1 and 200-3, thereby enhancing the low-pitched sound band characteristic of the left sound. Comparing with the parallel arrangement structure of the first and third vibration devices 200-1 and 200-3, the diagonal arrangement structure of the first and third vibration devices 200-1 and 200-3 may further increase the vibration region of the first region A1 of the display panel 100, thereby enhancing the low-pitched sound band characteristic of the left sound. The diagonal arrangement structure of the first and third vibration devices 200-1 and 200-3 may have an effect in which vibration devices may be disposed in a 2×2 structure in the first region A1 of the display panel 100. Thus, the number of vibration devices for vibrating the first region A1 of the display panel 100 may decrease by half.

According to an embodiment of the present disclosure, a piezoelectric layer of vibration structure included in the first vibration device 200-1 and a piezoelectric layer of vibration structure included in the third vibration device 200-3 may be the same or differ. For example, based on a sound characteristic needed for a display apparatus, the piezoelectric layers of each of the first and third vibration devices 200-1 and 200-3 may include the same piezoelectric layers 211 as one or more of the piezoelectric layers 211 described above with reference to FIGS. 18A to 18G, or may include different piezoelectric layers 211.

The second and fourth vibration devices 200-2 and 200-4 may be alternately disposed or in a diagonal direction in the second region A2 of the display panel 100. Thus, the second and fourth vibration devices 200-2 and 200-4 may increase a vibration region of the second region A2 of the display panel 100. The second and fourth vibration devices 200-2 and 200-4 may be surrounded by the partition 600. For example, the second and fourth vibration devices 200-2 and 200-4 may be surrounded by the fifth partition member (or a second enclosure) 650.

Each of the second and fourth vibration devices 200-2 and 200-4 may vibrate the second region A2 of the display panel 100 to generate a second vibration sound (or a right sound) or a second haptic feedback in the second region A2 of the display panel 100. For example, a vibration region of the second region A2 of the display panel 100 may increase based on a diagonal arrangement structure of the second and fourth vibration devices 200-2 and 200-4 and thus, a low-pitched sound band characteristic of a right sound may be enhanced. For example, in addition to the second vibration device 200-2, a fourth vibration device 200-4 may be further disposed in a second region A2 of the display panel 100, and thus, a second vibration sound or a second haptic feedback according to another embodiment of the present disclosure may be more enhanced than the second vibration sound or the second haptic feedback described above with reference to FIG. 28.

The second vibration device 200-2 may be disposed close to a periphery of the second region A2 of the display panel 100. For example, the second vibration device 200-2 may be disposed in a right upper region, which is adjacent to a periphery of the display panel 100, of the second region A2 of the display panel 100. Also, the first and second vibration device 200-1 and 200-2 may be a left-right symmetrical with respect to a center line CL of the display panel 100 in a first direction X, but embodiments are not limited thereto. The fourth vibration device 200-4 may be disposed close to a center line CL of the display panel 100 in the second region A2 of the display panel 100. For example, the fourth vibration device 200-4 may be disposed in a left lower region, which is adjacent to the center line CL of the display panel 100, of the second region A2 of the display panel 100. The fourth vibration device 200-4 may be alternately disposed with respect to the second vibration device 200-2 in the second region A2 of the display panel 100, and thus, may not overlap the second vibration device 200-2 in a first direction X and a second direction Y. Also, the fourth vibration device 200-4 may be a left-right symmetrical with the third vibration device 200-3 with respect to the center line CL of the display panel 100 in a first direction X, but embodiments are not limited thereto.

The second and fourth vibration devices 200-2 and 200-4 may be in parallel in the first direction X or a second direction Y in the second region A2 of the display panel 100. For example, the vibration area of the second region A2 of the display panel 100 may increase based on a parallel arrangement structure of the second and fourth vibration devices 200-2 and 200-4, thereby enhancing the low-pitched sound band characteristic of the right sound. Comparing with the parallel arrangement structure of the second and fourth vibration devices 200-2 and 200-4, the diagonal arrangement structure of the second and fourth vibration devices 200-2 and 200-4 may further increase the vibration area of the second region A2 of the display panel 100, thereby enhancing the low-pitched sound band characteristic of the right sound. The diagonal arrangement structure of the second and fourth vibration devices 200-2 and 200-4 may have an effect in which vibration devices may be disposed in a 2×2 structure in the second region A2 of the display panel 100. Thus, the number of vibration devices for vibrating the second region A2 of the display panel 100 may decrease by half.

According to an embodiment of the present disclosure, a piezoelectric layer of vibration structure included in the second vibration device 200-2 and a piezoelectric layer of vibration structure included in the fourth vibration device 200-4 may be the same or differ. For example, based on a sound characteristic needed for a display apparatus, the piezoelectric layers of each of the second and fourth vibration devices 200-2 and 200-4 may include the same piezoelectric layers 211 as one or more of the piezoelectric layers 211 described above with reference to FIGS. 18A to 18G, or may include different piezoelectric layers 211.

Piezoelectric layers of the vibration structures included in each of the first to fourth vibration devices 200-1 to 200-4 may be the same or differ. For example, based on a sound characteristic needed for a display apparatus, the piezoelectric layers of each of the first to fourth vibration devices 200-1 to 200-4 may include the same piezoelectric layers as one or more of the piezoelectric layers 211 described above with reference to FIGS. 18A to 18G, or may include different piezoelectric layers 211.

When the piezoelectric layers of each of the first to fourth vibration devices 200-1 to 200-4 may include different piezoelectric layers among the piezoelectric layers 211 described above with reference to FIGS. 18A to 18G, the vibration device 200 may have various resonance frequencies, and thus, a reproduction band and a sound pressure level characteristic of a sound which is generated based on a vibration of the vibration device 200 may considerably increase.

An arrangement structure of the first to fourth vibration devices 200-1 to 200-4 is not limited to the arrangement structure illustrated in FIG. 29. For example, in each of the first region A1 and the second region A2 of the display panel 100, when a direction between a left upper portion and a right lower portion is referred to as a first diagonal direction and a direction between a right upper portion and a left lower portion is referred to as a second diagonal direction, the first and third vibration devices 200-1 and 200-3 may be disposed in the first diagonal direction or the second diagonal direction, and the second and fourth vibration devices 200-2 and 200-4 may be disposed in a diagonal direction, which is the same as or different from a diagonal arrangement direction of the first and third vibration devices 200-1 and 200-3, among the first diagonal direction and the second diagonal direction. For example, the first vibration device 200-1 and the second vibration device 200-2 may be disposed in a left-right symmetrical structure or a left-right asymmetrical structure with respect to the center line CL of the display panel 100. Also, the third vibration device 200-3 and the fourth vibration device 200-4 may be disposed in a left-right symmetrical structure or a left-right asymmetrical structure with respect to the center line CL of the display panel 100.

Therefore, the display apparatus according to another embodiment of the present disclosure may have the same effect as that of the display apparatus described above with reference to FIG. 28. For example, the display apparatus according to another embodiment of the present disclosure may output, through the first to fourth vibration devices 200-1 to 200-4, a left sound and a right sound to a forward region FD in front of the display panel 100 to provide a stereo sound to a user. Further, the display apparatus according to another embodiment of the present disclosure may separate the left and right sounds by the partition 600 to output a two-channel stereo sound to the forward region FD in front of the display panel 100. Moreover, in the display apparatus according to another embodiment of the present disclosure, at least one of the first and second protection member 250 and 270 of each of the first to fourth vibration devices 200-1 to 200-4 may include a metal plate or a metal film including a metal material, and thus, the flatness of a sound pressure level characteristic may be improved due to decrease in a resonance frequency caused by the protection member 250 and 270 including a metal material. In addition, in the display apparatus according to another embodiment of the present disclosure, a vibration region of each of the first and second regions A1 and A2 may increase based on a diagonal arrangement structure of the first and third vibration devices 200-1 and 200-3 and a diagonal arrangement structure of the second and fourth vibration devices 200-2 and 200-4, thereby more increasing a sound pressure level characteristic of the low-pitched sound band.

Figure 30A:
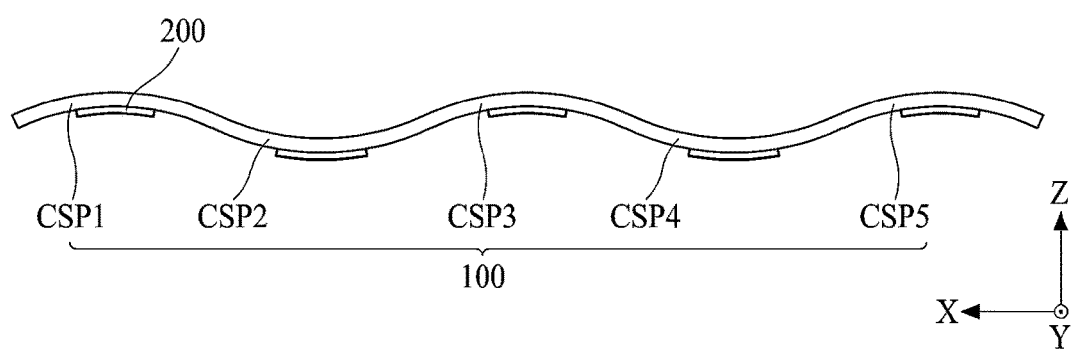
FIGS. 30A to 30C illustrate a display apparatus including a vibration device according to embodiments of the present disclosure.
Figure 30B:
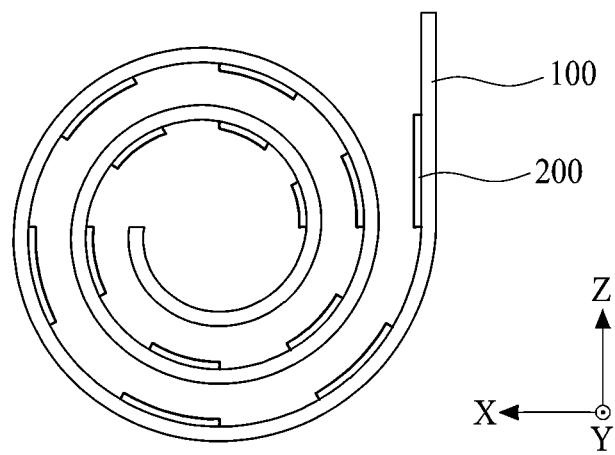
Figure 30C:
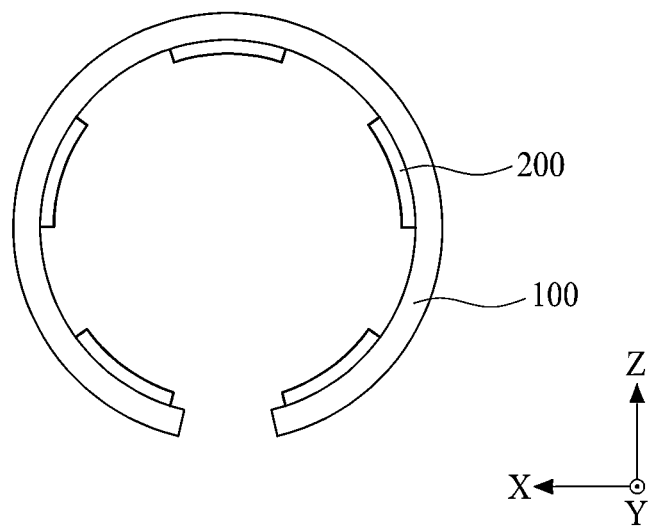

FIGS. 30A to 30C illustrate a display apparatus including a vibration device according to an embodiment of the present disclosure. FIGS. 30A to 30C illustrate a display apparatus including the vibration device described above with reference to any of FIGS. 15 to 24.

The vibration device described above with reference to FIGS. 15 to 24 may be implemented as a film type having flexibility and thus, may be applied to various application apparatuses.

With reference to FIG. 30A, the vibration device 200 according to an embodiment of the present disclosure may be applied to a commercial display apparatus or to a flexible display apparatus including a display panel 100 including a plurality of curved surface portions CSP1 to CSP5 which may be concave or convex. As an example, the vibration device 200 may be implemented to be bent in a shape having a curvature value (or a curvature radius) matching a convex portion or a concave portion of each of the curved surface portions CSP1 to CSP5 of the display panel 100. For example, the vibration device 200 may be disposed in the convex portion or the concave portion of each of the curved surface portions CSP1 to CSP5 of the display panel 100. As another example, the vibration device 200 may be implemented to have a shape matching the curvature value (or the curvature radius) of each of the curved surface portions CSP1 to CSP5 of the display panel 100, and may be on an entire (or whole) rear surface of the display panel 100.

With reference to FIG. 30B, the vibration device 200 according to an embodiment of the present disclosure may be applied to a rollable display apparatus, including a display panel 100 that may be wound in a spiral shape or unwound. As an example, the vibration device 200 may be implemented to have a shape having a curvature value (or a curvature radius) of the display panel 100 that may be wound in a spiral shape or unwound. For example, the vibration device 200 may be arranged at certain intervals on a rear surface of the display panel 100. As another example, the vibration device 200 may be implemented to have a shape matching the curvature value (or the curvature radius) of the display panel 100, and may be on the entire rear surface of the display panel 100.

With reference to FIG. 30C, the vibration device 200 according to an embodiment of the present disclosure may be applied to a wearable display apparatus including a display panel 100, which may be wound around a wrist of a user, and may be bent in a "C"-shape. As an example, the vibration device 200 may be implemented to have a shape having a curvature value (or a curvature radius) of the display panel 100, which may be bent in the "C"-shape. For example, the vibration device 200 may be arranged at certain intervals on a rear surface of the display panel 100. As another example, the vibration device 200 may be implemented to have a shape matching the curvature value (or the curvature radius) of the display panel 100, which may be bent in the C-shape, and may be on the entire rear surface of the display panel 100.

The vibration device according to an embodiment of the present disclosure may be applied to a vibration device disposed on a display apparatus. The display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, etc. Also, the vibration device according to an embodiment of the present disclosure may be applied to organic light emitting lighting apparatuses or inorganic light emitting lighting apparatuses. When a vibration device of an embodiment of the present disclosure is applied to a lighting apparatuses, the vibration device may act as lighting and a speaker. Also, when the display apparatus of an embodiment of the present disclosure is applied to a mobile device, the vibration device may act as one or more of a speaker, a receiver, and a haptic, but embodiments of the present disclosure are not limited thereto.

A flexible cable according to an embodiment of the present disclosure will be described below.

According to an embodiment of the present disclosure, a flexible cable may include a base member including a terminal portion; a conductor layer including a plurality of conductive lines disposed on the base member; and a protection layer disposed on the base member to cover at least part of the conductor layer and configured to expose a portion of each of the plurality of conductive lines at the terminal portion, a length of each of the plurality of conductive lines may be longer than a length of the base member.

According to some embodiments of the present disclosure, each of the plurality of conductive lines may pass by a side surface of the base member and may protrude to the outside.

According to some embodiments of the present disclosure, a protrusion length of each of the plurality of conductive lines may be longer than a length of the terminal portion.

According to some embodiments of the present disclosure, each of the plurality of conductive lines may include a first line on the base member; and a second line extending from a side surface of the base member to the outside.

According to some embodiments of the present disclosure, the flexible cable may further include a supporter disposed on the second line of each of the plurality of conductive lines, the supporter may at least partly surround some portion of the second line.

According to some embodiments of the present disclosure, the supporter may include a lower supporter which supports a lower portion of the second line and an upper supporter which covers an upper portion of the second line.

According to some embodiments of the present disclosure, the second line of each of the plurality of conductive lines may include a plurality of straps spaced apart from one another.

According to some embodiments of the present disclosure, the flexible cable may further include a supporter disposed on the second line of each of the plurality of conductive lines, the supporter on each of the second line may at least partly surround the plurality of straps of the second line in common.

According to some embodiments of the present disclosure, the supporter may include a lower supporter which supports a lower portion of the second line and an upper supporter which covers an upper portion of the second line.

According to some embodiments of the present disclosure, the flexible cable may further include a first line supporting portion supporting some of second lines among the plurality of conductive lines, the first line supporting portion may extend from the base member and supports a rear surface of some of the second lines.

According to some embodiments of the present disclosure, the flexible cable may further include a second line supporting portion supporting the other second lines of the second lines among the plurality of conductive lines, the second line supporting portion may surround a front surface and side surfaces of the other second lines.

According to some embodiments of the present disclosure, at least one of the plurality of conductive lines may include a first line on the base member in parallel with a first direction; a second line extending from the first line to the outside of the base member in the first direction; and a third line protruding from the second line in parallel with a second direction intersecting with the first direction.

A vibration device according to an embodiment of the present disclosure will be described below.

According to an embodiment of the present disclosure, a vibration device may include a vibration structure including a vibration layer, a first electrode layer disposed on a first surface of the vibration layer, and a second electrode layer disposed on a second surface opposite to the first surface of the vibration layer; and a flexible cable electrically connected to the first electrode layer and to the second electrode layer of the vibration structure.

According to some embodiments of the present disclosure, the flexible cable may include a plurality of conductive lines, and some of the plurality of conductive lines may be electrically connected to the first electrode layer of the vibration structure, and the other conductive lines of the plurality of conductive lines may be electrically connected to the second electrode layer of the vibration structure.

According to some embodiments of the present disclosure, the flexible cable may include a body portion including a terminal portion; and a plurality of finger lines protruding from the body portion, and some of the plurality of finger lines may be electrically connected to the first electrode layer of the vibration structure, and the other finger lines of the plurality of finger lines may be electrically connected to the second electrode layer of the vibration structure.

According to some embodiments of the present disclosure, the flexible cable may further include a body portion including a terminal portion, and the plurality of conductive lines may form finger lines and protrude from the body portion.

According to some embodiments of the present disclosure, a protrusion length of each of the plurality of finger lines may be longer than a length of the terminal portion.

According to some embodiments of the present disclosure, the flexible cable may include a base member including a terminal portion; a conductor layer including a plurality of conductive lines disposed on the base member to pass by a side surface of the base member and extend to the outside; and a protection layer disposed on the base member to cover at least part of the conductor layer and to expose one portion of each of the plurality of conductive lines at the terminal portion, and some of the plurality of conductive lines may be electrically connected to the first electrode layer of the vibration structure, and the other conductive lines of the plurality of conductive lines may be electrically connected to the second electrode layer of the vibration structure.

According to some embodiments of the present disclosure, an extension length of each of the plurality of conductive lines may be longer than a length of the terminal portion.

According to some embodiments of the present disclosure, at least one of the plurality of conductive lines may include a first line disposed on the base member in parallel with a first direction; and a second line extending from the first line to the outside of a side surface of the base member in the first direction, and some among second lines of each of the plurality of conductive lines may be electrically connected to the first electrode layer of the vibration structure, and the other second lines among the second lines of each of the plurality of conductive lines may be electrically connected to the second electrode layer of the vibration structure.

According to some embodiments of the present disclosure, the flexible cable may further include a supporter on the second line of each of the plurality of conductive lines, and the supporter may at least partly surround some portion of the second line.

According to some embodiments of the present disclosure, the second line of each of the plurality of conductive lines may include a plurality of straps spaced apart from one another.

According to some embodiments of the present disclosure, the flexible cable may further include a supporter disposed on the second line of each of the plurality of conductive lines, the supporter on each of the second line at least partly surrounds the plurality of straps of the second line in common.

According to some embodiments of the present disclosure, the supporter may include a lower supporter which supports a lower portion of the second line and an upper supporter which covers an upper portion of the second line.

According to some embodiments of the present disclosure, the flexible cable may further include a first line supporting portion supporting some of second lines of each of the plurality of conductive lines, the first line supporting portion may extend from the base member and may support a rear surface of the some second lines.

According to some embodiments of the present disclosure, the flexible cable may further include a second line supporting portion supporting the other second lines of the second lines of each of the plurality of conductive lines, the second line supporting portion may surround one or more of a front surface and a side surface of the other second lines.

According to some embodiments of the present disclosure, the at least one of the plurality of conductive lines may further include at least one third line protruding from the second line in parallel with a second direction intersecting with the first direction, at least one third line protruding from some of second lines among the plurality of conductive lines may be electrically connected to the first electrode layer of the vibration structure, and at least one third line protruding from the other second lines of the second lines among the plurality of conductive lines may be electrically connected to the second electrode layer of the vibration structure.

According to some embodiments of the present disclosure, the vibration structure may include a plurality of vibration modules spaced apart from one another in a first direction and/or a second direction intersecting with the first direction, each of the plurality of vibration modules may include the vibration layer, the first electrode layer, and the second electrode layer, and the flexible cable may be electrically connected to the first electrode layer and to the second electrode layer of each of the plurality of vibration modules.

According to some embodiments of the present disclosure, the flexible cable may include a body portion including a terminal portion; and a plurality of finger lines protruding from the body portion, some of the plurality of finger lines may be electrically connected to the first electrode layer and the second electrode layer of each of some of the plurality of vibration modules, and the other finger lines of the plurality of finger lines may be electrically connected to the first electrode layer and the second electrode layer of each of the other vibration modules of the plurality of vibration modules.

According to some embodiments of the present disclosure, the vibration structure may include a first vibration module and a second vibration module being spaced apart from each other in a first direction; and a third vibration module and a fourth vibration module being spaced apart from each other in the first direction and being spaced apart from each of the first and second vibration modules in a second direction intersecting with the first direction, each of the first to fourth vibration modules may include the vibration layer, the first electrode layer, and the second electrode layer, and the flexible cable may be electrically connected to the first electrode layer and to the second electrode layer of each of the first to fourth vibration modules.

According to some embodiments of the present disclosure, the first and second vibration modules may be disposed to have separation distances of 0.1 mm or more and less than 3 cm.

According to some embodiments of the present disclosure, the first and second vibration modules are disposed to have separation distances of 0.1 mm or more and less than 5 mm.

According to some embodiments of the present disclosure, the flexible cable may include a first finger line disposed in the second direction and electrically connected to the first electrode layer of each of the first and third vibration modules; a second finger line disposed in the second direction and electrically connected to the second electrode layer of each of the first and third vibration modules; a first line portion extending in the first direction from each of the first finger line and the second finger line, the first line portion being electrically connected to the first electrode layer and to the second electrode layer of each of the first and second vibration modules; and a second line portion extending in the first direction from each of the first finger line and the second finger line, the second line portion being electrically connected to the first electrode layer and to the second electrode layer of each of the third and fourth vibration modules.

According to an embodiment of the present disclosure, a vibration device may include a vibration structure including a vibration layer, a first electrode layer disposed on a first surface of the vibration layer, and a second electrode layer disposed on a second surface opposite to the first surface of the vibration layer; a first protection member on a first surface of the vibration structure; a second protection member on a second surface of the vibration structure; and a flexible cable including at least one first finger line disposed between the first electrode layer of the vibration structure and the first protection member, and at least one second finger line disposed between the second electrode layer of the vibration structure and the second protection member.

According to some embodiments of the present disclosure, the flexible cable may further include a body portion including a terminal portion, and each of the at least one first finger line and the at least one second finger line may protrude from the body portion to have a length which is longer than a length of the terminal portion.

According to some embodiments of the present disclosure, the vibration device may further include a first adhesive layer disposed between the first electrode layer of the vibration structure and the first protection member to cover the at least one first finger line; and a second adhesive layer disposed between the second electrode layer of the vibration structure and the second protection member to cover the at least one second finger line.

According to some embodiments of the present disclosure, one or more of the first protection member and the second protection member may include a metal material.

According to some embodiments of the present disclosure, the vibration layer may include a plurality of inorganic material portions having a piezoelectric characteristic; and an organic material portion between the plurality of inorganic material portions.

According to some embodiments of the present disclosure, the vibration layer may include a piezoelectric deformation coefficient of 1,000 pC/N or more in a thickness direction, or comprise a formula $(Pb_{A-B}C_B)((Mg_{1/3}Nb_{2/3})_a(Ni_{1/3}Nb_{2/3})_b Zr_c Ti_d)O_3$, in the formula, C is one of calcium (Ca), strontium (Sr), and barium (Ba), $a+b+c+d=1$, $0.02 \leq B \leq 0.20$, $0.80 \leq A-B \leq 0.98$, $0.05 \leq a \leq 0.25$, $0.05 \leq b \leq 0.25$, $0.10 \leq c \leq 0.50$, and $0.10 \leq d \leq 0.50$.

A display apparatus according to an embodiment of the present disclosure will be described below.

According to some embodiments of the present disclosure, a display apparatus may include a display panel configured to display an image; and a vibration apparatus on a rear surface of the display panel to vibrate the display panel, the vibration apparatus may comprise a vibration structure including a vibration layer, a first electrode layer disposed on a first surface of the vibration layer, and a second electrode layer disposed on a second surface opposite to the first surface of the vibration layer; and a flexible cable electrically connected to the first electrode layer and to the second electrode layer of the vibration structure.

According to an embodiment of the present disclosure, a display apparatus may include a display panel configured to display an image; and a vibration apparatus on a rear surface of the display panel to vibrate the display panel, the vibration apparatus may comprise a vibration structure including a vibration layer, a first electrode layer disposed on a first surface of the vibration layer, and a second electrode layer disposed on a second surface opposite to the first surface of the vibration layer; a first protection member on a first surface of the vibration structure; a second protection member on a second surface of the vibration structure; and a flexible cable including at least one first finger line disposed between the first electrode layer of the vibration structure and the first protection member, and at least one second finger line disposed between the second electrode layer of the vibration structure and the second protection member.

According to some embodiments of the present disclosure, the vibration apparatus is disposed to cover most of the display panel.

According to some embodiments of the present disclosure, the vibration layer may include a plurality of inorganic material portions having a piezoelectric characteristic; and an organic material portion between the plurality of inorganic material portions.

According to some embodiments of the present disclosure, the vibration layer may include a piezoelectric deformation coefficient of 1,000 pC/N or more in a thickness direction, or comprise a formula $(Pb_{A-B}C_B)((Mg_{1/3}Nb_{2/3})_a(Ni_{1/3}Nb_{2/3})_b Zr_c Ti_d)O_3$, in the formula, C is one of calcium (Ca), strontium (Sr), and barium (Ba), $a+b+c+d=1$, $0.02 \leq B \leq 0.20$, $0.80 \leq A-B \leq 0.98$, $0.05 \leq a \leq 0.25$, $0.05 \leq b \leq 0.25$, $0.10 \leq c \leq 0.50$, and $0.10 \leq d \leq 0.50$.

According to some embodiments of the present disclosure, each of the plurality of inorganic material portions may have any one of a line shape, a circular shape, an oval shape, and a polygonal shape.

According to some embodiments of the present disclosure, the display panel may include a first region and a second region overlapping a display area configured to display an image, the vibration apparatus may include a first vibration device in the first region; and a second vibration device in the second region, and each of the first vibration device and the second vibration device may include the vibration device.

According to some embodiments of the present disclosure, the display apparatus may further include a supporting member on a rear surface of the display panel; a first enclosure between the rear surface of the display panel and the supporting member to surround the first vibration device; and a second enclosure between the rear surface of the display panel and the supporting member to surround the second vibration device.

According to some embodiments of the present disclosure, the display panel may include a first region and a second region overlapping a display area configured to display an image, the vibration apparatus may include a first vibration device in the first region; a second vibration device in the second region; a third vibration device in the first region to be alternately disposed with respect to the first vibration device; and a fourth vibration device in the second region to be alternately disposed with respect to the second vibration device, and each of the first to fourth vibration devices may include the vibration device.

According to some embodiments of the present disclosure, the display apparatus may further include a supporting member on a rear surface of the display panel; a first enclosure between the rear surface of the display panel and the supporting member to surround the first and third vibration devices; and a second enclosure between the rear surface of the display panel and the supporting member to surround the second and fourth vibration devices.

According to some embodiments of the present disclosure, the first to fourth vibration devices may include different vibration layers.

According to some embodiments of the present disclosure, the first vibration device and the third vibration device may be disposed in a diagonal line direction in the first region.

It will be apparent to those skilled in the art that various modifications and variations may be made in the present disclosure without departing from the technical idea or scope of the disclosures. Thus, it is intended that embodiments of the present disclosure cover the modifications and variations of the disclosure provided they come within the scope of the appended claims and their equivalents.

What is claimed is:
1. A flexible cable, comprising:
a base member including a terminal portion;
a conductor layer including a plurality of conductive lines disposed on the base member; and
a protection layer disposed on the base member to cover at least a part of the conductor layer and configured to expose a portion of each of the plurality of conductive lines at the terminal portion, wherein a length of each of the plurality of conductive lines is longer than a length of the base member, and wherein each of the plurality of conductive lines comprises:
- a first line on the base member; and
- a second line extending from a side surface of the base member to an outside.

2. The flexible cable of claim 1, wherein each of the plurality of conductive lines passes by a side surface of the base member and protrudes to the outside.

3. The flexible cable of claim 2, wherein a protrusion length of each of the plurality of conductive lines is longer than a length of the terminal portion.

4. The flexible cable of claim 1, further comprising a supporter disposed on the second line of each of the plurality of conductive lines,
wherein the supporter at least partly surrounds some portion of the second line.

5. The flexible cable of claim 4, wherein the supporter includes a lower supporter which supports a lower portion of the second line and an upper supporter which covers an upper portion of the second line.

6. The flexible cable of claim 1, wherein the second line of each of the plurality of conductive lines comprises a plurality of straps spaced apart from one another.

7. The flexible cable of claim 6, further comprising a supporter disposed on the second line of each of the plurality of conductive lines,
wherein the supporter on at least one of the second line at least partly surrounds the plurality of straps of the second line in common.

8. The flexible cable of claim 7, wherein the supporter includes a lower supporter which supports a lower portion of the second line and an upper supporter which covers an upper portion of the second line.

9. The flexible cable of claim 1, further comprising:
a first line supporting portion supporting some of second lines among the plurality of conductive lines,
wherein the first line supporting portion extends from the base member and supports a rear surface of some of the second lines.

10. The flexible cable of claim 1, further comprising:
a second line supporting portion supporting the other second lines among the second lines of the plurality of conductive lines,
wherein the second line supporting portion surrounds a front surface and side surfaces of the other second lines.

11. The flexible cable of claim 1, wherein the first line is configured parallel to a first direction of the base member,
wherein the second line extends from the first line to the outside of the base member in the first direction, and
wherein at least one of the plurality of conductive lines further comprises a third line protruding from the second line in parallel with a second direction intersecting with the first direction.

12. A vibration device, comprising:
a vibration structure including a vibration layer, a first electrode layer disposed on a first surface of the vibration layer, and a second electrode layer disposed on a second surface opposite to the first surface of the vibration layer; and
a flexible cable including a plurality of conductive lines electrically connected to the first electrode layer and to the second electrode layer of the vibration structure, wherein each of the plurality of conductive lines comprises:
- a first line on a base member; and
- a second line extending from a side surface of the base member to an outside, and wherein the second lines of each of the plurality of conductive lines are individually bent to be connected to the first electrode layer and to the second electrode layer of the vibration structure.

13. The vibration device of claim 12, wherein some of second lines among the plurality of conductive lines are electrically connected to the first electrode layer of the vibration structure, and the remaining second lines of the plurality of conductive lines are electrically connected to the second electrode layer of the vibration structure.

14. The vibration device of claim 13, wherein the base member comprises a terminal portion, and
wherein a length of the second line of each of the plurality of conductive lines is longer than a length of the terminal portion.

15. The vibration device of claim 12, wherein the first line of each of the plurality of conductive lines contacts the base member.

16. The vibration device of claim 12, wherein a length of the second line of each of the plurality of conductive lines is longer than a length of the base member, or
wherein the second line of each of the plurality of conductive lines does not overlap with the base member.

17. The vibration device of claim 12, wherein the flexible cable further comprises:
a terminal portion at the base member;
a conductor layer including the plurality of conductive lines; and
a protection layer disposed on the base member to cover at least a part of the conductor layer and to expose one portion of the first lines of each of the plurality of conductive lines at the terminal portion, and
wherein some of second lines among the plurality of conductive lines are electrically connected to the first electrode layer of the vibration structure, and the remaining second lines of the plurality of conductive lines are electrically connected to the second electrode layer of the vibration structure.

18. The vibration device of claim 17, wherein a length of the second line of each of the plurality of conductive lines is longer than a length of the terminal portion or a length of the base member.

19. The vibration device of claim 12,
wherein the vibration structure comprises a plurality of vibration modules spaced apart from one another in a first direction and/or a second direction intersecting with the first direction,
wherein each of the plurality of vibration modules comprises the vibration layer, the first electrode layer, and the second electrode layer, and
wherein each of the plurality of conductive lines of the flexible cable is electrically connected to the first electrode layer and to the second electrode layer of each of the plurality of vibration modules.

20. The vibration device of claim 19,
wherein some of second lines among the plurality of conductive lines are electrically connected to the first electrode layer and the second electrode layer of each of some of the plurality of vibration modules, and
wherein the remaining second lines among the second lines of each of the plurality of conductive lines are electrically connected to the first electrode layer and the second electrode layer of each of the other vibration modules of the plurality of vibration modules.

21. The vibration device of claim 12,
wherein the vibration structure comprises:
a first vibration module and a second vibration module being spaced apart from each other in a first direction; and
a third vibration module and a fourth vibration module being spaced apart from each other in the first direction and being spaced apart from each of the first and second vibration modules in a second direction intersecting with the first direction,
wherein each of the first to fourth vibration modules comprises the vibration layer, the first electrode layer, and the second electrode layer, and
wherein each of the plurality of conductive lines of the flexible cable is electrically connected to the first electrode layer and to the second electrode layer of each of the first to fourth vibration modules.

22. The vibration device of claim 21, wherein the first and second vibration modules are disposed to have separation distances of 0.1 mm or more and less than 3 cm.

23. The vibration device of claim 21, wherein the first and second vibration modules are disposed to have separation distances of 0.1 mm or more and less than 5 mm.

24. The vibration device of claim 21, wherein some of second lines among the plurality of conductive lines are disposed in the second direction and electrically connected to the first electrode layer of each of the first and third vibration modules,
wherein the remaining second lines of the plurality of conductive lines are disposed in the second direction and electrically connected to the second electrode layer of each of the first and third vibration modules, and
wherein the flexible cable comprises:
a first line portion extending in the first direction from each of the some of the second lines and the remaining second lines, the first line portion being electrically connected to the first electrode layer and to the second electrode layer of each of the first and second vibration modules; and
a second line portion extending in the first direction from each of the some of the second lines and the remaining second lines, the second line portion being electrically connected to the first electrode layer and to the second electrode layer of each of the third and fourth vibration modules.

25. The vibration device of claim 12, wherein the vibration layer comprises:
a plurality of inorganic material portions having a piezoelectric characteristic; and
an organic material portion between the plurality of inorganic material portions.

26. The vibration device of claim 12, wherein the vibration layer includes a piezoelectric deformation coefficient of 1,000 pC/N or more in a thickness direction, or comprises a formula $(Pb_{A-B}C_B)((Mg_{1/3}Nb_{2/3})_a(Ni_{1/3}Nb_{2/3})_b Zr_c Ti_d)O_3$,
in the formula, C is one of calcium (Ca), strontium (Sr), and barium (Ba), $a+b+c+d=1$, $0.02 \leq B \leq 0.20$, $0.80 \leq A-B \leq 0.98$, $0.05 \leq a \leq 0.25$, $0.05 \leq b \leq 0.25$, $0.10 \leq c \leq 0.50$, and $0.10 \leq d \leq 0.50$.

27. A display apparatus, comprising:
a display panel configured to display an image; and
a vibration apparatus on a rear surface of the display panel to vibrate the display panel,
wherein the vibration apparatus comprises the vibration device of claim 12.

28. The display apparatus of claim 27, wherein the vibration apparatus is disposed to cover most of the display panel.

29. The display apparatus of claim 27, wherein the vibration layer comprises:
a plurality of inorganic material portions having a piezoelectric characteristic; and
an organic material portion between the plurality of inorganic material portions.

30. The display apparatus of claim 29, wherein each of the plurality of inorganic material portions has any one of a line shape, a circular shape, an oval shape, and a polygonal shape.

31. The display apparatus of claim 27, wherein the vibration layer includes a piezoelectric deformation coefficient of 1,000 pC/N or more in a thickness direction, or comprises a formula $(Pb_{A-B}C_B)((Mg_{1/3}Nb_{2/3})_a(Ni_{1/3}Nb_{2/3})_b Zr_c Ti_d)O_3$,
in the formula, C is one of calcium (Ca), strontium (Sr), and barium (Ba), $a+b+c+d=1$, $0.02 \leq B \leq 0.20$, $0.80 \leq A-B \leq 0.98$, $0.05 \leq a \leq 0.25$, $0.05 \leq b \leq 0.25$, $0.10 \leq c \leq 0.50$, and $0.10 \leq d \leq 0.50$.

32. A display apparatus, comprising:
a display panel configured to display an image; and
a vibration apparatus on a rear surface of the display panel to vibrate the display panel,
wherein the display panel comprises a first region and a second region overlapping a display area configured to display an image,
wherein the vibration apparatus comprises:
a first vibration device in the first region; and
a second vibration device in the second region, and
wherein each of the first vibration device and the second vibration device comprises the vibration device of claim 12.

33. The display apparatus of claim 32, further comprising:
a supporting member on a rear surface of the display panel;
a first enclosure between the rear surface of the display panel and the supporting member to surround the first vibration device; and
a second enclosure between the rear surface of the display panel and the supporting member to surround the second vibration device.

34. A display apparatus, comprising:
a display panel configured to display an image; and
a vibration apparatus on a rear surface of the display panel to vibrate the display panel,
wherein the display panel comprises a first region and a second region overlapping a display area configured to display an image,
wherein the vibration apparatus comprises:
a first vibration device in the first region;
a second vibration device in the second region;
a third vibration device in the first region to be alternately disposed with respect to the first vibration device; and
a fourth vibration device in the second region to be alternately disposed with respect to the second vibration device, and
wherein each of the first to fourth vibration devices comprises the vibration device of claim 12.

35. The display apparatus of claim 34, further comprising:
a supporting member on a rear surface of the display panel;

a first enclosure between the rear surface of the display panel and the supporting member to surround the first and third vibration devices; and a second enclosure between the rear surface of the display panel and the supporting member to surround the second and fourth vibration devices.

36. The display apparatus of claim 34, wherein the first to fourth vibration devices include different vibration layers.

37. The display apparatus of claim 34, wherein the first vibration device and the third vibration device are disposed in a diagonal line direction in the first region.

38. A vibration device, comprising:

a vibration structure including a vibration layer, a first electrode layer disposed on a first surface of the vibration layer, and a second electrode layer disposed on a second surface opposite to the first surface of the vibration layer; and a flexible cable including a plurality of conductive lines electrically connected to the first electrode layer and to the second electrode layer of the vibration structure, wherein at least one of the plurality of conductive lines comprises:

a first line disposed on a base member in parallel with a first direction; and a second line extending from the first line to an outside of a side surface of the base member in the first direction, and wherein some among second lines of each of the plurality of conductive lines are electrically connected to the first electrode layer of the vibration structure, and the remaining second lines among the second lines of each of the plurality of conductive lines are electrically connected to the second electrode layer of the vibration structure.

39. The vibration device of claim 38, wherein the flexible cable further comprises a supporter on the second line of each of the plurality of conductive lines, and wherein the supporter at least partly surrounds some portion of the second line.

40. The vibration device of claim 38, wherein the second line of each of the plurality of conductive lines comprises a plurality of straps spaced apart from one another.

41. The vibration device of claim 40, further comprising a supporter disposed on the second line of each of the plurality of conductive lines, wherein the supporter on each of the second line at least partly surrounds the plurality of straps of the second line in common.

42. The vibration device of claim 41, wherein the supporter includes a lower supporter which supports a lower portion of the second line and an upper supporter which covers an upper portion of the second line.

43. The vibration device of claim 38, wherein the flexible cable further comprises:

a first line supporting portion supporting some of second lines of each of the plurality of conductive lines, wherein the second line of each of the plurality of conductive lines has a front surface and a rear surface opposite to the front surface, and wherein the first line supporting portion extends from the base member and supports the front surface of the some of second lines.

44. The vibration device of claim 43, wherein the flexible cable further comprises a second line supporting portion supporting the remaining second lines of the second lines of each of the plurality of conductive lines, and wherein the second line supporting portion supports the rear surface of the remaining second lines.

45. The vibration device of claim 38, wherein the first line and the second line of each of the plurality of conductive lines are parallel with the first direction, and wherein the at least one of the plurality of conductive lines further comprises at least one third line protruding from the second line in parallel with a second direction intersecting with the first direction, wherein at least one third line protruding from some of second lines among the plurality of conductive lines is electrically connected to the first electrode layer of the vibration structure and wherein at least one third line protruding from the remaining second lines among the plurality of conductive lines is electrically connected to the second electrode layer of the vibration structure.

46. A vibration device, comprising:

a vibration structure including a vibration layer, a first electrode layer disposed on a first surface of the vibration layer, and a second electrode layer disposed on a second surface opposite to the first surface of the vibration layer;

a first protection member on a first surface of the vibration structure;

a second protection member on a second surface of the vibration structure; and a flexible cable including at least one first finger line disposed between the first electrode layer of the vibration structure and the first protection member, and at least one second finger line disposed between the second electrode layer of the vibration structure and the second protection member.

47. The vibration device of claim 46, wherein the flexible cable further comprises a body portion including a terminal portion, and wherein each of the at least one first finger line and the at least one second finger line protrudes from the body portion to have a length which is longer than a length of the terminal portion.

48. The vibration device of claim 46, further comprising:

a first adhesive layer disposed between the first electrode layer of the vibration structure and the first protection member to cover the at least one first finger line; and a second adhesive layer disposed between the second electrode layer of the vibration structure and the second protection member to cover the at least one second finger line.

49. The vibration device of claim 46, wherein one or more of the first protection member and the second protection member comprises a metal material.

* * * * *